(12) United States Patent
Kurth et al.

(10) Patent No.: US 11,955,504 B2
(45) Date of Patent: Apr. 9, 2024

(54) MICROBOLOMETER SYSTEMS AND METHODS

(71) Applicant: TELEDYNE FLIR COMMERCIAL SYSTEMS, INC., Goleta, CA (US)

(72) Inventors: Eric A. Kurth, Santa Barbara, CA (US); Marin Sigurdson, Goleta, CA (US); Robert F. Cannata, Santa Barbara, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 68 days.

(21) Appl. No.: 17/471,158

(22) Filed: Sep. 10, 2021

(65) Prior Publication Data

US 2021/0404878 A1 Dec. 30, 2021

Related U.S. Application Data

(63) Continuation of application No. PCT/US2020/022194, filed on Mar. 11, 2020.
(Continued)

(51) Int. Cl.
*H01L 27/146* (2006.01)
*G01J 5/00* (2022.01)
(Continued)

(52) U.S. Cl.
CPC ........ *H01L 27/14669* (2013.01); *G01J 5/023* (2013.01); *G01J 5/024* (2013.01);
(Continued)

(58) Field of Classification Search
CPC ......... H01L 27/14669; H01L 27/14636; H01L 27/14649; H01L 27/14683; G01J 5/023;
(Continued)

(56) References Cited

U.S. PATENT DOCUMENTS

| 4,447,291 A | 5/1984 | Schulte |
| 5,602,393 A | 2/1997 | Gerard |

(Continued)

FOREIGN PATENT DOCUMENTS

| CA | 2791933 A1 | 4/2014 |
| EP | 0773435 | 5/1997 |

(Continued)

OTHER PUBLICATIONS

Leonardo DRS' Patented Sensor Technology Revealed, Advanced-Absorber Microbolometer Superstructure, Leonardo DRS Electro-Optical & Infrared Systems, White Paper, 2015, 4 pages, Dallas, TX.
(Continued)

*Primary Examiner* — David P Porta
*Assistant Examiner* — Meenakshi S Sahu
(74) *Attorney, Agent, or Firm* — Haynes and Boone, LLP

(57) ABSTRACT

Microbolometer systems and methods are provided herein. For example, an infrared imaging device includes a substrate having contacts and a surface. The surface defines a plane. The infrared imaging device further includes a microbolometer array coupled to the substrate. Each microbolometer of the microbolometer array includes a cross-section having a first section, a second section substantially parallel to the first section, and a third section joining the first section and the second section.

20 Claims, 67 Drawing Sheets

Related U.S. Application Data

(60) Provisional application No. 62/907,555, filed on Sep. 28, 2019, provisional application No. 62/907,548, filed on Sep. 27, 2019, provisional application No. 62/816,889, filed on Mar. 11, 2019.

(51) Int. Cl.

| | |
|---|---|
| *G01J 5/02* | (2022.01) |
| *G01J 5/20* | (2006.01) |
| *G01J 5/24* | (2006.01) |
| *H04N 5/33* | (2023.01) |
| *H04N 25/75* | (2023.01) |

(52) U.S. Cl.
CPC . *G01J 5/20* (2013.01); *G01J 5/24* (2013.01); *H01L 27/14636* (2013.01); *H01L 27/14649* (2013.01); *H01L 27/14683* (2013.01); *H04N 5/33* (2013.01); *H04N 25/75* (2023.01); *G01J 2005/0077* (2013.01); *G01J 2005/202* (2013.01)

(58) Field of Classification Search
CPC ...... G01J 5/024; G01J 5/20; G01J 5/24; G01J 2005/0077; G01J 2005/202; G01J 5/0225; G01J 5/22; G01J 5/0205; G01J 2005/204; G01J 5/0853; H04N 5/33; H04N 25/75
See application file for complete search history.

(56) References Cited

U.S. PATENT DOCUMENTS

| | | | |
|---|---|---|---|
| 5,756,999 A | 5/1998 | Parrish et al. | |
| 6,028,309 A | 2/2000 | Parrish et al. | |
| 6,046,014 A | 4/2000 | Lagarias et al. | |
| 6,046,485 A | 4/2000 | Cole et al. | |
| 6,292,140 B1 | 9/2001 | Osterman | |
| 6,307,194 B1 | 10/2001 | Fitzgibbons et al. | |
| 6,448,557 B2 | 9/2002 | Oda | |
| 6,585,909 B2 | 7/2003 | Tsuchiya et al. | |
| 6,690,014 B1* | 2/2004 | Gooch | H01L 27/14649 438/96 |
| 6,705,152 B2 | 3/2004 | Routkevitch et al. | |
| 6,756,594 B2 | 6/2004 | George et al. | |
| 6,777,680 B2 | 8/2004 | Morita et al. | |
| 6,812,465 B2 | 11/2004 | Parrish et al. | |
| 6,838,306 B2 | 1/2005 | Cole | |
| 7,034,301 B2 | 4/2006 | Parrish et al. | |
| 7,067,345 B2 | 6/2006 | Kälvestern et al. | |
| 7,375,333 B1 | 5/2008 | Bluzer et al. | |
| 7,459,686 B2 | 12/2008 | Syllaios et al. | |
| 7,462,831 B2 | 12/2008 | Gooch et al. | |
| 7,622,717 B2 | 11/2009 | Skidmore et al. | |
| 7,655,909 B2 | 2/2010 | Schimert et al. | |
| 7,709,795 B2* | 5/2010 | Yamanaka | G01J 5/20 250/338.1 |
| 8,080,797 B2 | 12/2011 | Vogt et al. | |
| 8,153,980 B1 | 4/2012 | Brady et al. | |
| 8,227,755 B2 | 7/2012 | Fagan, III et al. | |
| 8,546,757 B2 | 10/2013 | Hanson | |
| 8,610,070 B2 | 12/2013 | Schimert et al. | |
| 8,759,776 B2 | 6/2014 | Nemirovsky | |
| 8,900,906 B2 | 12/2014 | Yama et al. | |
| 9,000,373 B2 | 4/2015 | Beratan | |
| 9,130,081 B2 | 9/2015 | Yama et al. | |
| 9,207,127 B2 | 12/2015 | Lee et al. | |
| 9,257,587 B2 | 2/2016 | Purkl et al. | |
| 9,274,005 B2 | 3/2016 | Samarao et al. | |
| 9,423,301 B2 | 8/2016 | Savoy et al. | |
| 9,513,171 B2 | 12/2016 | Cumming et al. | |
| 9,726,547 B2 | 8/2017 | Liu et al. | |
| 9,945,725 B2 | 4/2018 | Herrmann et al. | |
| 10,101,212 B1 | 10/2018 | Cleary et al. | |
| 10,234,332 B2 | 3/2019 | Roehrer et al. | |
| 11,031,432 B2* | 6/2021 | Dale | H01L 27/14649 |
| 2002/0009821 A1 | 1/2002 | Moor et al. | |
| 2008/0124565 A1 | 5/2008 | Carlson et al. | |
| 2010/0171190 A1* | 7/2010 | Liger | H01L 27/14669 438/57 |
| 2011/0180713 A1* | 7/2011 | Noda | G01J 5/34 250/338.4 |
| 2011/0266443 A1 | 11/2011 | Schimert et al. | |
| 2012/0132804 A1 | 5/2012 | Lee et al. | |
| 2013/0248713 A1 | 9/2013 | Gelmont et al. | |
| 2014/0184807 A1* | 7/2014 | Simolon | H01L 27/1469 438/67 |
| 2016/0018267 A1 | 1/2016 | Timofeev et al. | |
| 2017/0178916 A1 | 6/2017 | Goodlin et al. | |
| 2018/0364153 A1 | 12/2018 | Carr | |
| 2019/0148443 A1 | 5/2019 | Dale et al. | |
| 2019/0178718 A1 | 6/2019 | Kawasaki et al. | |

FOREIGN PATENT DOCUMENTS

| | | |
|---|---|---|
| EP | 0902484 A2 | 3/1999 |
| EP | 2384425 | 3/2020 |
| FR | 3059824 A1 | 6/2018 |
| KR | 101661677 | 9/2016 |
| WO | WO2017205658 | 11/2017 |
| WO | WO 2018110309 A1 | 6/2018 |

OTHER PUBLICATIONS

Yoneoka, S., et al., "ALD-metal uncooled bolometer", 2011 IEEE 24th International Conference on Micro Electro Mechanical Systems, IEEE, 2011.

Eigenfeld, Nathan Thomas, "Ultra-thin Materials from Atomic Layer Deposition for Microbolometers", University of Colorado, CU Scholar, Mechanical Engineering Graduate Theses & Dissertations, dated Jan. 1, 2015, 181 pages.

Kim Young Su et al., "Uncooled Microbolometer Arrays with High Responsivity Using Meshed Leg Structure", Nov. 1, 2013, pp. 2108-2110, vol. 25, No. 21, IEEE Photonics Technology Letters, IEEE Service Center, Piscataway, NJ, US.

* cited by examiner

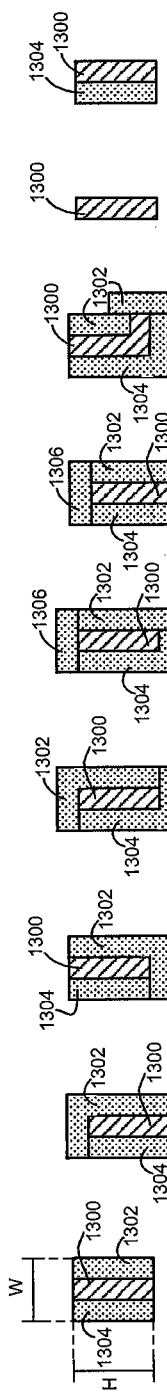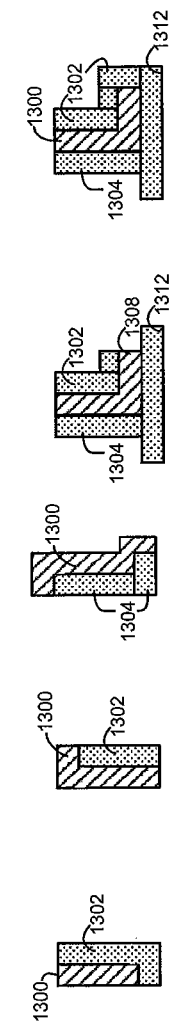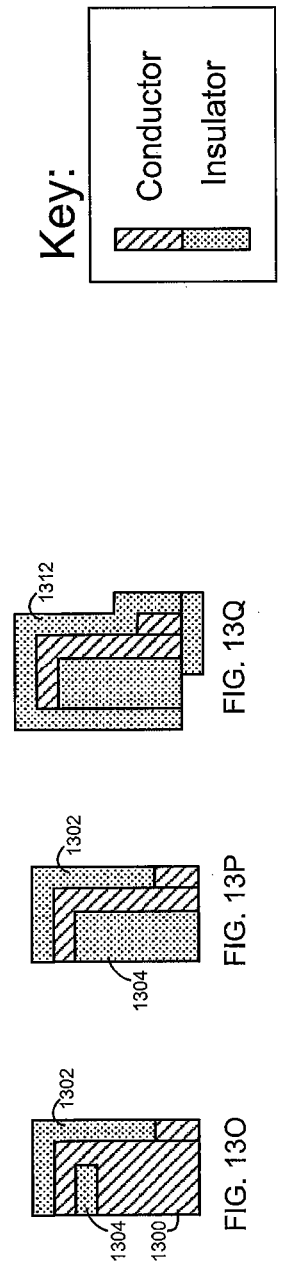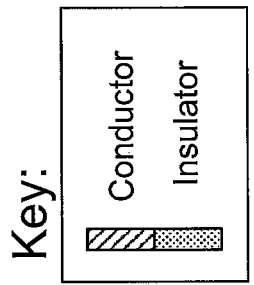

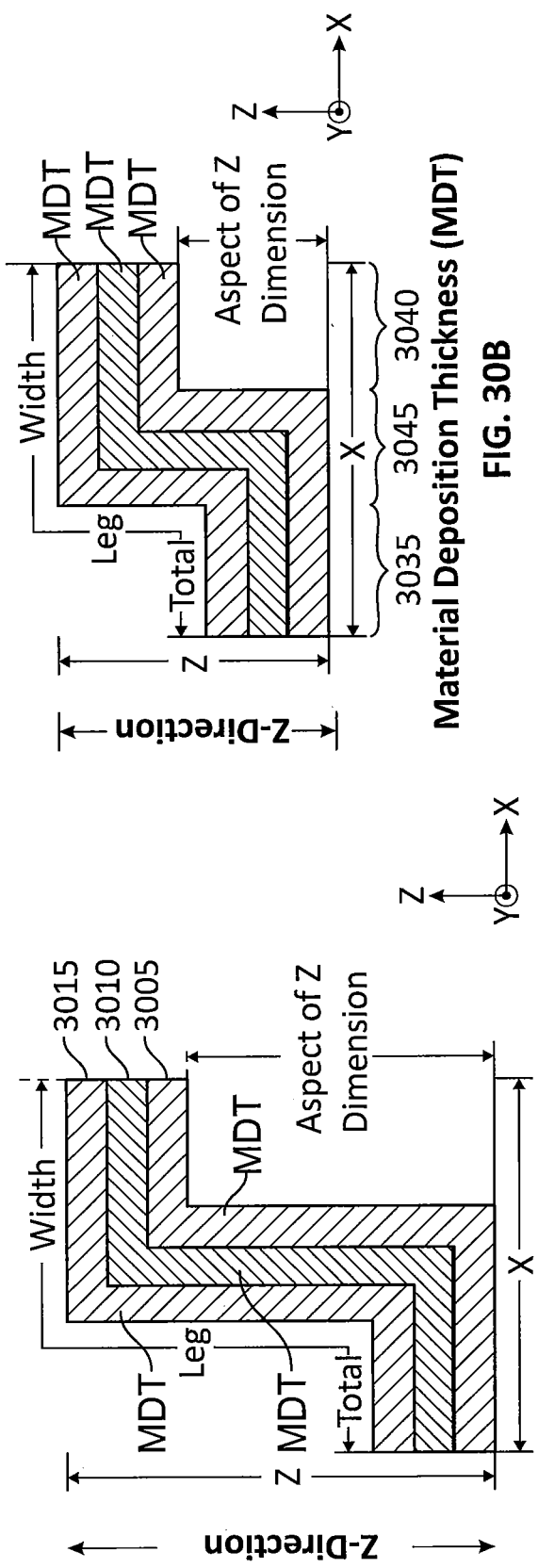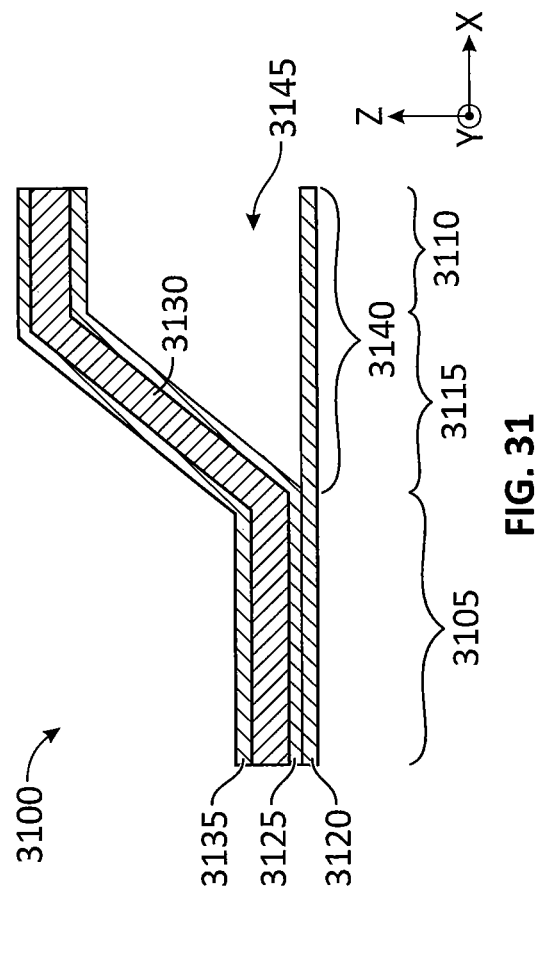
FIG. 30B
FIG. 31
FIG. 30A

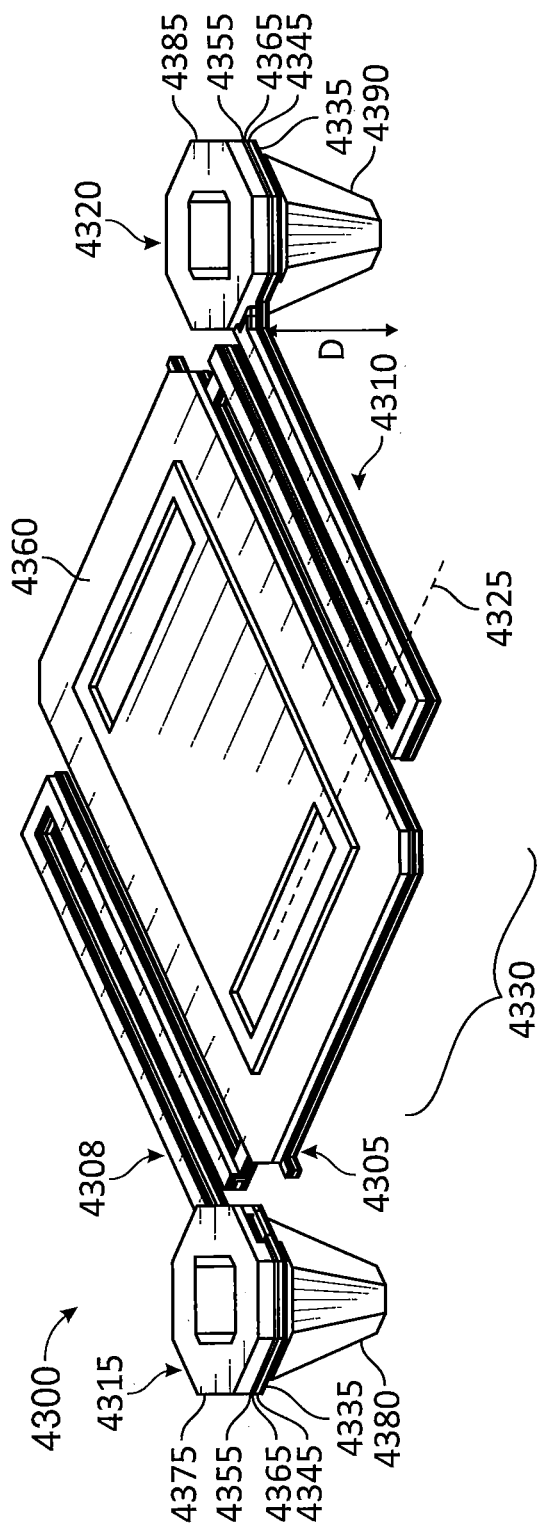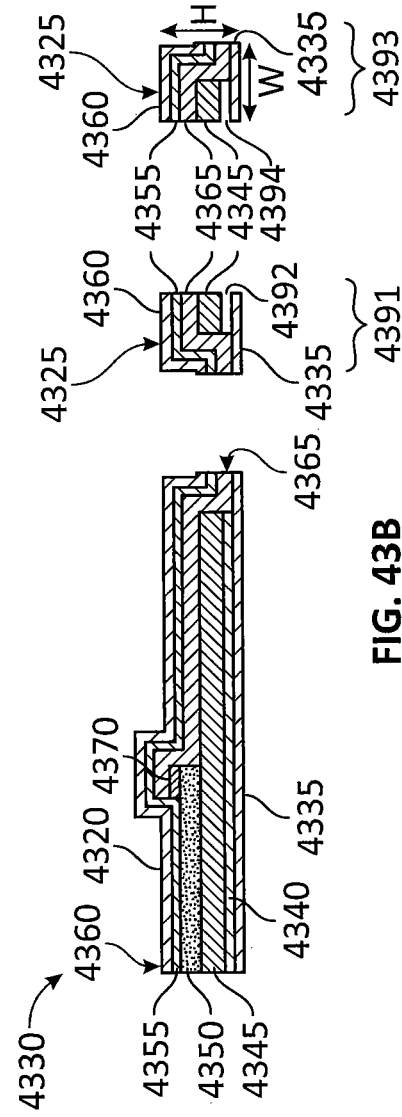
FIG. 43A
FIG. 43B

5550

MICROBOLOMETER SYSTEMS AND METHODS

CROSS-REFERENCE TO RELATED APPLICATIONS

This application is a continuation of International Patent Application No. PCT/US2020/022194 filed Mar. 11, 2020 entitled "MICROBOLOMETER SYSTEMS AND METHODS," which is incorporated herein by reference in its entirety.

International Patent Application No. PCT/US2020/022194 claims priority to and the benefit of U.S. Provisional Patent Application No. 62/816,889 filed on Mar. 11, 2019 and entitled "VERTICAL MICROBOLOMETER CONTACT SYSTEMS AND METHODS," which is hereby incorporated by reference in its entirety.

International Patent Application No. PCT/US2020/022194 claims priority to and the benefit of U.S. Provisional Patent Application No. 62/907,548 filed on Sep. 27, 2019 and entitled "MICROBOLOMETER SYSTEMS AND METHODS," which is hereby incorporated by reference in its entirety.

International Patent Application No. PCT/US2020/022194 claims priority to and the benefit of U.S. Provisional Patent Application No. 62/907,555 filed on Sep. 28, 2019 and entitled "MICROBOLOMETER SYSTEMS AND METHODS," which is hereby incorporated by reference in its entirety.

International Patent Application No. PCT/US2020/022194 is related to U.S. patent application Ser. No. 16/226,580 filed Dec. 19, 2018 and entitled "VERTICAL MICROBOLOMETER CONTACT SYSTEMS AND METHODS," which in turn is a divisional of U.S. patent application Ser. No. 15/396,100 filed Dec. 30, 2016 and entitled "VERTICAL MICROBOLOMETER CONTACT SYSTEMS AND METHODS," which in turn is a continuation of International Patent Application No. PCT/US2015/039138 filed Jul. 2, 2015 and entitled "VERTICAL MICROBOLOMETER CONTACT SYSTEMS AND METHODS," which in turn claims priority to and the benefit of U.S. Provisional Patent Application No. 62/020,747 filed on Jul. 3, 2014 and entitled "VERTICAL MICROBOLOMETER CONTACT SYSTEMS AND METHODS," the contents all of which are hereby incorporated by reference in their entirety.

TECHNICAL FIELD

One or more embodiments of the invention relate generally to infrared cameras and, more particularly, to microbolometer contact systems and methods, such as vertical leg contacts for microbolometer focal plane arrays.

BACKGROUND

A microbolometer is an example of a type of infrared detector that may be used within an infrared imaging device (e.g., an infrared camera). For example, the microbolometer is typically fabricated on a monolithic silicon substrate to form an infrared (image) detector array, with each microbolometer of the infrared detector array functioning as a pixel to produce a two-dimensional image. The change in resistance of each microbolometer is translated into a time-multiplexed electrical signal by circuitry known as the read out integrated circuit (ROIC). The combination of the ROIC and the infrared detector array (e.g., microbolometer array) is commonly known as a focal plane array (FPA) or infrared FPA (IRFPA). Additional details regarding FPAs and microbolometers may be found, for example, in U.S. Pat. Nos. 5,756,999, 6,028,309, 6,812,465, and 7,034,301, which are herein incorporated by reference in their entirety.

Each microbolometer in the array is generally coupled to one or more contacts that extend vertically from the array down to the ROIC. The contacts can be used for providing a reference voltage for the microbolometer and/or a signal path from the microbolometer to the ROIC. Microbolometers often include a light-sensitive portion formed from resistive material suspended on a bridge, with the resistive material coupled to its contacts via legs that run from the bridge to the contacts. The legs attach to resistive material through a resistive material contact.

One of the challenges in designing efficient microbolometers is increasing the ratio of the light-sensitive area or the active pixel area to the total area of the array, sometimes referred to as the fill factor of the array. Leg supports for each microbolometer can occupy a significant portion of the array area and can therefore limit the fill factor of the array. It would therefore be desirable to reduce the amount of area occupied by the legs. However, in order to maintain device performance, the width and length of each leg support should scale with the area of each pixel. It can therefore be difficult to reduce the leg area and increase the fill factor. As a result, there is a need for improved techniques for implementing leg supports, such as for microbolometer-based focal plane arrays.

SUMMARY

Systems and methods are disclosed, in accordance with one or more embodiments, which are directed to microbolometer legs for an infrared detector. For example, in accordance with an embodiment of the invention, vertical legs are disclosed, such as for infrared detectors within a focal plane array, that may be more area efficient as compared to conventional legs that extend horizontally substantially in plane with the infrared detector. For one or more embodiments, the leg systems and methods disclosed herein may provide certain advantages over conventional leg approaches, especially as semiconductor processing technologies transition to smaller dimensions.

In accordance with one embodiment, an infrared imaging device includes a substrate including a plurality of contacts and a surface. The surface defines a plane. The infrared imaging device further includes a microbolometer array coupled to the substrate, where the microbolometer array includes a plurality of microbolometers. Each microbolometer includes a bridge and a leg structure coupled to the bridge and to one of the plurality of contacts. The leg structure includes a metal layer having a first dimension that extends in a first direction that is substantially perpendicular to the plane and a second dimension that extends in a second direction that is substantially parallel to the plane, where the first dimension is greater than the second dimension. The leg structure further includes a first layer formed on a first sidewall of the metal layer and a first side of the metal layer. The leg structure further includes a second layer formed on a second sidewall of the metal layer and a second side of the metal layer. The first sidewall is opposite the second sidewall. The first side is opposite the second side.

In accordance with one embodiment, an infrared imaging device includes a microbolometer array including a plurality of microbolometers. Each microbolometer includes a bridge. The bridge includes a first portion comprising a resistive layer configured to capture infrared radiation and a second portion having a plurality of perforations defined therein.

In accordance with one embodiment, an infrared imaging device includes an array of microbolometers each having a bridge that is coupled to a contact by at least one vertical bolometer leg. The legs and bridges of the microbolometer array may be suspended above a readout integrated circuit for the microbolometer array. The vertical bolometer legs may be formed using spacer deposition and etch processing operations that form at least portions of the vertical bolometer legs on the sidewalls of an opening in a sacrificial layer that is then removed to release the bolometer legs.

According to various embodiments, a vertical bolometer leg may run along a path that is disposed in a plane that is parallel to a plane defined by the bridge of the microbolometer and/or a plane that is defined by a surface of a substrate of the device such as a readout integrated circuit substrate and may have an extended dimension that extends in a direction that is perpendicular to the plane of the path, the substrate surface, and/or the plane of the bridge. In this way, the area of the bolometer leg that would otherwise occupy a relatively larger fraction of the surface area of the microbolometer array can be reduced without reducing the area of the bolometer leg.

According to various embodiments, the leg structure may or may not be encapsulated in an insulating layer such as a silicon dioxide or a silicon nitride. The leg structure may be formed from multiple layers of insulating material to optimize performance. A leg conductive layer may be fully or partially encapsulated with an insulation layer, or may be free of any insulation layer. The leg conductive layer may be a homogeneous film of a single material type or a multilayer conductive layer formed from, for example, several depositions.

In accordance with one embodiment, an infrared imaging device includes a substrate having a plurality of contacts and a surface. The surface defines a plane. The infrared imaging device further includes a microbolometer array coupled to the substrate, where the microbolometer array includes a plurality of microbolometers. Each microbolometer includes a bridge and a leg structure coupled to the bridge and to one of the plurality of contacts. The leg structure includes a cross-section having a first section, a second section substantially parallel to the first section, and a third section joining the first section and the second section. In some aspects, the bridge has a first portion and a second portion. The first portion includes a resistive layer configured to capture infrared radiation. The second portion includes a plurality of perforations defined therein.

In accordance with one embodiment, a method of forming an infrared imaging device includes forming a bridge on a sacrificial layer. The method further includes forming an opening in the sacrificial layer. The method further includes disposing a contact metal layer on sidewalls of the opening. The method further includes forming a leg structure that couples to the bridge and the contact metal layer. The leg structure has a cross-section having a first section, a second section substantially parallel to the first section, and a third section joining the first section and the second section. The method further includes removing the sacrificial layer to suspend the bridge and the leg structure above a substrate of the infrared imaging device. The contact metal layer is coupled to the substrate.

In accordance with one embodiment, an infrared imaging device includes a microbolometer array having a plurality of microbolometers. Each microbolometer includes a microbolometer bridge. The microbolometer bridge includes a first portion comprising a resistive layer configured to capture infrared radiation; and a second portion having a plurality of perforations defined therein. In some aspects, the infrared imaging device further includes a substrate including a plurality of contacts and a surface. The surface defines a plane. Each microbolometer further includes a leg structure coupled to the microbolometer bridge and to one of the plurality of contacts. The leg structure includes a cross-section having a first section, a second section substantially parallel to the first section, and a third section joining the first section and the second section.

In accordance with one embodiment, a method of forming an infrared imaging device includes forming a bridge structure. The method further includes forming a leg structure. The method further includes forming the plurality of perforations in the bridge structure to obtain a microbolometer bridge.

In accordance with one embodiment, a method of forming an infrared imaging device includes forming a bridge on a sacrificial layer, where the bridge includes a first portion having a resistive layer configured to capture infrared radiation and a second portion having a plurality of perforations formed therein. The method further includes forming an opening in the sacrificial layer. The method further includes disposing a contact metal layer on sidewalls of the opening. The method further includes forming a leg structure that couples to the bridge and the contact metal layer. The method further includes removing the sacrificial layer to suspend the bridge and the leg structure above a substrate of the infrared imaging device, where the contact metal layer is coupled to the substrate.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 13A through 13Q show various arrangements of a vertical leg, such as for the vertical legs of FIGS. 5A and 5B, in accordance with various embodiments.

FIG. 30A shows a cross-section of a leg of the bolometer of FIG. 29 in accordance with an embodiment.

FIG. 30B illustrates a cross-section of a leg having a height smaller than that of the leg of FIG. 30A, in accordance with an embodiment.

FIG. 31 illustrates a cross-section of a leg of a bolometer in accordance with an embodiment.

FIGS. 43A and 43B illustrate views associated with a bolometer in accordance with an embodiment.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
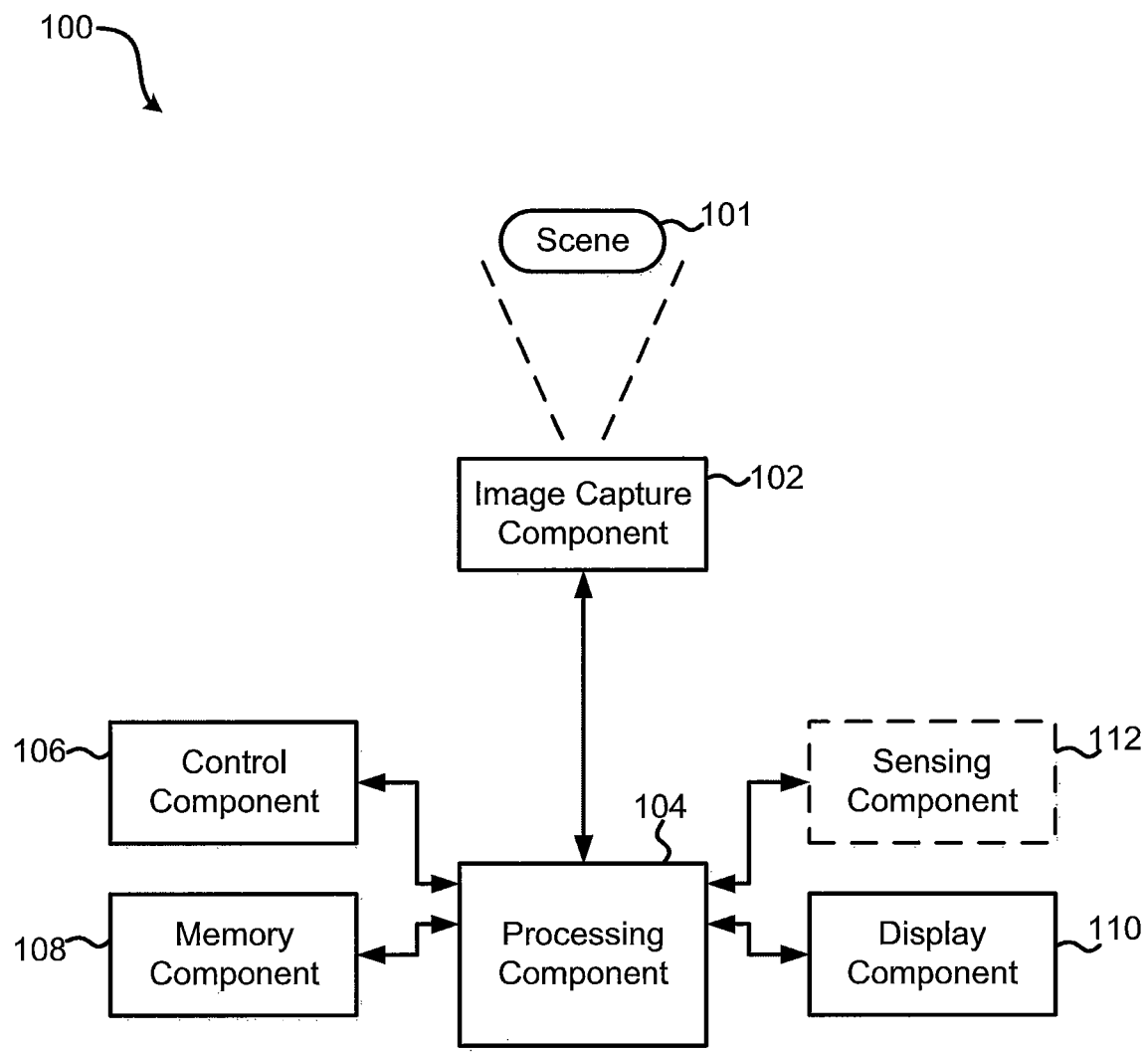
FIG. 1 shows a block diagram illustrating an infrared camera in accordance with one or more embodiments.

Systems and methods are disclosed herein to provide vertically oriented legs for an infrared detector, in accordance with one or more embodiments. For example, in accordance with an embodiment, vertical bolometer legs are disclosed, such as for microbolometers within a focal plane array. As an implementation example, FIG. 1 shows a block diagram illustrating a system 100 (e.g., an infrared camera, including any type of infrared imaging system) for capturing images and processing in accordance with one or more embodiments. System 100 comprises, in one implementation, an image capture component 102, a processing component 104, a control component 106, a memory component 108, and a display component 110. Optionally, system 100 may include a sensing component 112.

System 100 may represent, for example, an infrared imaging device, such as an infrared camera, to capture and process images, such as video images of a scene 101. The system 100 may represent any type of infrared camera that employs infrared detectors having contacts, which may be implemented as disclosed herein. System 100 may comprise a portable device and may be incorporated, e.g., into a vehicle (e.g., an automobile or other type of land-based vehicle, an aircraft, or a spacecraft) or a non-mobile installation requiring infrared images to be stored and/or displayed or may comprise a distributed networked system (e.g., processing component 104 distant from and controlling image capture component 102 via the network).

In various embodiments, processing component 104 may comprise any type of a processor or a logic device (e.g., a programmable logic device (PLD) configured to perform processing functions). Processing component 104 may be adapted to interface and communicate with components 102, 106, 108, and 110 to perform method and processing steps and/or operations, such as for example, controlling biasing and other functions (e.g., values for elements such as variable resistors and current sources, switch settings for biasing and timing, and other parameters) along with other conventional system processing functions as would be understood by one skilled in the art.

Memory component 108 comprises, in one embodiment, one or more memory devices adapted to store data and information, including for example infrared data and information. Memory device 108 may comprise one or more various types of memory devices including volatile and non-volatile memory devices, including computer-readable medium (portable or fixed). Processing component 104 may be adapted to execute software stored in memory component 108 so as to perform method and process steps and/or operations described herein.

Image capture component 102 comprises, in one embodiment, one or more infrared sensors (e.g., any type of multi-pixel infrared detector, such as a focal plane array having one or more vertical legs as disclosed herein) for capturing infrared image data (e.g., still image data and/or video data) representative of an image, such as scene 101. In one implementation, the infrared sensors of image capture component 102 provide for representing (e.g., converting) the captured image data as digital data (e.g., via an analog-to-digital converter included as part of the infrared sensor or separate from the infrared sensor as part of system 100). In one or more embodiments, image capture component 102 may further represent or include a lens, a shutter, and/or other associated components along with the vacuum package assembly for capturing infrared image data. Image capture component 102 may further include temperature sensors (or temperature sensors may be distributed within system 100) to provide temperature information to processing component 104 as to operating temperature of image capture component 102.

In one aspect, the infrared image data (e.g., infrared video data) may comprise non-uniform data (e.g., real image data) of an image, such as scene 101. Processing component 104 may be adapted to process the infrared image data (e.g., to provide processed image data), store the infrared image data in memory component 108, and/or retrieve stored infrared image data from memory component 108. For example, processing component 104 may be adapted to process infrared image data stored in memory component 108 to provide processed image data and information (e.g., captured and/or processed infrared image data).

Control component 106 comprises, in one embodiment, a user input and/or interface device, such as a rotatable knob (e.g., potentiometer), push buttons, slide bar, keyboard, etc., that is adapted to generate a user input control signal. Processing component 104 may be adapted to sense control input signals from a user via control component 106 and respond to any sensed control input signals received therefrom. Processing component 104 may be adapted to interpret such a control input signal as a parameter value, as generally understood by one skilled in the art. In one embodiment, control component 106 may comprise a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Display component 110 comprises, in one embodiment, an image display device (e.g., a liquid crystal display (LCD)

or various other types of generally known video displays or monitors). Processing component 104 may be adapted to display image data and information on the display component 110. Processing component 104 may be adapted to retrieve image data and information from memory component 108 and display any retrieved image data and information on display component 110. Display component 110 may comprise display electronics, which may be utilized by processing component 104 to display image data and information (e.g., infrared images). Display component 110 may be adapted to receive image data and information directly from image capture component 102 via the processing component 104, or the image data and information may be transferred from memory component 108 via processing component 104.

Optional sensing component 112 comprises, in one embodiment, one or more sensors of various types, depending on the application or implementation requirements, as would be understood by one skilled in the art. The sensors of optional sensing component 112 provide data and/or information to at least processing component 104. In one aspect, processing component 104 may be adapted to communicate with sensing component 112 (e.g., by receiving sensor information from sensing component 112) and with image capture component 102 (e.g., by receiving data and information from image capture component 102 and providing and/or receiving command, control, and/or other information to and/or from one or more other components of system 100).

In various implementations, sensing component 112 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 112 may represent conventional sensors as generally known by one skilled in the art for monitoring various conditions (e.g., environmental conditions) that may have an effect (e.g., on the image appearance) on the data provided by image capture component 102.

In some implementations, optional sensing component 112 (e.g., one or more of sensors) may comprise devices that relay information to processing component 104 via wired and/or wireless communication. For example, optional sensing component 112 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 104 may be combined with memory component 108, image capture component 102, display component 110, and/or optional sensing component 112. In another example, processing component 104 may be combined with image capture component 102 with only certain functions of processing component 104 performed by circuitry (e.g., a processor, a microprocessor, a logic device, a microcontroller, etc.) within image capture component 102. Furthermore, various components of system 100 may be remote from each other (e.g., image capture component 102 may comprise a remote sensor with processing component 104, etc. representing a computer that may or may not be in communication with image capture component 102).

Figure 2:
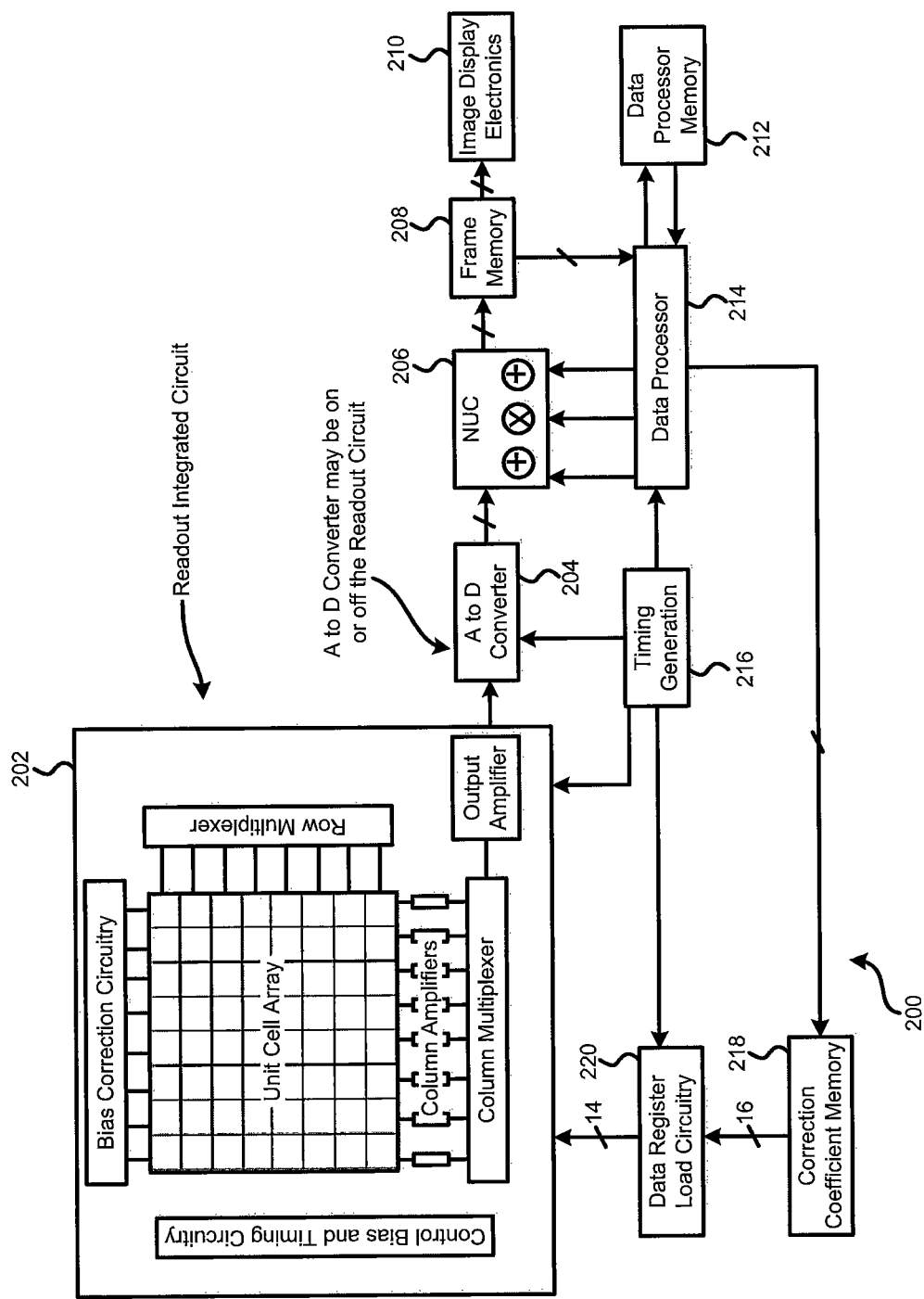
FIG. 2 shows a block diagram illustrating an implementation example for an infrared camera in accordance with one or more embodiments.

FIG. 2 shows a block diagram illustrating a specific implementation example for an infrared camera 200 in accordance with one or more embodiments. Infrared camera 200 may represent a specific implementation of system 100 (FIG. 1), as would be understood by one skilled in the art.

Infrared camera 200 (e.g., a microbolometer readout integrated circuit with bias-correction circuitry and interface system electronics) includes a readout integrated circuit (ROIC) 202, which may include the microbolometer unit cell array having one or more contacts coupled to microbolometer bridges via vertical legs as disclosed herein, control circuitry, timing circuitry, bias circuitry, row and column addressing circuitry, column amplifiers, and associated electronics to provide output signals that are digitized by an analog-to-digital (A/D) converter 204. The A/D converter 204 may be located as part of or separate from ROIC 202.

The output signals from A/D converter 204 are adjusted by a non-uniformity correction circuit (NUC) 206, which applies temperature dependent compensation as would be understood by one skilled in the art. After processing by NUC 206, the output signals are stored in a frame memory 208. The data in frame memory 208 is then available to image display electronics 210 and a data processor 214, which may also have a data processor memory 212. A timing generator 216 provides system timing.

Data processor 214 generates bias-correction data words, which are loaded into a correction coefficient memory 218. A data register load circuit 220 provides the interface to load the correction data into ROIC 202. In this fashion, variable circuitry such as variable resistors, digital-to-analog converters, biasing circuitry, which control voltage levels, biasing, frame timing, circuit element values, etc., are controlled by data processor 214 so that the output signals from ROIC 202 are uniform over a wide temperature range.

It should be understood that various functional blocks of infrared camera 200 may be combined and various functional blocks may also not be necessary, depending upon a specific application and specific requirements. For example, data processor 214 may perform various functions of NUC 206, while various memory blocks, such as correction coefficient memory 218 and frame memory 208, may be combined as desired.

Figure 3:
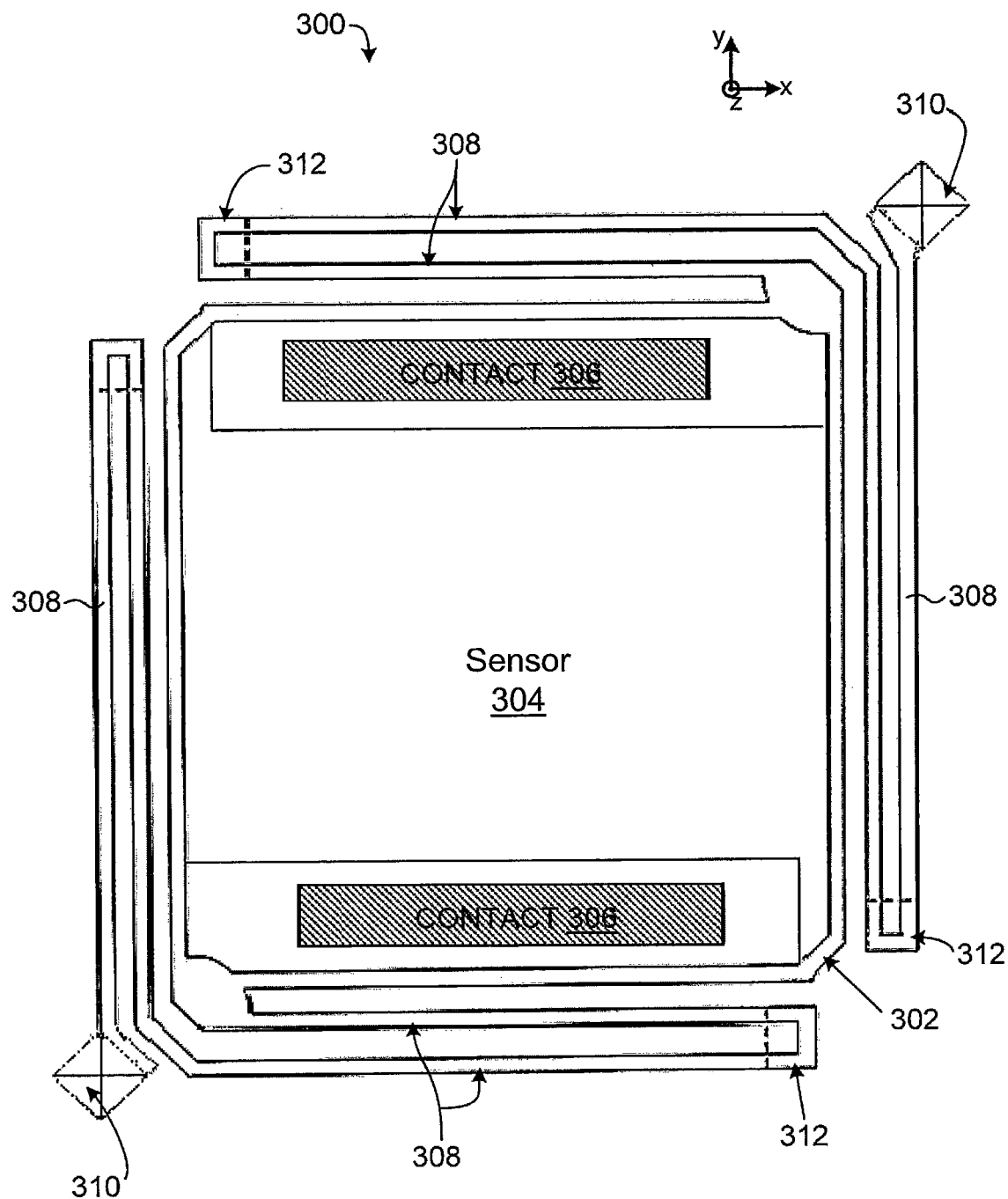
FIG. 3 shows a physical layout diagram of a microbolometer of a microbolometer array having vertical legs in accordance with an embodiment.

FIG. 3 shows a physical layout diagram of a microbolometer 300 in accordance with an embodiment of the invention. Microbolometer 300 includes a bridge portion 302 having a light sensor 304 and bridge contacts 306 that couple sensor 304 to a first end of legs 308. Legs 308 each couple sensor 304 to one of contacts 310.

Each contact 310 may couple one or more associated microbolometers 300 to associated readout circuitry of a readout integrated circuit (ROIC, not shown). For example, a first contact 310 may be used to provide a reference or bias voltage to the microbolometer and a second contact 310 may be used to a signal path from the microbolometer to the ROIC by which signals corresponding to infrared light absorbed by the microbolometer can be read out. Further descriptions of ROIC and microbolometer circuits may be found in U.S. Pat. No. 6,028,309, which is incorporated by reference in its entirety herein for all purposes.

Sensor 304 may be arranged to convert incident light such as infrared light into detectable electrical signals based on changes in electrical properties of the sensor (e.g., changes in resistivity) due to changes in temperature of the sensor when the light is incident. According to an embodiment, sensor 304 may include a resistive material, which may be formed of a high temperature coefficient of resistivity (TCR) material (e.g., vanadium oxide (VOx), titanium oxide (TiOx), or amorphous silicon). The resistive material may be suspended above the ROIC on bridge 302 and coupled to its contacts 310 via legs 308.

According to various embodiments, each contact 310 may be attached to a portion of a leg 308 that bends downward toward the ROIC (e.g., contact 310 may be formed on a substrate such as the ROIC and leg 308 may include a portion that runs at a non-perpendicular angle to the substrate from a first height above the substrate such as the height of the bridge downward to the substrate contact) and/or each contact 310 may include a portion that extends downward (e.g., in the negative z-direction of FIG. 3) from leg 308 to the surface of the ROIC. Legs 308 may be formed from one or more layers of conductive material such as, for example, titanium, nickel chromium, and/or other suitable conductive materials.

In order to provide legs 308 having a width and a length that is sufficient to provide suitable performance for microbolometer 300 without reducing the fill-factor of an array of microbolometers in which microbolometer 300 is included, legs 308 may be vertically oriented legs that run along paths in and/or parallel to the x-y plane of FIG. 3 as shown and have an extended dimension that extends in a direction parallel to the z-direction of FIG. 3. Legs 308 may include bend portions 312. Bend portions 312 may have additional electrical coupling and/or support structures as described in further detail hereinafter.

A plane such as the x-y plane of FIG. 3 may be defined by the bridge of the microbolometer (e.g., the bridge may include a planar sensor layer such as a resistive layer that defines a plane or a plane may be defined that passes through multiple bridges in a microbolometer array) or by the surface of a substrate (e.g., an ROIC substrate) to which the microbolometer array is coupled and disposed above.

Figure 4A:
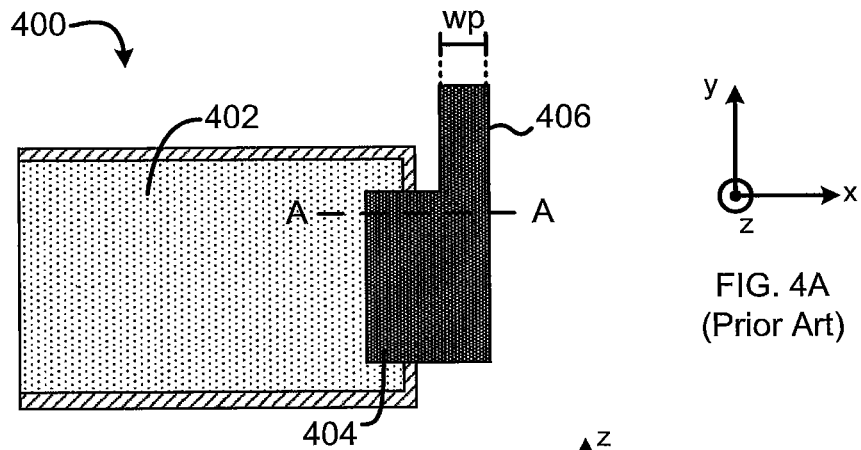
FIGS. 4A and 4B show a top view and a cross-sectional side view respectively of a conventional horizontal leg for a microbolometer.
Figure 4B:
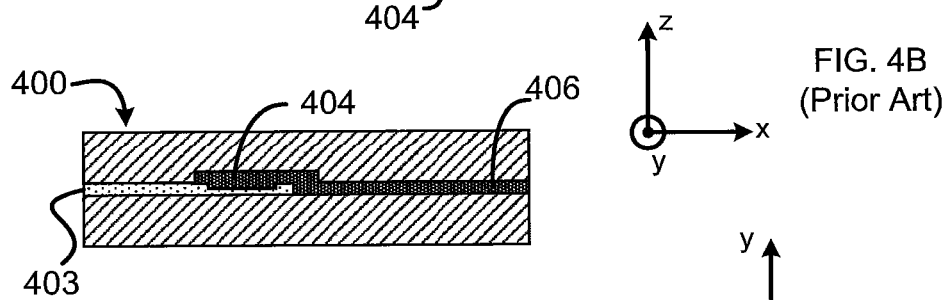

FIGS. 4A and 4B respectively show top and cross-sectional views of a conventional microbolometer 400 having horizontally oriented legs 406. As shown in the top view of FIG. 4A, a bridge 402 of microbolometer 400 is connected by a bridge contact 404 to horizontally oriented leg 406 having an extended dimension of width WP that extends in the x-y plane of FIG. 4A. In the cross sectional view of FIG. 4B, taken along line A-A of FIG. 4A, it can more easily be seen that contact 404, leg 406, and resistive material 403 of microbolometer 400 all extend along the same plane or parallel planes that are parallel to the x-y plane of FIG. 4B.

Figure 5A:
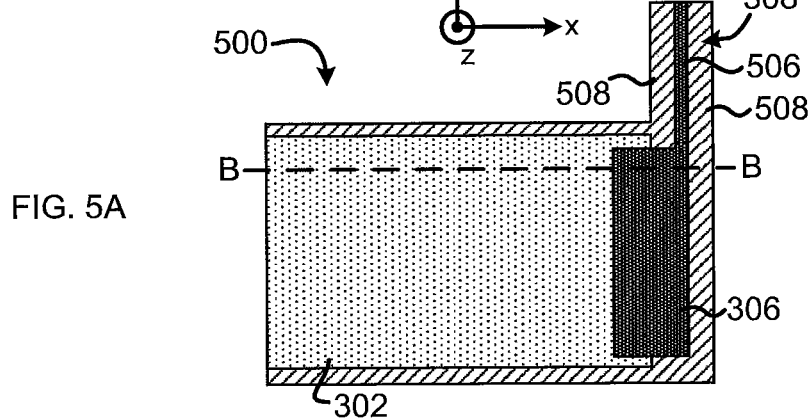
FIGS. 5A and 5B show a top view and a cross-sectional side view respectively of a vertical leg such as for a leg for coupling an infrared detector element to a contact, in accordance with an embodiment.
Figure 5B:
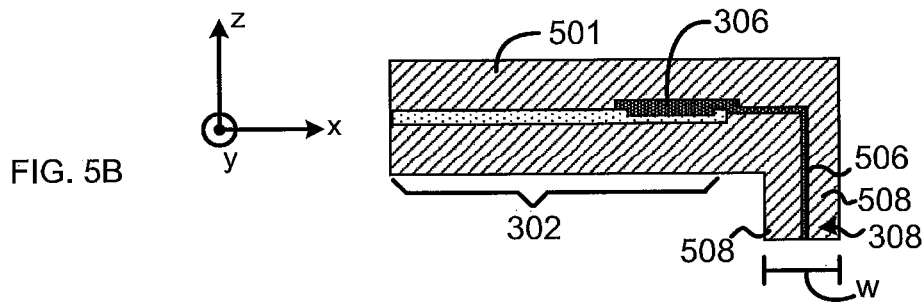

In contrast, FIGS. 5A and 5B respectively show top and cross-sectional views of a microbolometer 500 according to an embodiment of the present disclosure that includes a vertically oriented leg 308. As shown, vertically oriented leg 308 may have a width W in the x-y plane of FIGS. 5A and 5B. Width W may be comparatively smaller than the width WP of a conventional microbolometer leg without sacrificing the overall volume of the leg by allowing the leg 308 to extend in the vertical direction (e.g., in a direction parallel to the z-direction of FIGS. 5A and 5B) so that vertical leg 308 is perpendicular to a plane defined by bridge 302 (e.g., by resistive material 501 of bridge 302, by bridge contact 306, and/or by an array of bolometer bridges formed at a common height above an ROIC) and/or a plane defined by a surface of the substrate over which the bridge is formed.

As shown, according to an embodiment, a vertical leg 308 may include a conductive (e.g., metal) portion 506 and, if desired, insulating material 508 on one or more sides of the conductive portion. However, this is merely illustrative.

According to various embodiments, conductive portion 506 may be partially or completely surrounded by dielectric material or may be free of dielectric material. Various examples of implementations of vertical legs 308 are described hereinafter in connection with FIGS. 13A-13Q. However, first, processes that may be used to form vertical bolometer legs such as vertical legs 308 of FIGS. 3, 5A, and 5B will be discussed according to various embodiments.

FIGS. 6A-6F show cross sectional side views of a portion of a microbolometer array at various stages during production of microbolometer legs for the microbolometer array.

Figure 6A:
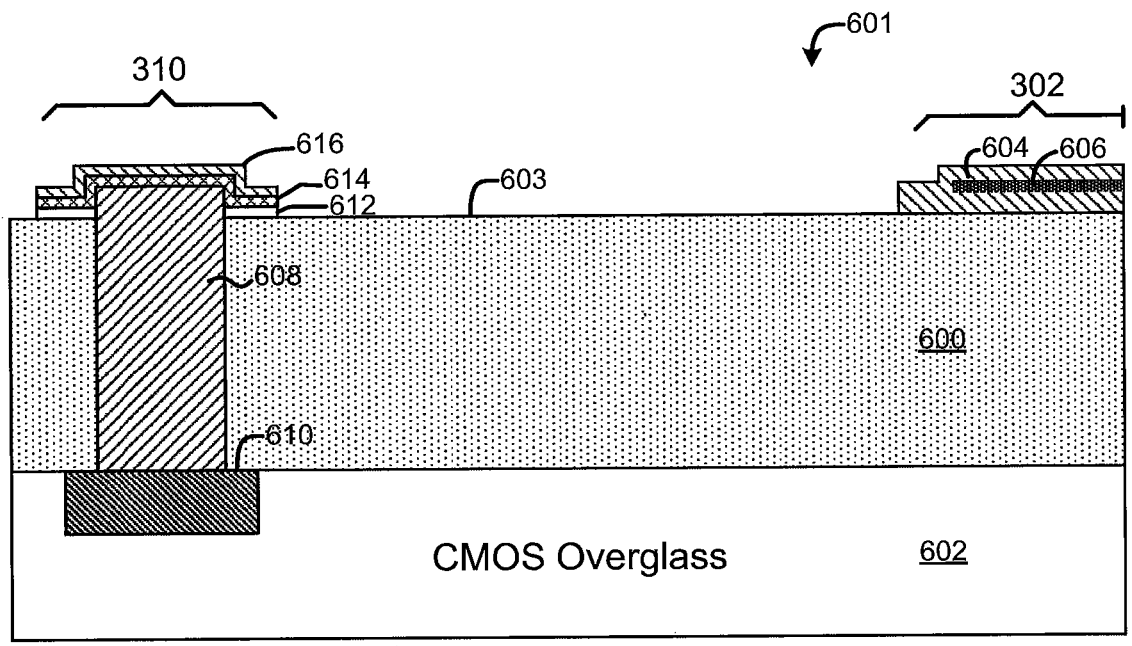
FIGS. 6A through 6F illustrate a processing overview for manufacturing a vertical leg, such as for the vertical legs of FIG. 3, in accordance with an embodiment.

Turning now to FIG. 6A, a portion 601 of a microbolometer array is shown having a contact 310 and a bridge 302. As shown, bridge 302 includes a sensor layer (e.g., a layer of temperature sensitive resistive material such as VOx) 606 and one or more additional layers 604 such as absorber layers. As shown, contact 310 may be formed from a vertical conductive portion such as metal stud 608 and one or more layers such as a metal contact layer 614 in contact with metal stud 608. Contact 310 may include additional layers such as a dielectric layer 616 disposed over the metal layer 614 and an additional layer 612 such as a passivation layer disposed under portions of metal layer 614. As shown, layer 612 may be formed on a portion of a top surface 603 of a sacrificial layer 600. In some cases, a basket contact or other contact may be utilized instead of metal stud 608.

Sacrificial layer 600 may be formed from, for example, polyimide. Layers 612 and 616 may be formed from, as examples, silicon dioxide or silicon nitride. Metal layer 614 may be formed from titanium, tungsten, copper, aluminum and/or other known metals.

Metal stud 608 may be conductively coupled to a conductive contact such as contact 610 of a substrate such as a readout integrated circuit (ROIC) substrate such as a complementary metal-oxide-semiconductor (CMOS) ROIC. In the example of FIG. 6A, contact 610 is disposed in an overglass layer 602 (e.g., a CMOS overglass layer) of the ROIC. Prior to forming vertical legs between the bridge 302 and the contact 310, bridge 302 may be disposed on a sacrificial layer 600 that supports bridge 302 and fills a gap between bridges of the microbolometer array and the ROIC and runs continuously between the bridges and contacts of the microbolometer array.

Figure 6B:
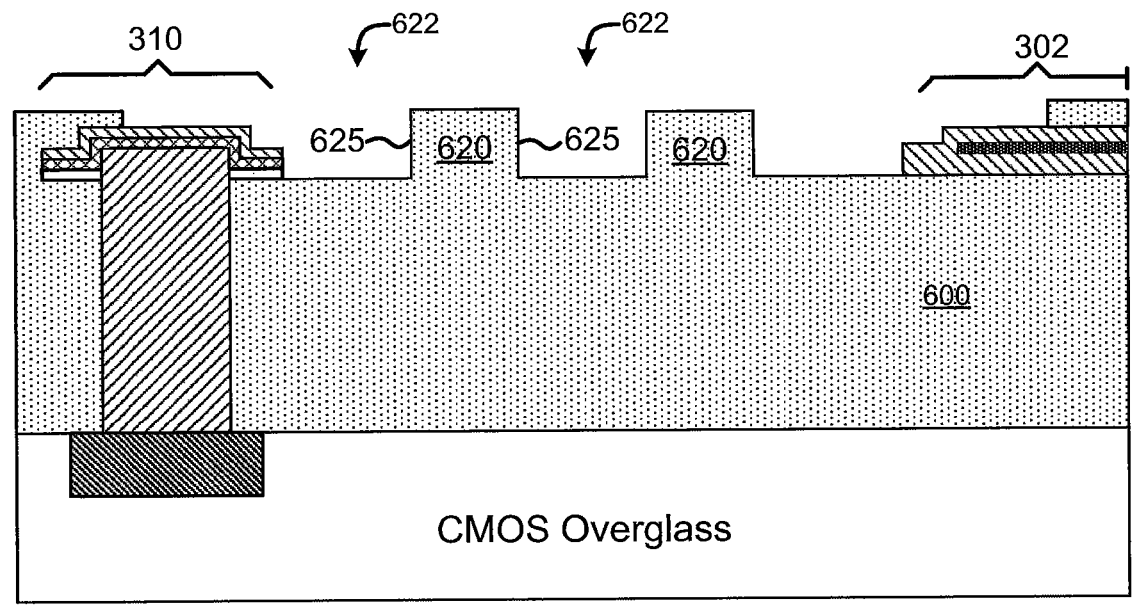

According to one embodiment, a process for forming vertical legs between bridge 302 and contact 310 may include depositing and patterning an additional sacrificial layer 620 on sacrificial layer 600 as shown in FIG. 6B. Patterning the additional sacrificial layer 620 may include forming openings 622 in the additional sacrificial layer (e.g., at least partially between the bridge 302 and the contact 310) so that remaining portions of additional sacrificial layer 620 have vertical sidewalls 625. Openings 622 may extend into sacrificial layer 600 or may extend only to the top surface 603 of sacrificial layer 600 (as examples).

Figure 6C:
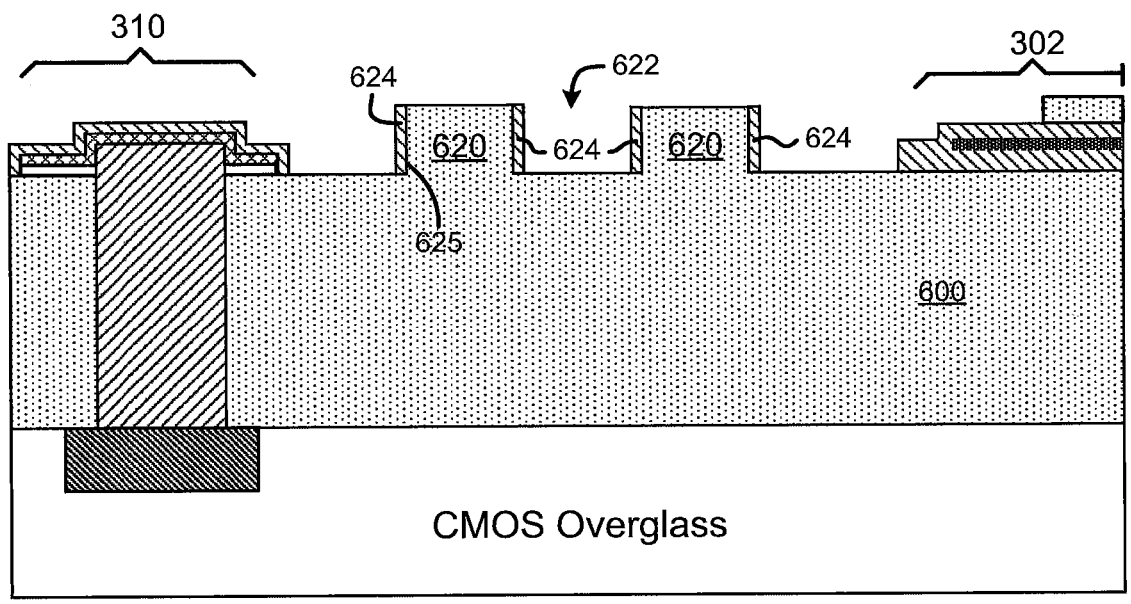
Figure 6D:
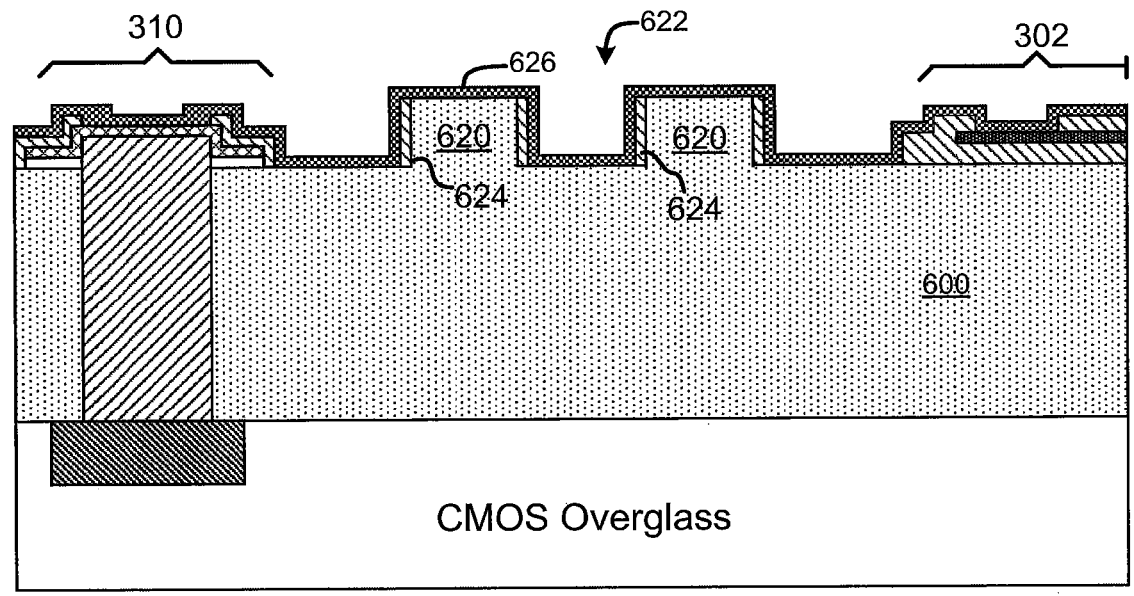

Following the deposition and patterning of additional sacrificial layer 620, a dielectric layer 624 may be deposited and patterned so that portions of the dielectric layer 624 remain on sidewalls 625 of additional sacrificial layer 620 in openings 622 as shown in FIG. 6C. A metal layer such as a leg metal layer 626 may then be deposited over contact 310, portions of sacrificial layer 600, dielectric layer 624 on sidewalls 625, portions of additional sacrificial layer 620, and bridge 302 as shown in FIG. 6D. If desired, openings may be formed in a dielectric layer of contact 310 and bridge 302 to expose portions of metal layer 614 and sensor layer 606 so that metal layer 626 can be deposited in contact with metal layer 614 and sensor layer 606. Metal layer 626 may be deposited in a blanket deposition process.

Figure 6E:
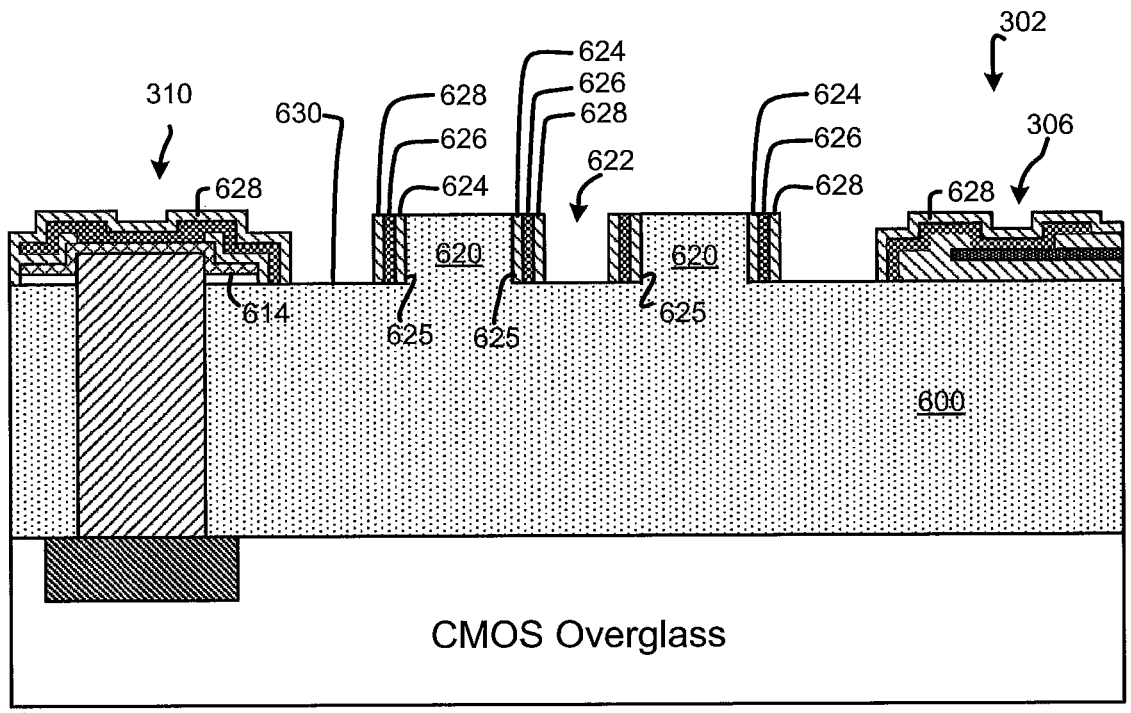

As shown in FIG. 6E, an additional dielectric layer 628 may be deposited over metal layer 626 and then metal layer 626 and additional dielectric layer 628 may be etched (e.g., in a masked spacer etch process) to remove portions of metal layer 626 and additional dielectric layer 628 from sacrificial layer 600 and additional sacrificial layer 620. In this way, a dielectric-metal-dielectric stack may be formed vertically on sidewalls 625 of openings 622. Portions of the dielectric-metal-dielectric stack that are continuously coupled with the portions on sidewalls 625 may also remain on contact 310 and bridge 302, thereby forming bridge contact 306 and a leg metal contact with metal layer 614 of contact 310.

Dielectric layers 624 and 628 may be formed from, as examples, silicon dioxide or a silicon nitride. Metal layer 626 may be a single metal layer formed form a homogeneous film of a single material or may include multiple materials (e.g., multiple layers of the same or different materials formed in multiple deposition operations). For example, metal layer 626 may be formed from titanium, tungsten, copper, aluminum and/or other known metals.

Figure 6F:
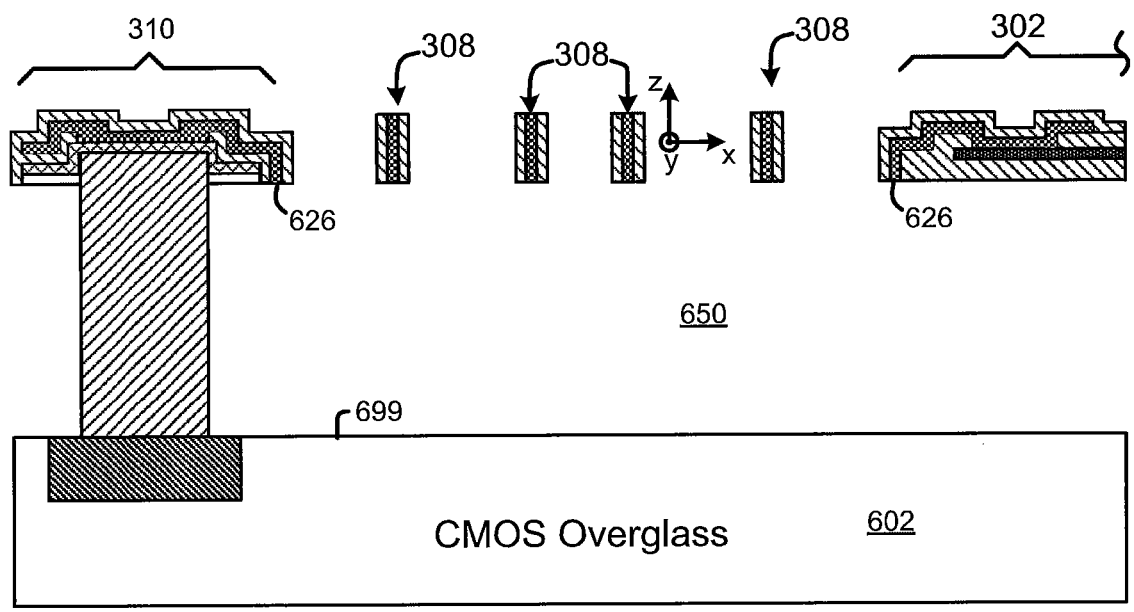

As shown in FIG. 6F, sacrificial layers 600 and 620 may then be removed to release bridge 302 and vertical legs 308 which remain suspended above the ROIC with a space 650 interposed between the vertical legs and the ROIC. Although the vertical legs 308 of FIG. 6F appear to be floating, this is merely because of the particular cross section through the device that is shown. It will be understood by one skilled in the art that vertical legs 308 of FIG. 6F run along the x-y plane of FIG. 6F as, for example, illustrated in FIG. 3 so that metal layer 626 forms a continuous conductive path between bridge contact 306 and contact 310. Vertical legs 308 of FIG. 6F may include at least a portion that runs non-perpendicularly to a plane defined by the surface 699 of substrate 602. For example, vertical legs 308 may run along a path that is parallel to the surface 699. In another example, vertical legs 308 may run along a path that includes a portion that is parallel to surface 699 and an additional portion that bends downward toward surface 699 at a non-perpendicular angle.

The process illustrated by FIGS. 6A-6F is merely illustrative. According to various embodiments, vertical legs for a microbolometer array may be formed using other processes. For example, in one embodiment, a process such as the process shown in FIGS. 7A-7F may be performed to form vertical legs that are disposed below the plane at which bridge 302 is formed (e.g., in contrast with the vertical legs of FIG. 6F that are disposed substantially in a common plane with bridge 302).

Figure 7A:
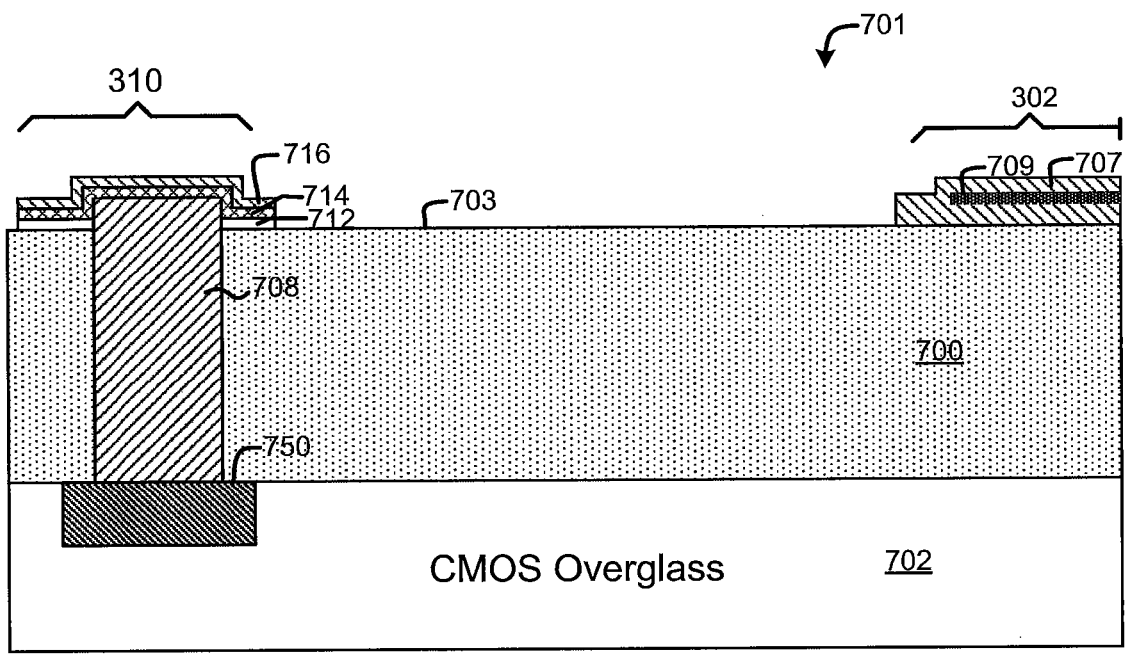
FIGS. 7A through 7F illustrate another processing overview for manufacturing a vertical leg, such as for the vertical legs of FIG. 3, in accordance with an embodiment.

Turning now to FIG. 7A, a portion 701 of a microbolometer array is shown having a contact 310 and a bridge 302. As shown, bridge 302 includes a sensor layer (e.g., a layer of temperature sensitive resistive material such as VOx) 709 and one or more additional layers 707 such as absorber layers. As shown, contact 310 may be formed from a vertical conductive portion such as metal stud 708 and one or more layers such as a metal contact layer 714 in contact with metal stud 708. Contact 310 may include additional layers such as a dielectric layer 716 disposed over the metal layer 714 and an additional layer 712 such as a passivation layer disposed under portions of metal layer 714. As shown, passivation layer 712 may be formed on a portion of a top surface 703 of a sacrificial layer 700.

Sacrificial layer 700 may be formed from, for example, polyimide. Layers 712 and 716 may be formed from, as examples, silicon dioxide or silicon nitride. Metal layer 714 may be formed from titanium, tungsten, copper, aluminum and/or other known metals.

Metal stud 708 (or, in some cases, a basket-shaped contact) may be conductively coupled to a conductive contact such as contact 750 of a readout integrated circuit (ROIC) such as a complementary metal-oxide-semiconductor (CMOS) ROIC. In the example of FIG. 7A, contact 750 is disposed in an overglass layer 702 (e.g., a CMOS overglass layer) of the ROIC. Prior to forming vertical legs between the bridge 302 and the contact 310, bridge 302 may be disposed on a sacrificial layer 700 that supports bridge 302 and fills a gap between bridges of the microbolometer array and the ROIC and runs continuously between the bridges and contacts of the microbolometer array.

Figure 7B:
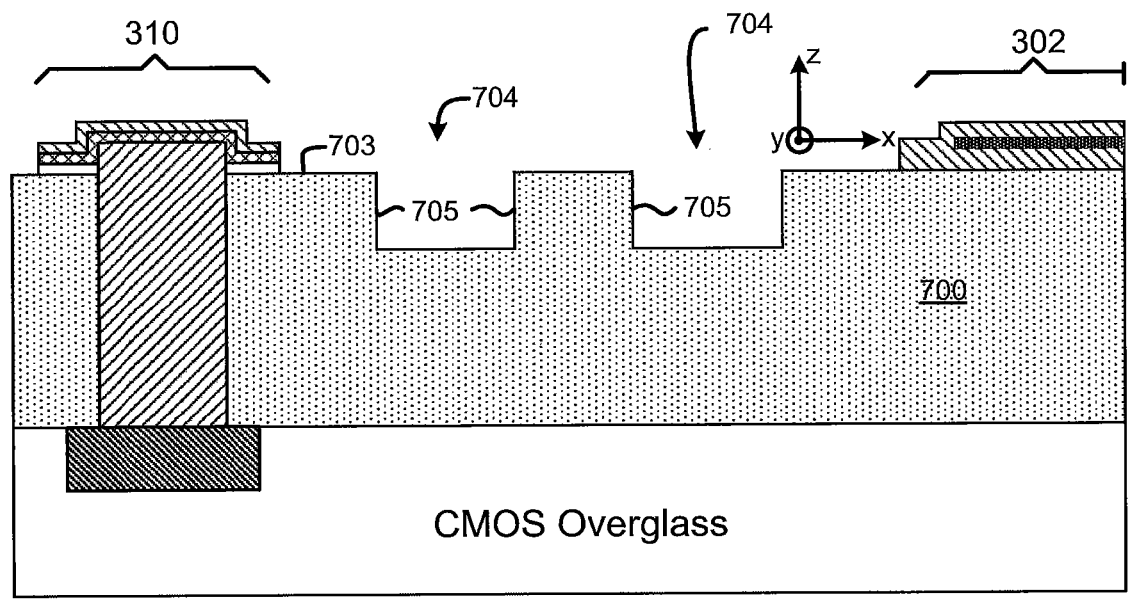

According to one embodiment, a process for forming vertical legs between bridge 302 and contact 310 may include forming openings 704 in the sacrificial layer 700 that supports bridge 302 (e.g., by etching through surface 703) as shown in FIG. 7B. Openings 704 may be formed in a portion of sacrificial layer 700 that is disposed at least partially between the bridge 302 and the contact 310 so that openings 704 have vertical sidewalls 705 at various locations between bridge 302 and contact 310. As shown, sidewalls 705 may be located substantially below a plane defined by bridge 302 (e.g., the x-y plane of FIG. 7B).

Figure 7C:
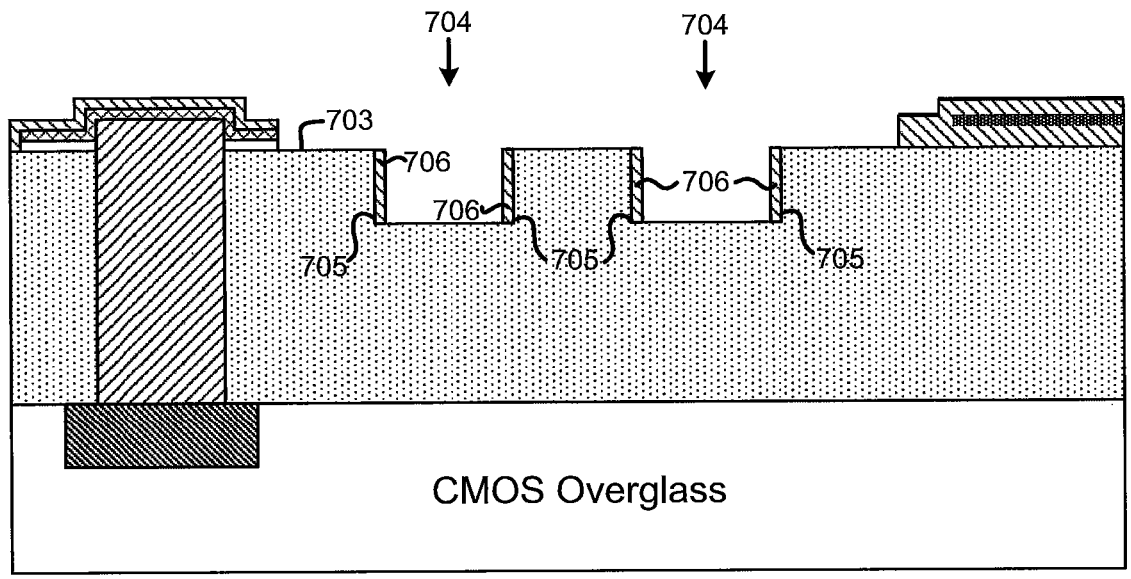
Figure 7D:
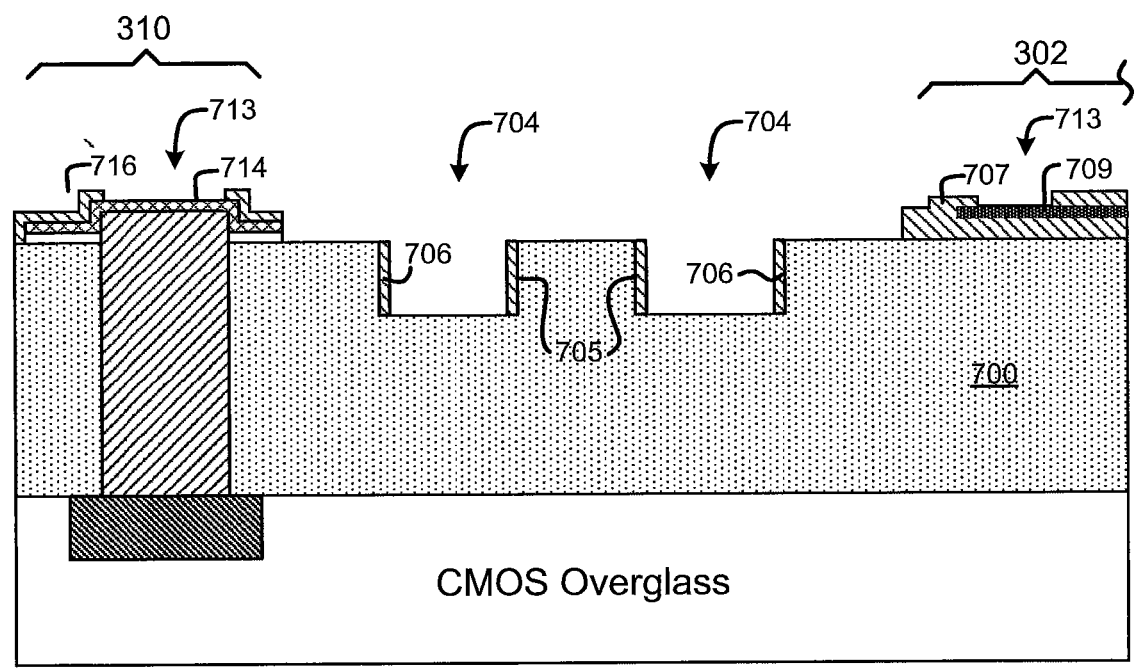

As shown in FIG. 7C, a dielectric layer 706 may be deposited and patterned so that portions of the dielectric layer 706 remain on sidewalls 705 of sacrificial layer 700 in openings 704. Openings such as openings 713 in layers 707 of bridge 302 and dielectric layer 716 may also be formed to expose portions of sensor layer 709 and metal layer 714 respectively as shown in FIG. 7D.

Figure 7E:
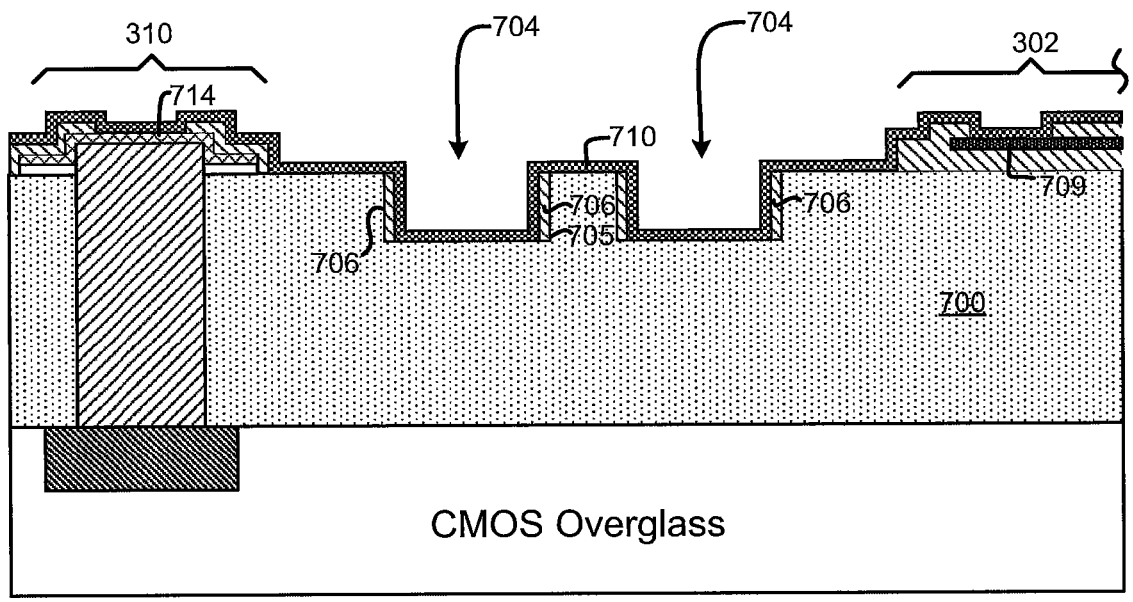

A metal layer such as a leg metal layer 710 may then be deposited over contact 310, portions of sacrificial layer 700, dielectric layer 706 on sidewalls 705, and bridge 302 as shown in FIG. 7E. Metal layer 710 may be deposited in a blanket deposition process. As shown, portions of metal layer 710 may be formed within openings 713 (see FIG. 7D) and in contact with sensor layer 709 and metal layer 714.

An additional dielectric layer 711 (FIG. 7F) may be deposited over metal layer 710 and metal layer 710 and additional dielectric layer 711 may be etched (e.g., in a masked spacer etch process) to remove portions of metal layer 710 and additional dielectric layer 711 from sacrificial layer 700. In this way, a dielectric-metal-dielectric stack may be formed vertically on sidewalls 705 of openings 704 and portions of the dielectric-metal-dielectric stack that are continuously coupled with the portions on sidewalls 705 may also remain on contact 310 and bridge 302, thereby forming bridge contact 306 and a leg metal contact with metal layer 714 of contact 310.

Dielectric layers 706 and 711 may be formed from, as examples, silicon dioxide or a silicon nitride. Metal layer 710 may be a single metal layer formed form a homogeneous film of a single material or may include multiple materials (e.g., multiple layers of the same or different materials formed in multiple deposition operations). For example, metal layer 710 may be formed from titanium, tungsten, copper, aluminum and/or other known metals.

Figure 7F:
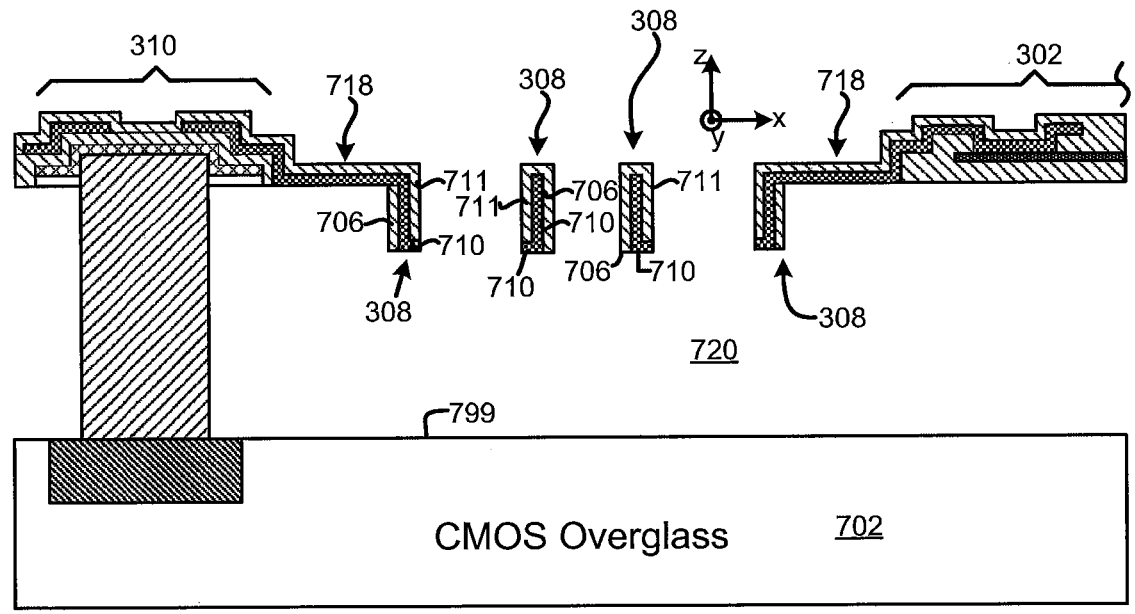

As shown in FIG. 7F, sacrificial layer 700 may then be removed to release bridge 302 and vertical legs 308 formed from metal layer 710 and dielectric layers 706 and 711 that partially surround metal layer 710. As shown, vertical legs 308 remain suspended above the ROIC with a space 720 interposed between the vertical legs and the ROIC. In this way, vertical legs 308 may be formed perpendicular to the x-y plane of FIG. 7F and run along a path (e.g., as illustrated in FIG. 3) that is disposed below the x-y plane of FIG. 7F between bridge 302 and contact 310 so that metal layer 710 forms a continuous conductive path between bridge contact 306 and contact 310 via legs 308.

Vertical legs 308 of FIG. 7F may include at least a portion that runs non-perpendicularly to a plane defined by the surface 799 of substrate 702. For example, vertical legs 308 may run along a path that is parallel to the surface 799. In another example, vertical legs 308 may run along a path that includes a portion that is parallel to surface 799 and an additional portion that bends downward toward surface 799 at anon-perpendicular angle.

In the example of FIG. 7F, the legs that couple bridge 302 to contact 310 may include vertical portions 308 and horizontal portions 718 that extend between bridge 302 and a first end of vertical leg 308 and between a second opposing end of vertical leg 308 and contact 310. In various embodiments, legs 308 may include any suitable combination of vertical and horizontal portions for providing sufficient performance for the microbolometer while avoiding reduction of the fill factor of the microbolometer array due to the area occupied by the legs.

Figure 8A:
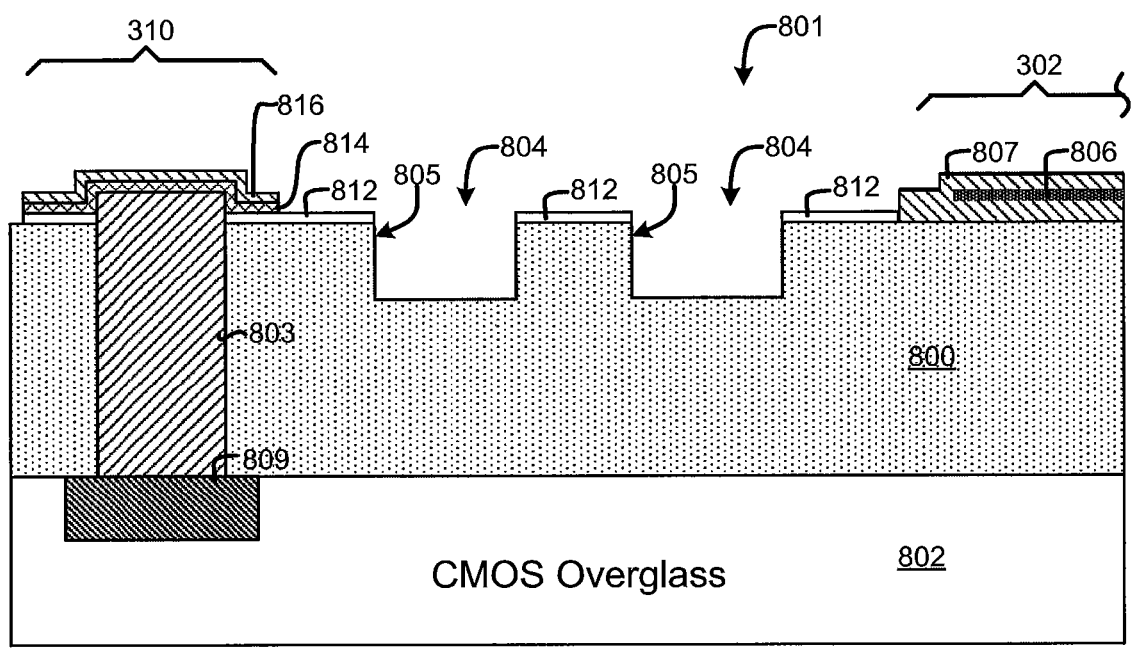
FIGS. 8A through 8C illustrate a yet another processing overview for manufacturing a vertical leg, such as for the vertical legs of FIG. 3, in accordance with an embodiment.
Figure 8B:
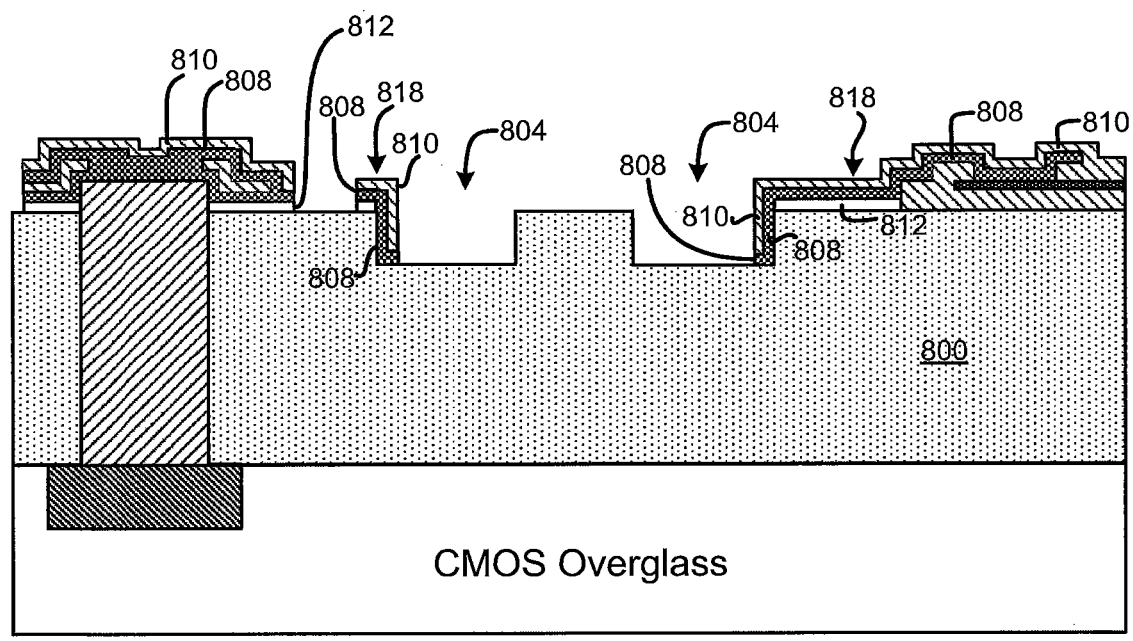
Figure 8C:
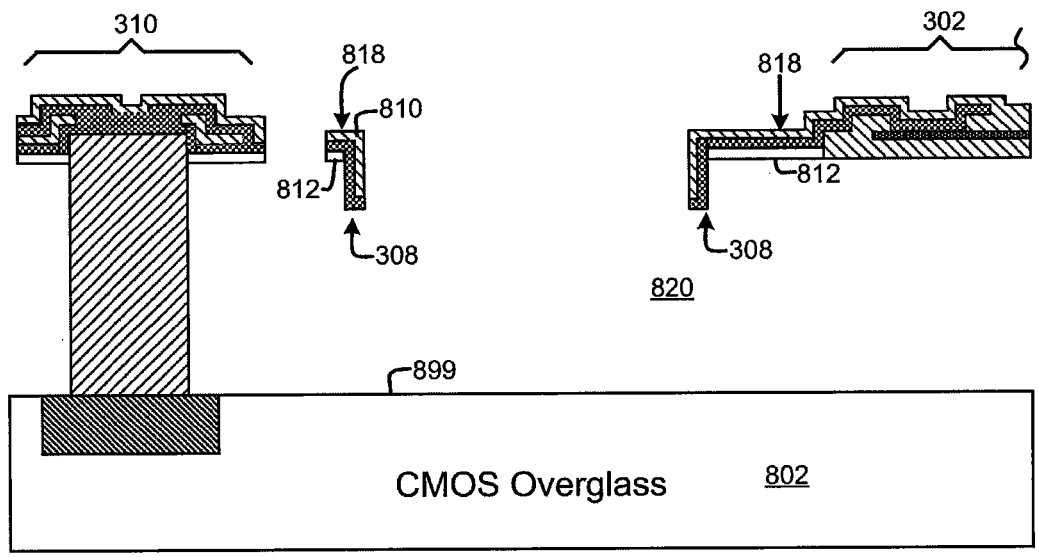

FIGS. 8A-8C are cross sectional side views of a portion of a microbolometer array at various stages during formation of vertical legs that illustrate yet another alternative process of vertical leg formation.

Turning now to FIG. 8A, a portion 801 of a microbolometer array is shown having a contact 310 and a bridge 302. As shown, bridge 302 includes a sensor layer (e.g., a layer of temperature sensitive resistive material such as VOx) 806 and one or more additional layers 807 such as absorber layers. As shown, contact 310 may be formed from a vertical conductive portion such as metal stud 803 and one or more layers such as a metal contact layer 814 in contact with metal stud 803. Contact 310 may include additional layers such as a dielectric layer 816 disposed over the metal layer 814 and an additional layer 812 such as a passivation layer disposed under portions of metal layer 814 and covering a top surface of a sacrificial layer 800. Passivation layer 812 may extend between bridge 302 and contact 310 on the top surface sacrificial layer 800.

Sacrificial layer 800 may be formed from, for example, polyimide. Layers 812 and 816 may be formed from, as examples, silicon dioxide or silicon nitride. Metal layer 814 may be formed from titanium, tungsten, copper, aluminum and/or other known metals.

Metal stud 803 (or in some cases, a basket-shaped contact) may be conductively coupled to a conductive contact such as contact 809 of a readout integrated circuit (ROIC) such as a complementary metal-oxide-semiconductor (CMOS) ROIC. In the example of FIG. 8A, contact 809 is disposed in an overglass layer 802 (e.g., a CMOS overglass layer) of the ROIC. Prior to forming vertical legs between the bridge 302 and the contact 310, bridge 302 may be disposed on a sacrificial layer 800 that supports bridge 302 and fills a gap between bridges of the microbolometer array and the ROIC and runs continuously between the bridges and contacts of the microbolometer array.

According to one embodiment, a process for forming vertical legs between bridge 302 and contact 310 may include forming openings 804 in the sacrificial layer 800 that supports bridge 302 and in the passivation layer 812 that is disposed on the sacrificial layer as shown in FIG. 8A. Openings 804 may be formed in a portion of sacrificial layer 800 and passivation layer 812 that is at least partially disposed between the bridge 302 and the contact 310 so that openings 804 have vertical sidewalls 805 at various locations between bridge 302 and contact 310. As shown, sidewalls 805 may be formed from a portion of sacrificial layer 800 and passivation layer 812.

A metal layer such as a leg metal layer 808 may then be deposited (e.g., over contact 310, on portions of the top surface of passivation layer 812, on sidewalls 805 in contact with both sacrificial layer 800 and passivation layer 812, on portions of sacrificial layer 800 in openings 804, and on bridge 302) before a dielectric layer 810 is deposited (e.g., over metal layer 808) and then metal layer 808, dielectric layer 810, and passivation layer 812 may be patterned (e.g., in a masked spacer etch process) so that metal layer 808 remains on some of the sidewalls of openings 804, as shown in FIG. 8B. In this way, a metal leg may be formed vertically on some of the sidewalls of openings 804 and horizontal portions 818 having metal layer 808 interposed between passivation layer 812 and dielectric layer 810 may also remain on sacrificial layer 800.

Dielectric layer 810 may be formed from, as examples, silicon dioxide or a silicon nitride. Metal layer 808 may be a single metal layer formed form a homogeneous film of a single material or may include multiple materials (e.g., multiple layers of the same or different materials formed in multiple deposition operations). For example, metal layer 808 may be formed from titanium, tungsten, copper, aluminum and/or other known metals.

As shown in FIG. 8C, sacrificial layer 800 may then be removed to release bridge 302 and vertical legs 308 with horizontal portions 818. As shown, vertical legs 308 including horizontal portions 818 remain suspended above the ROIC with a space 820 interposed between the vertical legs and the ROIC. Vertical legs having some horizontal portions such as those shown in FIG. 8C may be less prone to movement and/or damage than legs having only vertical portions. Vertical legs 308 including horizontal portions 818 may form a continuous conductive path between bridge contact 306 and contact 310 via legs 308.

Vertical legs 308 of FIG. 8C may include at least a portion that runs non-perpendicularly to a plane defined by the surface 899 of substrate 802. For example, vertical legs 308 may run along a path that is parallel to the surface 899. In another example, vertical legs 308 may run along a path that includes a portion that is parallel to surface 899 and an additional portion that bends downward toward surface 899 at anon-perpendicular angle.

Figure 9:
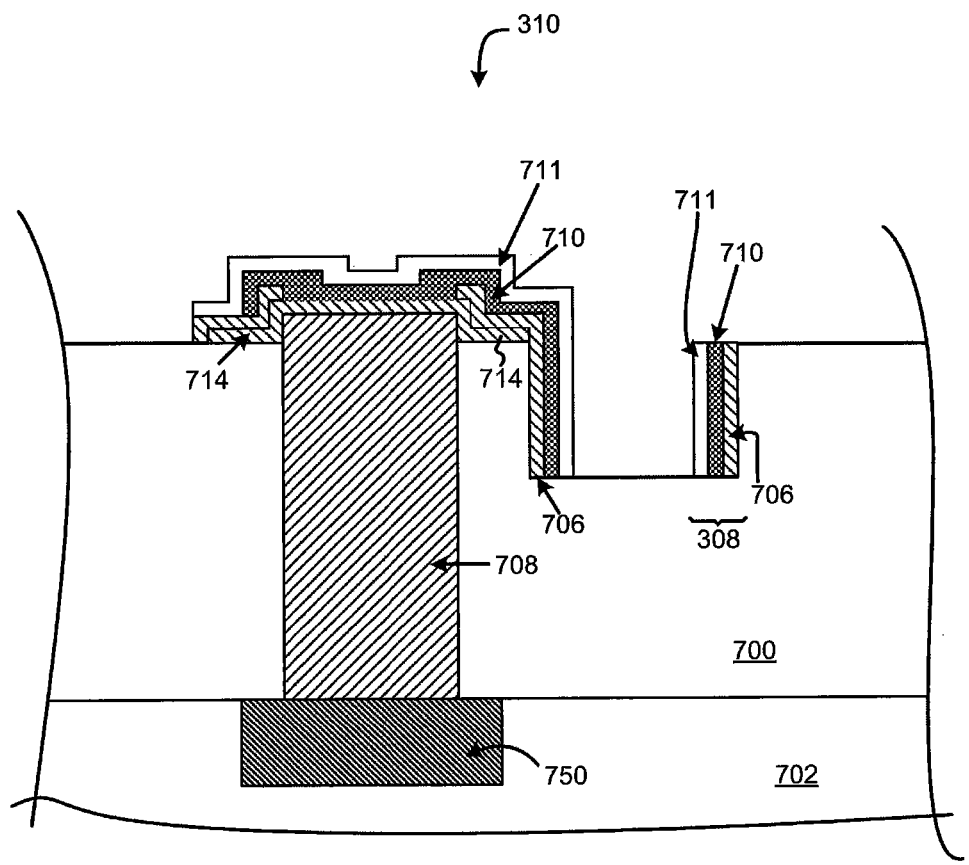
FIG. 9 shows a cross-sectional side view, in the vicinity of a vertical contact between an infrared detector array and a readout integrated circuit, of a portion of a focal plane array having vertical legs that are formed below a surface of the array, in accordance with an embodiment.
Figure 10:
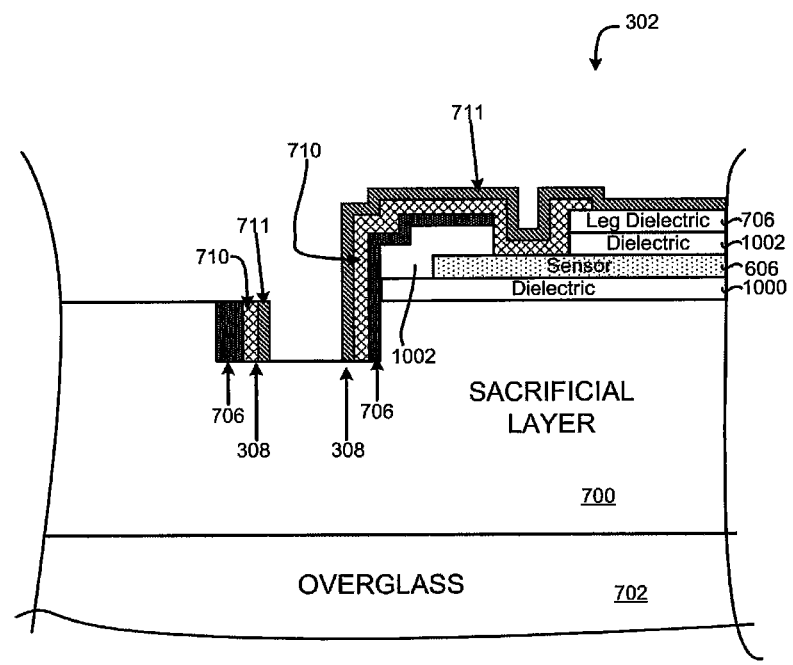
FIG. 10 shows a cross-sectional side view, in the vicinity of a sensor of the array, of a portion of a focal plane array having vertical legs that are formed below a surface of the array, in accordance with an embodiment.
Figure 11:
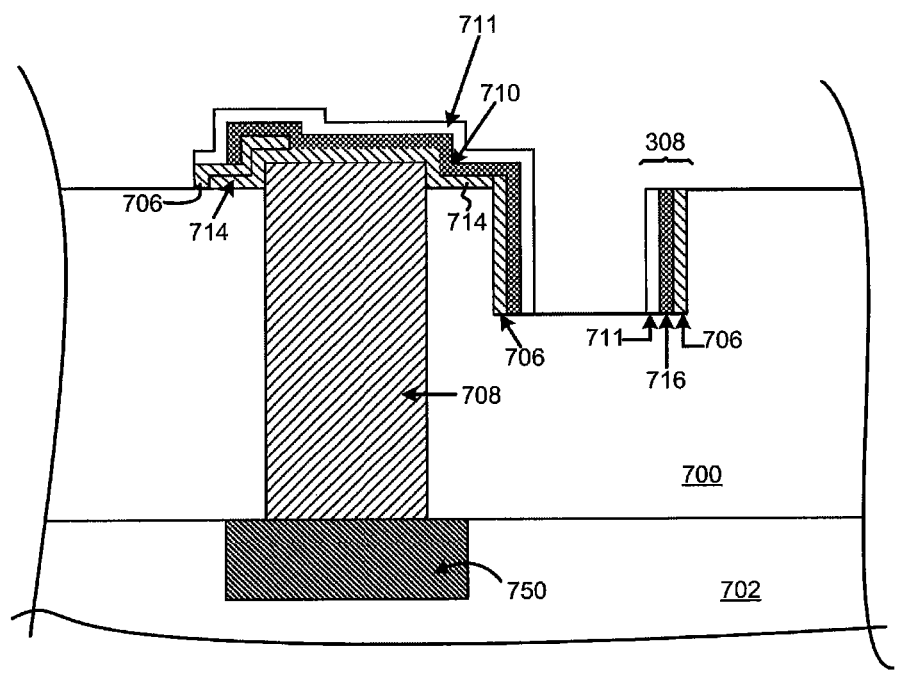
FIG. 11 shows a cross-sectional side view, in the vicinity of a vertical contact between an infrared detector array and a readout integrated circuit, of a portion of a focal plane array having vertical legs that are formed below a surface of the array, in accordance with an embodiment.
Figure 12:
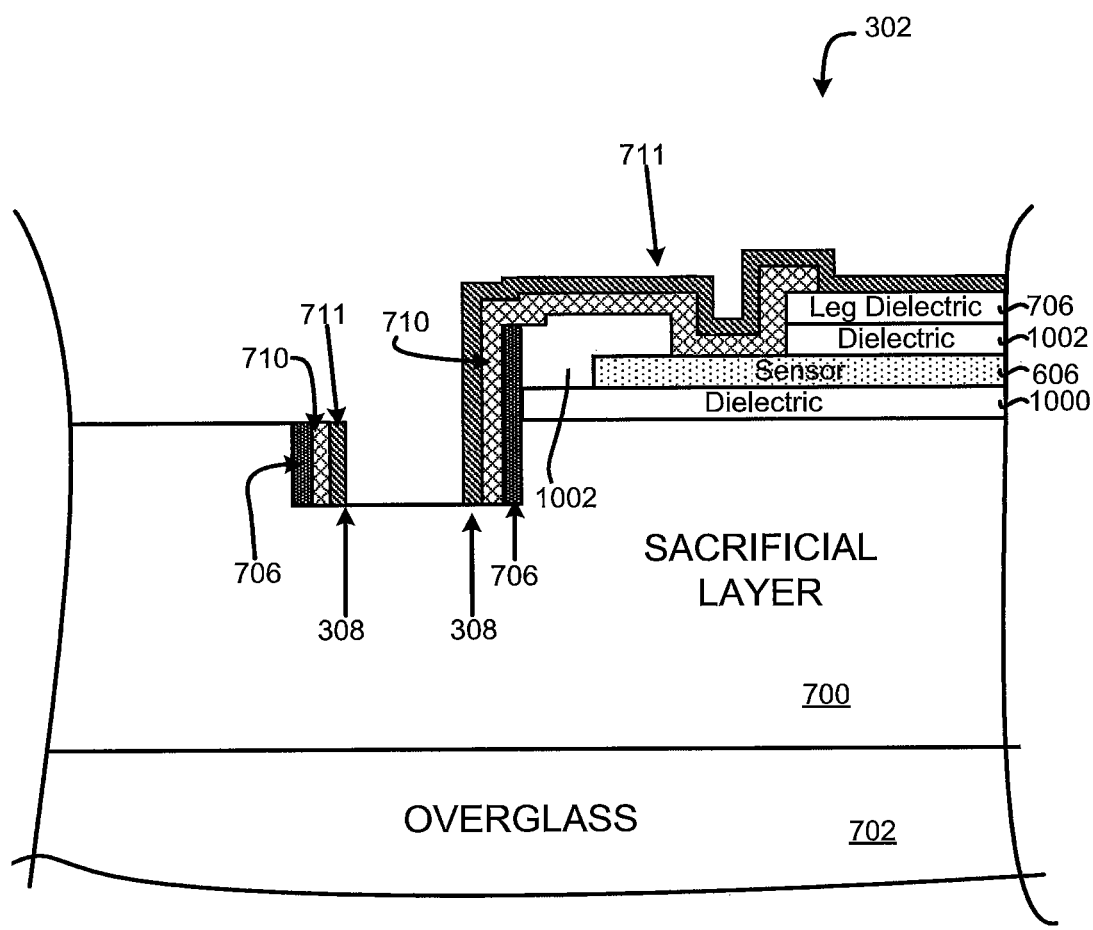
FIG. 12 shows a cross-sectional side view, in the vicinity of a sensor of the array, of a portion of a focal plane array having vertical legs that are formed below a surface of the array, in accordance with an embodiment.
Figure 14:
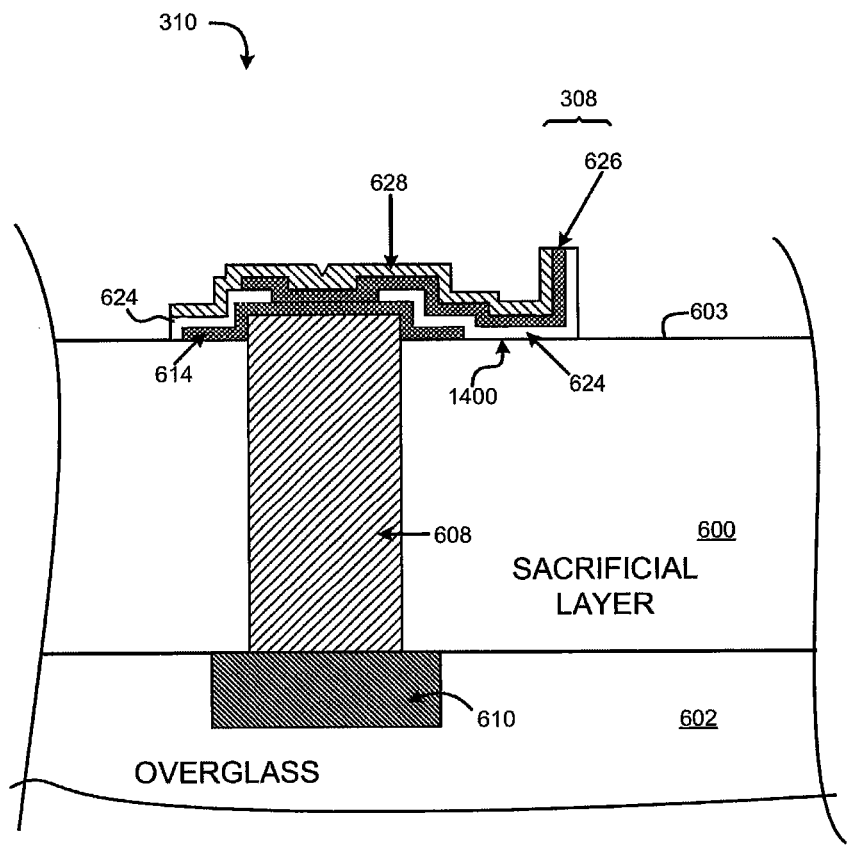
FIG. 14 shows a cross-sectional side view, in the vicinity of a vertical contact between an infrared detector array and a readout integrated circuit, of a portion of a focal plane array having vertical legs formed at or above a surface of the array, in accordance with an embodiment.
Figure 15:
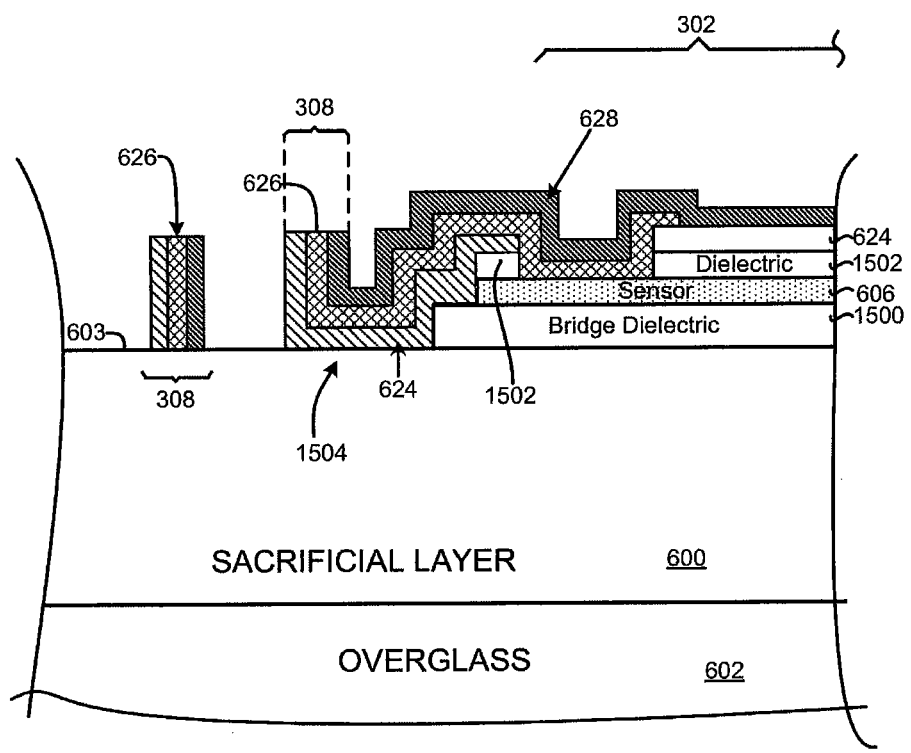
FIG. 15 shows a cross-sectional side view, in the vicinity of a sensor of the array, of a portion of a focal plane array having vertical legs formed above a surface of the array, in accordance with an embodiment.

It will be appreciated that the processes described above in connection with FIGS. 6A-8C can be modified, rearranged, and/or omitted to form vertical bolometer legs having various shapes, sizes, orientations, and arrangements as desired for various purposes. FIGS. 9, 10, 11, 12, 13A-13Q, 14, and 15 show various arrangements of vertical legs and associated contacts or bridges that can be formed for microbolometer arrays. In particular, FIGS. 9 and 10 show portions of a microbolometer array (prior to release by removal of a sacrificial layer) having vertical legs formed below the plane of the bridge in the vicinity of a contact and a bridge, respectively, of a microbolometer, according to one embodiment. FIGS. 11 and 12 show portions of a microbolometer array having vertical legs formed below the plane of the bridge in the vicinity of a contact and a bridge, respectively, of a microbolometer, according to another embodiment. FIGS. 13A-13Q show various arrangements of metal and insulation for vertical legs for a microbolometer. FIGS. 14 and 15 show portions of a microbolometer array having vertical legs formed at or above the plane of the bridge in the vicinity of a contact and a bridge, respectively, of a microbolometer, according to another embodiment.

As shown in FIG. 9, at a particular stage of production, a portion of metal layer 714 may be formed on sacrificial layer 700 and a portion of dielectric layer 706 may extend over the portion of metal layer 714 that is formed on the sacrificial layer, over a vertical portion of metal layer 714 that is formed on stud 708, and over a horizontal portion of metal layer 714 that is formed on top of stud 708 such that the portion of dielectric layer 706 that is disposed above the top surface of sacrificial layer 700 is symmetric on multiple sides of stud 708. Sacrificial layer 700 may then be removed.

A process that results in the structure of FIG. 9 for contact 310 may also form a bridge as shown in FIG. 10 according to an embodiment. As shown in FIG. 10, bridge 302 may include bridge dielectric layers 1000 and 1002 disposed on opposing sides of sensor layer 606. Dielectric layer 706 may extend vertically from a vertical leg structure 308 and over a portion of bridge dielectric 1002. Metal layer 710 may cover the portion of dielectric layer 706 that extends vertically from the vertical leg structure 308 and over the portion of bridge dielectric 1002 and the metal layer may extend through bridge dielectric 1002 and leg dielectric 706 to contact sensor layer 606.

In an alternative embodiment, as shown in FIG. 11, metal layer 710 may be asymmetric about the top of stud 708 so that metal layer 710 remains in contact with metal layer 714 of contact 310 on the side of stud 708 on which the vertical legs 308 are formed, thereby increasing the contact area between layers 710 and 714. Following formation of the structures of FIG. 11 as shown, sacrificial layer 700 may be removed.

A process that results in the structure of FIG. 11 for contact 310 may also form a bridge as shown in FIG. 12 according to an embodiment. As shown in FIG. 12, a portion of metal layer 710 may be formed directly on a portion of bridge dielectric 1002 so that metal layer 710 passes over the portion of bridge dielectric 1002 and through bridge dielectric 1002 to contact sensor layer 606.

FIGS. 13A-13Q each show a cross sectional view of an exemplary implementation of a vertical bolometer leg such as vertical legs 308 as described herein. As shown in FIG. 13A, a vertical bolometer leg may include a substantially vertical conductive (e.g., metal) layer 1300 that is disposed between first and second substantially vertical dielectric layers 1302 and 1304 that have a common height H with the vertical conductive layer 1300. In the configuration of FIG. 13A, the vertical leg may have a width that is substantially the same along the height of the vertical leg and substantially equal to the sum of the widths of the layers 1300, 1302, and 1304.

In general, a vertical bolometer leg may have a first dimension (e.g., a height H) that extends in a direction that is perpendicular to a plane defined by the associated bolometer bridge and/or a substrate, a second dimension (e.g., a width W) that extends in a direction that is parallel to the plane of the bridge and/or the substrate, and a third dimension that extends along and defines a signal path, where the path may include a portion that extends in a direction parallel to the plane of the bridge and/or the substrate, and where the second dimension is substantially smaller than the first dimension.

As shown in FIG. 13B, in one embodiment, dielectric layer 1302 may extend above the top of conductive layer 1300 and run horizontally over the top of conductive layer 1300 and dielectric layer 1304. As shown in FIG. 13C, in one embodiment, conductive layer 1300 may have a height that is shorter than the height of dielectric layer 1302 and dielectric layer 1302 may run underneath the bottom of conductive layer 1300 and dielectric layer 1304.

As shown in FIG. 13D, in one embodiment, dielectric layer 1302 may extend above the top of conductive layer 1300 and run horizontally over the top of conductive layer 1300 and dielectric layer 1304 and conductive layer 1300 may have a height that is shorter than the height of dielectric layer 1302 and dielectric layer 1304 may run underneath the bottom of conductive layer 1300 to dielectric layer 1302. As shown in FIG. 13E, in one embodiment, conductive layer 1300 may have a height that is shorter than the height of dielectric layer 1302, dielectric layer 1304 may run underneath the bottom of conductive layer 1300 to dielectric layer 1302, and a horizontal dielectric layer 1306 may cover the top of layers 1300, 1302, and 1304.

As shown in FIG. 13F, in one embodiment, conductive layer 1300 and dielectric layers 1302 and 1304 may have a common height and a horizontal dielectric layer 1306 may cover the top of layers 1300, 1302, and 1304. As shown in FIG. 13G, in one embodiment, conductive layer 1300 may have a vertical portion and a horizontal portion such that conductive layer has, in cross section, an "L" shape. In the configuration of FIG. 13G, dielectric layer 1304 runs vertically along the vertical portion of conductive layer 1300 and horizontally under the vertical and horizontal portions of conductive layer 1300 and dielectric layer 1302 runs vertically along the vertical portion of conductive layer 1300, horizontally over the top of the horizontal portion of conductive layer 1300, and vertically past the horizontal portion of conductive layer 1300 to the bottom of the vertical leg.

As shown in FIG. 13H, in one embodiment, conductive layer 1300 may be free of any surrounding dielectric material. As shown in FIG. 13I, in one embodiment, conductive layer 1300 may have one side covered by dielectric layer 1304 and an opposing side that is free of dielectric material. As shown in FIG. 13J, in one embodiment, a conductive layer 1300 that has one side covered by dielectric layer 1302 and an opposing side that is free of dielectric material may have a height that is shorter than the height of the vertical leg and dielectric layer 1302 may run underneath the bottom of conductive layer 1300. As shown in FIG. 13K, in one embodiment, a conductive layer 1300 that has one side covered by dielectric layer 1302 and an opposing side that is free of dielectric material may have a vertical portion and a horizontal portion that runs over the top of dielectric layer 1302.

As shown in FIG. 13L, in one embodiment, a conductive layer 1300 that has one side covered by dielectric layer 1304 and an opposing side that is free of dielectric material may have a first vertical portion, a horizontal portion that runs over the top of dielectric layer 1304, and a second vertical portion that is offset from the first vertical portion. In the configuration of FIG. 13L, dielectric layer 1304 may have a vertical portion that runs along the first vertical portion of conductive layer 1300 and a horizontal portion that runs under the first vertical portion of conductive layer 1300 to the second vertical portion of conductive layer 1300.

As shown in FIG. 13M, conductive layer 1300 may include a vertical portion and a horizontal portion 1308 that extends horizontally from the bottom of the vertical portion of conductive layer 1300 so that conductive layer 1300 and horizontal portion 1308 form an "L" shape. In the example of FIG. 13M, conductive layer 1300 is covered on a first side by dielectric (insulating) layer 1302, on another side by dielectric (insulating) layer 1304, and along a bottom surface of horizontal portion 1308 by insulating (dielectric layer 1312).

As shown in FIG. 13N, in one embodiment, horizontal portion 1308 and the part of the vertical portion that is below the top surface of the vertical portion may be substantially surrounded by one or more dielectric layers such as dielectric layers 1302, 1304, and 1312 so that the top end of the vertical portion of conductive layer 1300 is free of dielectric material.

As shown in FIG. 13O, in one embodiment, conductive portion 1300 may have a vertical portion, a first horizontal portion that extends in a first direction from the top of the vertical portion, a second horizontal portion that extends in an opposing second direction from the bottom of the vertical portion, and an additional portion that fills the space beneath a horizontal dielectric layer 1304 formed under the first horizontal portion. In the configuration of FIG. 13O, the first horizontal portion, the vertical portion and top of the second horizontal portion of conductive layer 1300 are covered on one side by dielectric layer 1302.

As shown in FIG. 13P, in one embodiment, conductive layer 1300 may have a vertical portion, a first horizontal portion that extends in a first direction from the top of the vertical portion, and a second horizontal portion that extends in an opposing second direction from the bottom of the vertical portion. In the configuration of FIG. 13P, the first horizontal portion, the vertical portion and top of the second horizontal portion of conductive layer 1300 are covered on one side by dielectric layer 1302 and dielectric layer 1304 runs under and fills the space under the first horizontal portion of conductive layer 1300. As shown in FIG. 13Q, a conductive layer having a vertical portion, a first horizontal portion that extends in a first direction from the top of the vertical portion, and a second horizontal portion that extends in an opposing second direction from the bottom of the vertical portion may be substantially surrounded by an insulating material 1312.

As shown in FIG. 14, at a particular stage of production for vertical bolometer legs formed above and perpendicular to surface 603 of a sacrificial layer such as sacrificial layer 600 (e.g., the sacrificial layer upon which the bridge structures for one or more microbolometers are formed), a portion of metal layer 614 may be formed on sacrificial layer 600 and a portion of dielectric layer 624 may extend over the portion of metal layer 614 that is formed on the sacrificial layer, over a vertical portion of metal layer 614 that is formed on stud 608, and over a horizontal portion of metal layer 614 that is formed on top of stud 608. Dielectric layer 624, leg metal layer 626, and dielectric layer 628 may forma horizontal portion 1400 that extends horizontally from contact 310 and turns perpendicularly to form vertical leg portion 308. Sacrificial layer 600 may then be removed.

A process that results in the structure of FIG. 14 for contact 310 may also form a bridge as shown in FIG. 15 according to an embodiment. As shown in FIG. 15, bridge 302 may include bridge dielectric layers 1500 and 1502 disposed on opposing sides of sensor layer 606. Dielectric layer 624, metal layer 626, and dielectric layer 628 may form a stack that includes vertical leg portions 308 and a portion 1504 that extends horizontally from a vertical leg portion 308 to bridge 302. As shown, metal layer 626 may cover a portion of dielectric layer 624 that extends horizontally from the vertical leg structure 308 and over a portion of bridge dielectric 1502 and may pass through bridge dielectric 1502 and leg dielectric 624 to contact sensor layer 606.

Figure 16:
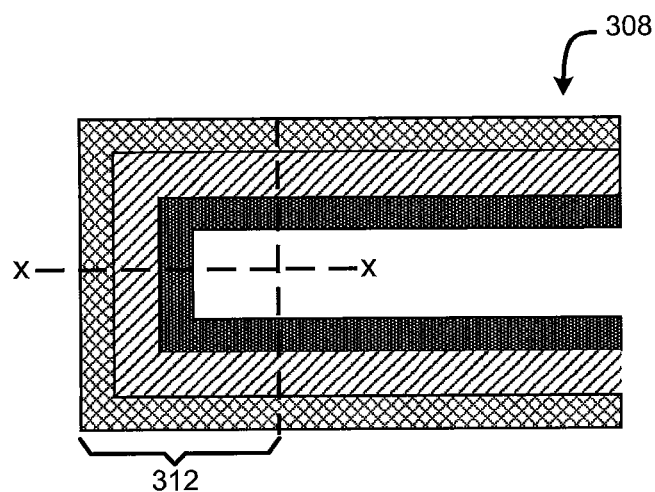
FIG. 16 shows a top view of a bend portion of a vertical leg, such as for the vertical legs of FIG. 3 in the vicinity of a bend in the vertical leg, in accordance with an embodiment.
Figure 17:
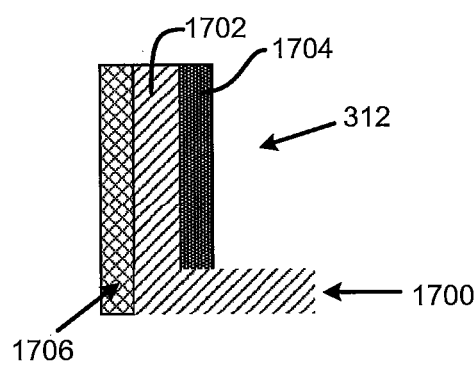
FIG. 17 shows a cross-sectional view of an example arrangement of the vertical leg of FIG. 16, in accordance with an embodiment.
Figure 18:
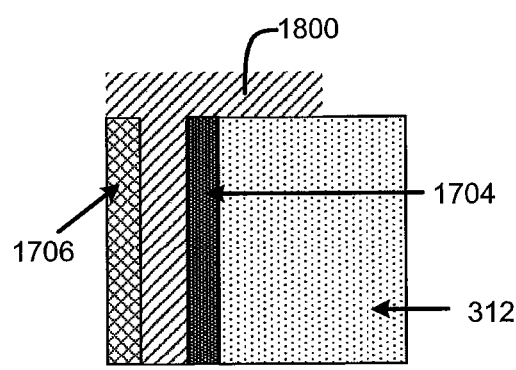
FIG. 18 shows a cross-sectional view of another example arrangement of the vertical leg of FIG. 16, in accordance with an embodiment.

FIG. 16 shows a top view of a portion of a vertical leg 308 in a bend region 312. FIGS. 17 and 18 show cross sectional side views of exemplary implementations of the bend region 312 taken along the line x-x of FIG. 16. As shown in FIG. 17, according to one embodiment, bend region 312 may include a pad 1700 formed at the bottom of a vertical conductive layer 1702 that is interposed between vertical dielectric layers 1704 and 1706 of the vertical leg. Pad 1700 may be formed from metal, dielectric materials, or a combination of metal and dielectric materials (as examples). As shown in FIG. 18, according to one embodiment, bend region 312 may include a metal pad 1800 formed over the top of vertical conductive layer 1702 and vertical dielectric layers 1704 and 1706 of the vertical leg. Pad 1800 may be formed from metal, dielectric materials, or a combination of metal and dielectric materials (as examples).

Figure 19:
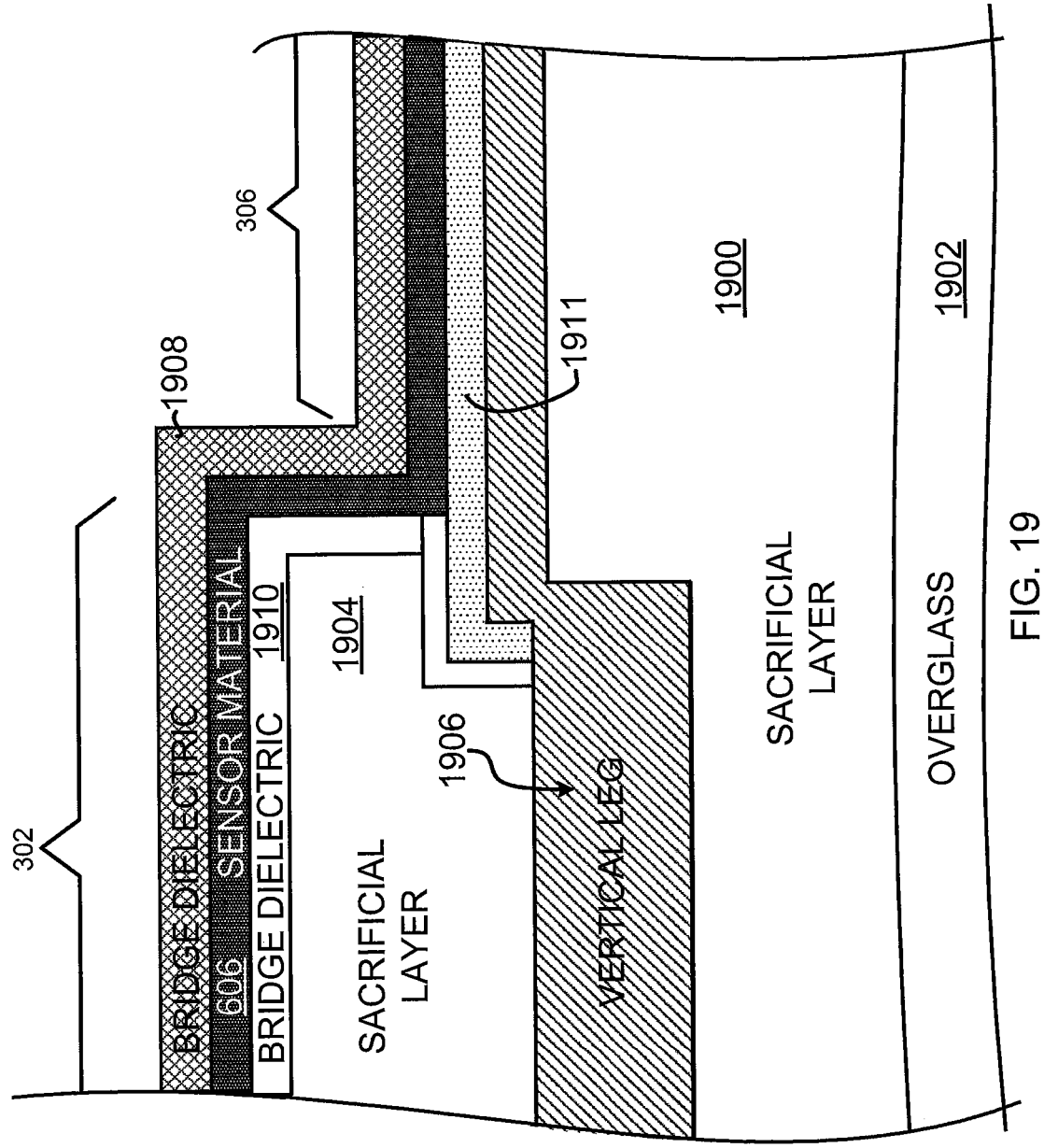
FIG. 19 shows a cross-sectional view of a portion of a focal plane array having legs, such as legs for an infrared detector, that are formed at least partially beneath a bridge portion of the infrared detector, in accordance with an embodiment.

FIG. 19 is a cross sectional side view of a portion of a microbolometer array at a particular stage of production showing how, in one embodiment, at least a portion of a vertical leg structure may be formed beneath the bridge 302 of a microbolometer. As shown in FIG. 19, bridge 302 may include a sensor layer 606 disposed between bridge dielectric layers 1908 and 1910. Bridge dielectric layer 1910 may be formed on a first sacrificial layer 1904 that is interposed between bridge dielectric layer 1910 and a vertical leg structure 1906 that runs beneath the bridge dielectric layer 1910 and overglass 1902 of an ROIC for the microbolometer array. At the stage of production shown in FIG. 19, a second sacrificial layer 1900 may be disposed between the vertical leg structure 1906 and overglass 1902.

In the configuration shown in FIG. 19, sensor layer 606 of bridge 302 includes a vertical portion that runs downward from the bridge 302 and turns horizontally to form a portion of bridge contact 306. As shown, a conductive layer such as conductive layer 1911 may couple sensor material 606 in bridge contact region 306 to the vertical leg structure 1906. Vertical leg structure 1906 may extend to a contact such as a stud contact or basket contact that couples the vertical leg structure 1906 to a contact on the ROIC (e.g., a contact formed partially or completely within overglass layer 1902). Vertical leg structure 1906 may couple to a dedicated contact structure for the bridge 302 underneath which it is formed and/or may be coupled to a shared contact with an adjacent microbolometer.

Figure 20:
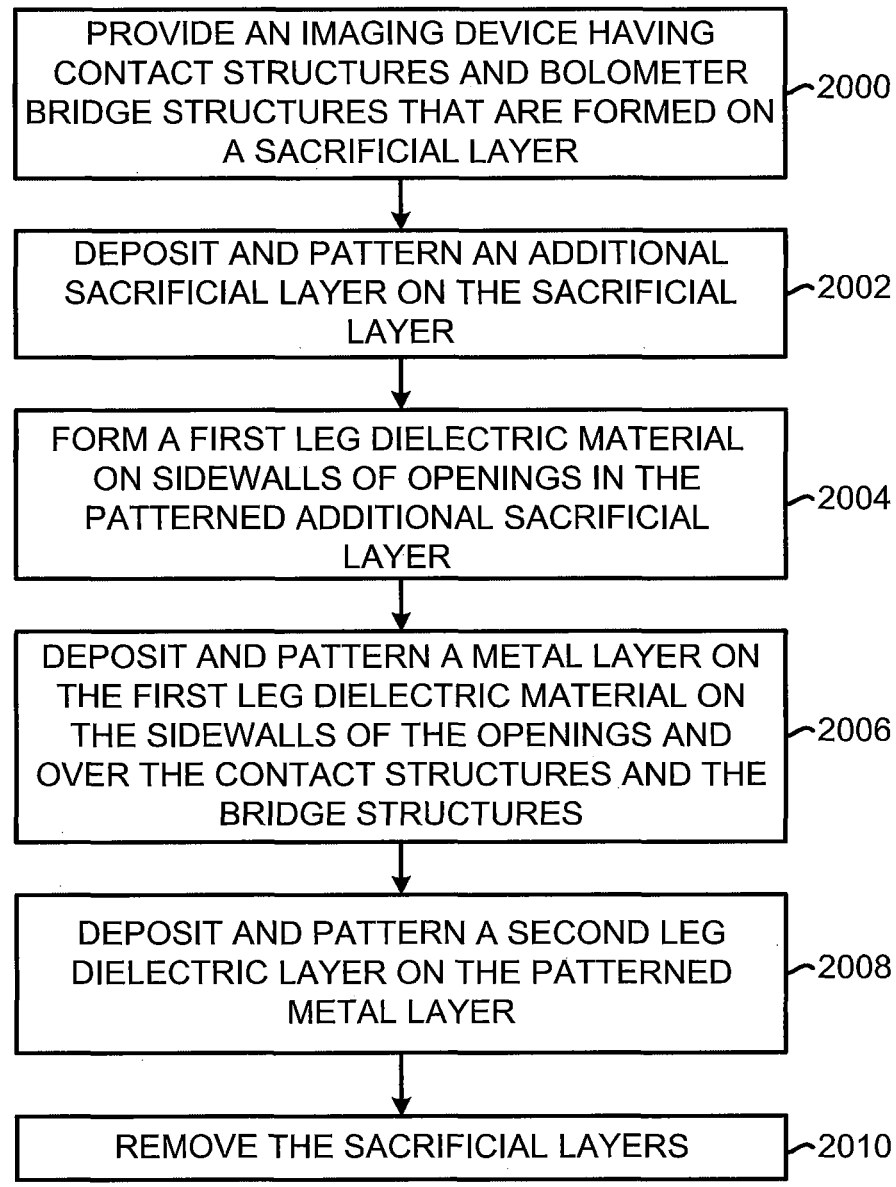
FIG. 20 illustrates a flow diagram for manufacturing a vertical leg, such as for the vertical legs of FIG. 3, in accordance with an embodiment.

FIG. 20 is a flowchart of illustrative operations that may be performed for forming vertical microbolometer legs for coupling a microbolometer bridge to a ROIC contact structure according to an embodiment.

At block 2000, an imaging device having contact structures and bolometer bridge structures such as microbolometer bridge structures may be provided. The imaging device may include a partially fabricated focal plane array on which a sacrificial layer such as a polyimide layer is formed on a substrate such as a readout integrated circuit and the bridge structures are formed on the sacrificial layer. In some embodiments, an etch stop layer may be formed on the sacrificial layer. However, in other embodiments, the sacrificial layer may be free of any etch stop material. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2002, an additional sacrificial layer may be deposited and patterned over or on the sacrificial layer. In embodiments, in which an etch stop layer is provided on the sacrificial layer, the additional sacrificial layer may be deposited on the etch stop layer so that portions of the etch stop layer are formed between the sacrificial layer and the additional sacrificial layer. Patterning the additional sacrificial layer may include etching the additional sacrificial layer to form openings in the additional sacrificial layer at least partially between the bridge structures and the contact structures.

At block 2004, a first leg dielectric material may be formed at least on sidewalls of the openings in the patterned additional sacrificial layer. Forming the first leg dielectric material on the sidewalls of the openings may include depositing the first leg dielectric layer and performing a spacer etch of the first leg dielectric layer. The etch may also leave portions of the first leg dielectric layer on portions of the contact structures and/or the bridge structures as desired.

At block 2006, one or more conductive layers such as a leg metal layer may be deposited (e.g., using a blanket metal deposition) and patterned on the first leg dielectric material on the sidewalls of the openings and over at least some of the contact structures and the bridge structures. The leg metal layer may be formed in contact with a metal layer of the contact structures and with a sensor layer of the bridge structures.

At block 2008, a second leg dielectric layer may be deposited and patterned on the metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2010, the sacrificial layer and the additional sacrificial layer may be removed to release the bridge structures and the vertical leg structures formed from the first and second leg dielectric layers and the leg metal layers so that the bridge and legs are suspended above the readout integrated circuit and the contact structures are coupled to the bridge structures by the vertical leg structures. In embodiments, in which an etch stop layer is provided on the sacrificial layer, portions of the etch stop layer may also be removed.

Figure 21:
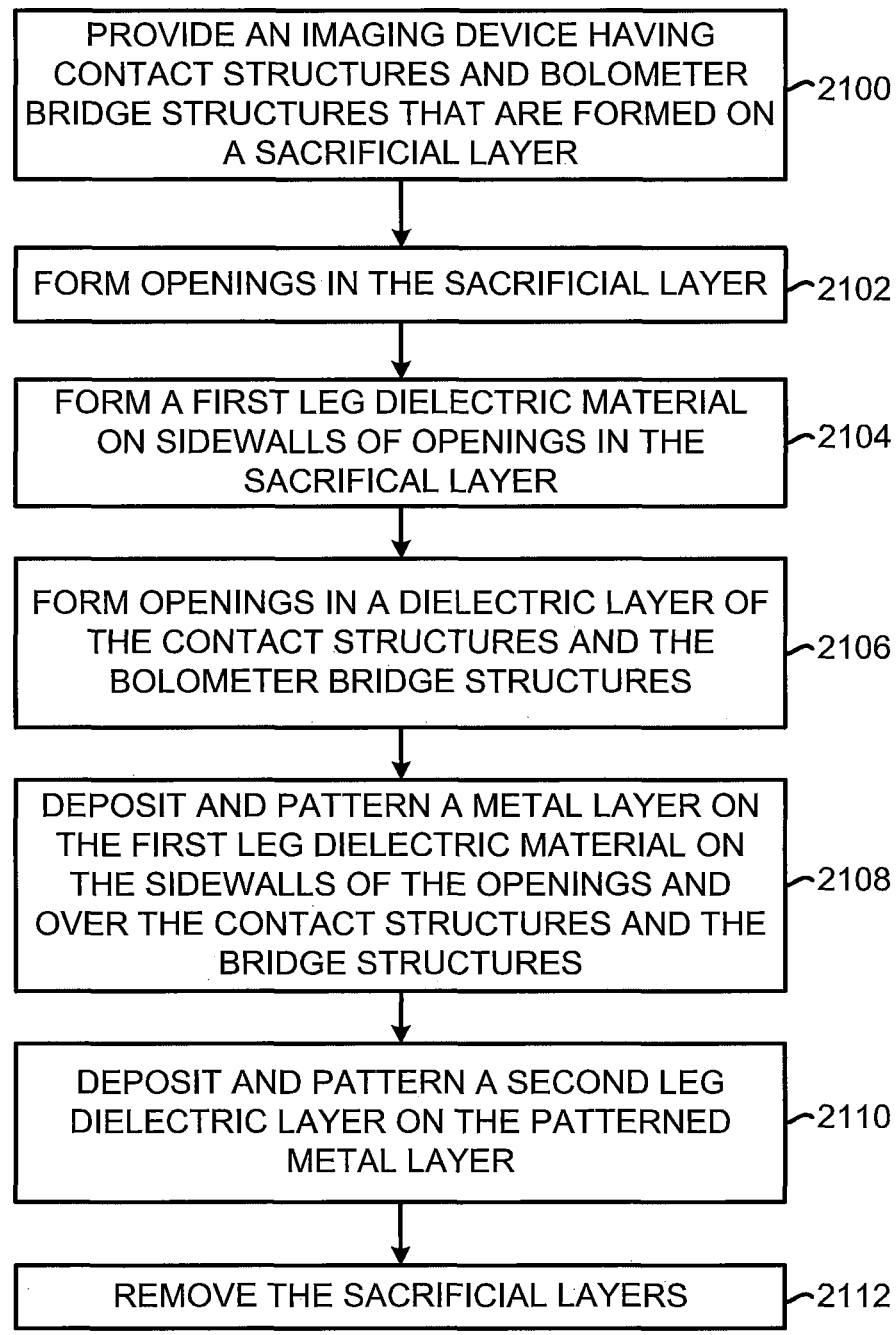
FIG. 21 illustrates another flow diagram for manufacturing a vertical leg, such as for the vertical legs of FIG. 3, in accordance with an embodiment.

FIG. 21 is a flowchart of illustrative operations that may be performed for forming vertical microbolometer legs for coupling a microbolometer bridge to a ROIC contact structure according to another embodiment.

At block 2100, an imaging device having contact structures and bolometer bridge structures such as microbolometer bridge structures may be provided. The imaging device may include a partially fabricated focal plane array on which a sacrificial layer such as a polyimide layer is formed on a readout integrated circuit and the bridge structures are formed on the sacrificial layer. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2102, the sacrificial layer may be etched to form openings in the sacrificial layer at least partially between the bridge structures and the contact structures.

At block 2104, a first leg dielectric material may be formed at least on sidewalls of the openings in the sacrificial layer. Forming the first leg dielectric material on the sidewalls of the openings may include depositing the first leg dielectric layer and performing a spacer etch of the first leg dielectric layer. The etch may also be performed to leave portions of the first leg dielectric layer on portions of the contact structures and/or the bridge structures as desired.

At block 2106, openings may be formed in a dielectric layer of the contact structures and the bridge structures. Forming the openings in the dielectric layer of the contact structures and the bridge structures may expose portions of a metal layer of the contact structures and/or a sensor layer of the bridge structures.

At block 2108, one or more conductive layers such as a leg metal layer may be deposited (e.g., using a blanket metal deposition) and patterned on the first leg dielectric material on the sidewalls of the openings and over at least some of the contact structures and the bridge structures. The leg metal layer may be formed in contact with the exposed portions of the metal layer of the contact structures and the sensor layer of the bridge structures.

At block 2110, a second leg dielectric layer may be deposited and patterned on the metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2112, the sacrificial layer may be removed to release the bridge structures and the vertical leg structures formed from the first and second leg dielectric layers and the leg metal layers so that the bridge and legs are suspended above the readout integrated circuit and the contact structures are coupled to the bridge structures by the vertical leg structures.

Figure 22:
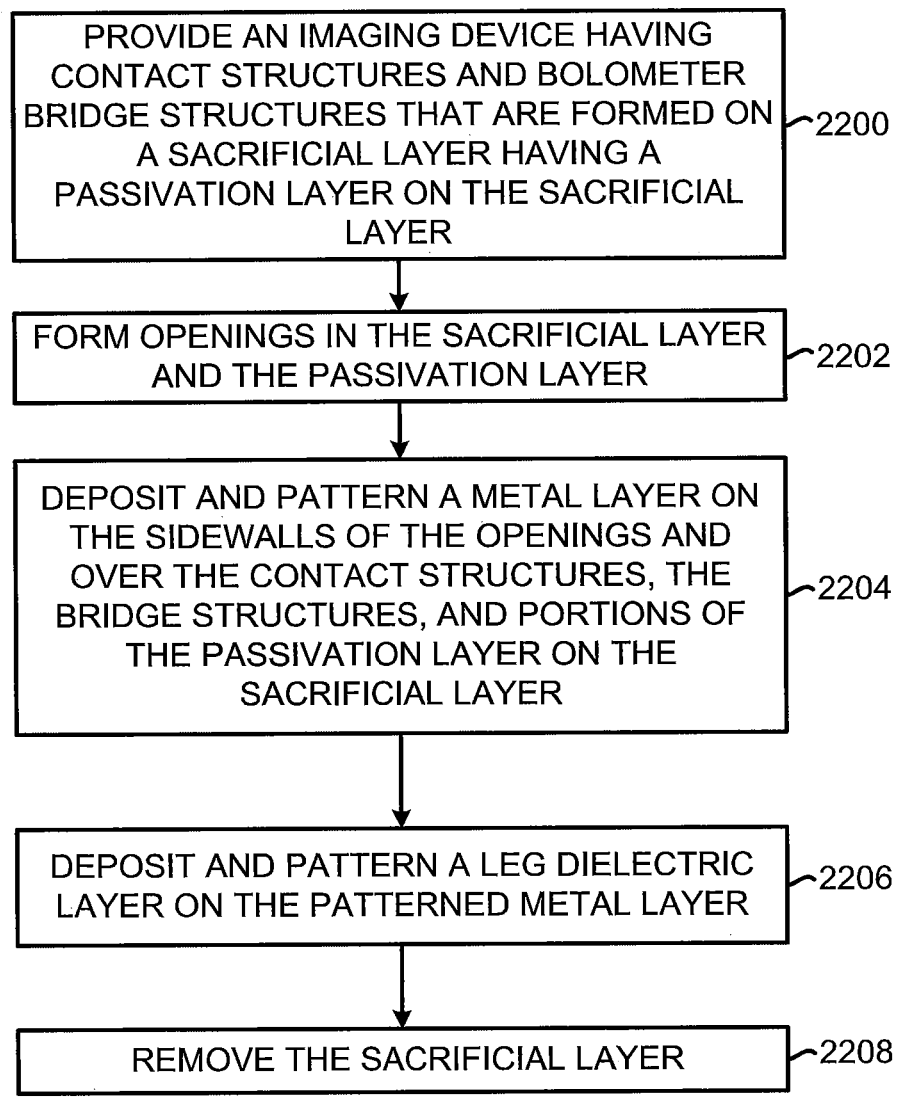
FIG. 22 illustrates yet another flow diagram for manufacturing a vertical leg, such as for the vertical legs of FIG. 3, in accordance with an embodiment.

FIG. 22 is a flowchart of illustrative operations that may be performed for forming vertical microbolometer legs for coupling a microbolometer bridge to a ROIC contact structure according to another embodiment.

At block 2200, an imaging device having contact structures and bolometer bridge structures such as microbolometer bridge structures may be provided. The imaging device may include a partially fabricated focal plane array on which a sacrificial layer such as a polyimide layer is formed on a readout integrated circuit, a passivation layer is formed on at least a portion of the sacrificial layer and the bridge structures are formed on the sacrificial layer. The contact structures may include an electrical contact on the readout integrated circuit and, if desired conductive elements that extend from the electrical contact on the ROIC through some or all of the sacrificial layer. The conductive elements may include a stud or a basket contact and, if desired, one or more additional structures such a portion of the passivation layer, metal layers, and/or dielectric layers formed over the conductive elements.

At block 2202, the sacrificial layer and the passivation layer may be etched to form openings in the sacrificial layer and the passivation layer at least partially between the bridge structures and the contact structures.

At block 2204, one or more conductive layers such as a leg metal layer may be deposited (e.g., using a blanket metal deposition) and patterned on the sidewalls of the openings and over at least some of the contact structures, the bridge structures, and portions of the passivation layer on the sacrificial layer.

At block 2206, a leg dielectric layer may be deposited and patterned on the metal layer.

Patterning the leg dielectric layer may include depositing the leg dielectric layer over the leg metal layer prior to patterning the leg metal layer and performing an in-situ dielectric and metal etch of the leg metal layer and the second leg dielectric layer.

At block 2208, the sacrificial layer may be removed to release the bridge structures and the vertical leg structures formed from portions of the passivation layer, the leg dielectric layer and the leg metal layer so that the bridge and legs are suspended above the readout integrated circuit and the contact structures are coupled to the bridge structures by the vertical leg structures.

The process described above for forming vertical microbolometer legs are merely illustrative. According to various embodiments, vertical legs for a microbolometer array may be formed using other processes. For example, in one embodiment, a process such as the process shown in FIGS. 23A-23F may be performed to form vertical legs using an etch stop layer.

FIGS. 23A-23F show cross sectional side views of a portion of a microbolometer array at various stages during production of microbolometer legs for the microbolometer array.

Figure 23A:
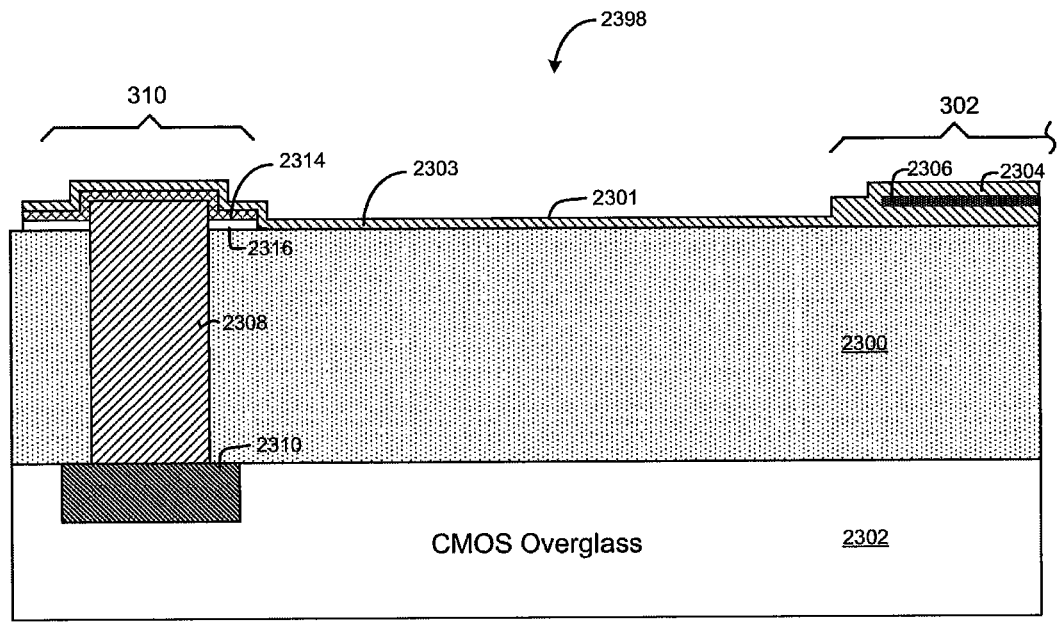
FIGS. 23A through 23F illustrate a processing overview for manufacturing a vertical leg, such as for the vertical legs of FIG. 3 using an etch stop layer, in accordance with an embodiment.

Turning now to FIG. 23A, a portion 2398 of a microbolometer array is shown having a contact 310 and a bridge 302. As shown, bridge 302 includes a sensor layer (e.g., a layer of temperature sensitive resistive material such as VOx) 2306 and one or more additional layers 2304 such as absorber layers. As shown, contact 310 may be formed from a vertical conductive portion such as metal stud 2308 and one or more layers such as a metal contact layer 2314 in contact with metal stud 2308. Contact 310 may include additional layers such as a passivation layer 2316 disposed under portions of metal layer 2314. As shown, an additional layer such as an etch stop layer 2303 (e.g., a layer of dielectric material) may be formed on sacrificial layer 2300 and may extend to form a portion of bridge 302 and/or contact 310.

Sacrificial layer 2300 may be formed from, for example, polyimide. Layers 2303 and 2316 may be formed from, as examples, silicon dioxide or silicon nitride. Metal layer 2314 may be formed from titanium, tungsten, copper, aluminum and/or other known metals.

Metal stud 2308 may be conductively coupled to a conductive contact such as contact 2310 of a substrate such as a readout integrated circuit (ROIC) substrate such as a complementary metal-oxide-semiconductor (CMOS) ROIC. In the example of FIG. 23A, contact 2310 is disposed in an overglass layer 2302 (e.g., a CMOS overglass layer) of the ROIC. Prior to forming vertical legs between the bridge 302 and the contact 310, bridge 302 may be disposed on sacrificial layer 2300 so that sacrificial layer 2300 fills a gap between bridges of the microbolometer array and the ROIC and runs continuously between the bridges and contacts of the microbolometer array.

Figure 23B:
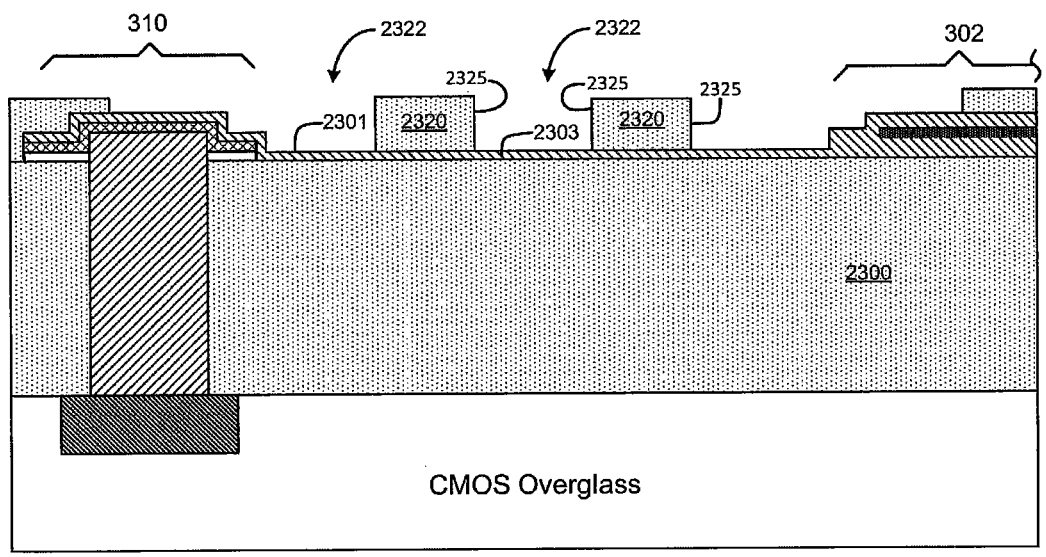

According to one embodiment, a process for forming vertical legs between bridge 302 and contact 310 may include depositing and patterning an additional sacrificial layer 2320 on etch stop layer 2303 as shown in FIG. 23B. Patterning the additional sacrificial layer 2320 may include forming openings 2322 in the additional sacrificial layer (e.g., at least partially between the bridge 302 and the contact 310) so that remaining portions of additional sacrificial layer 2320 have vertical sidewalls 2325. Openings 2322 may extend to the top surface 2301 of etch stop layer 2303.

Figure 23C:
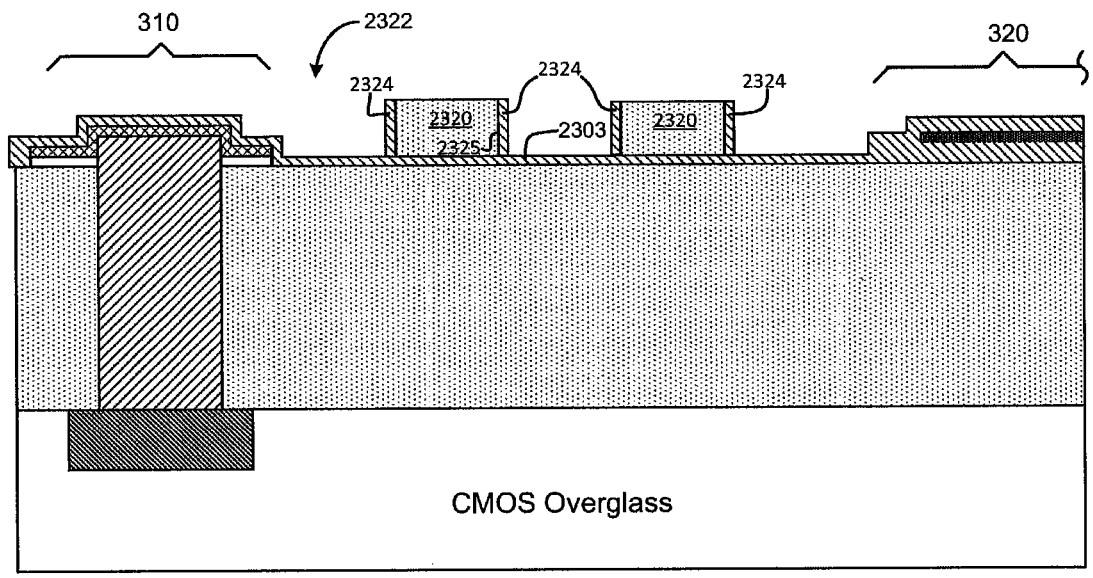
Figure 23D:
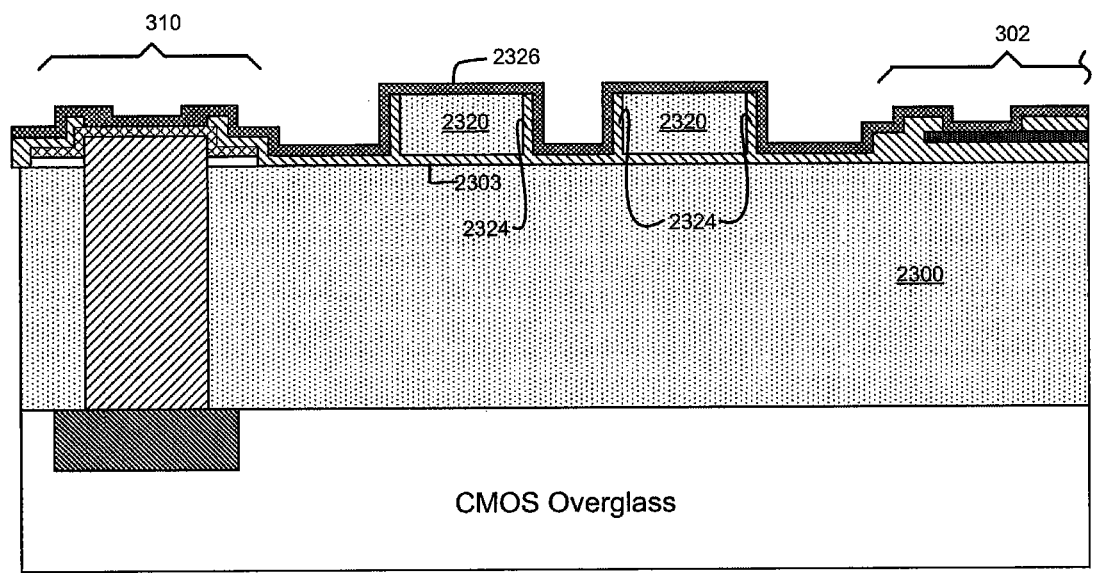

Following the deposition and patterning of additional sacrificial layer 2320, a dielectric layer 2324 may be deposited and patterned so that portions of the dielectric layer 2324 remain on sidewalls 2325 of additional sacrificial layer 2320 in openings 2322 as shown in FIG. 23C. A metal layer such as a leg metal layer 2326 may then be deposited over contact 310, portions of etch stop layer 2303, dielectric layer 2324 on sidewalls 2325, portions of additional sacrificial layer 2320, and bridge 302 as shown in FIG. 23D. If desired, openings may be formed in portions of etch stop layer 2303 that are disposed over contact 310 and bridge 302 to expose portions of metal layer 2314 and sensor layer 2306 so that metal layer 2326 can be deposited in contact with metal layer 2314 and sensor layer 2306. Metal layer 2326 may be deposited in a blanket deposition process.

Figure 23E:
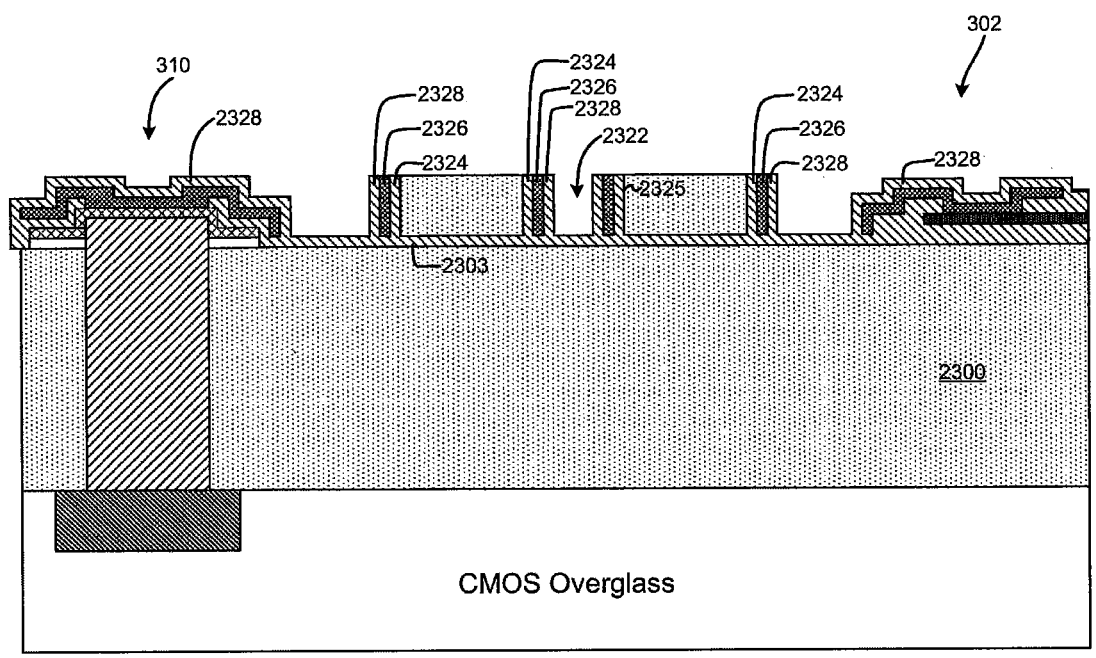

As shown in FIG. 23E, an additional dielectric layer 2328 may be deposited over metal layer 2326 and then metal layer 2326 and additional dielectric layer 2328 may be etched (e.g., in a masked spacer etch process) to remove portions of metal layer 2326 and additional dielectric layer 2328 from etch stop layer 2303 and additional sacrificial layer 2320. In this way, a dielectric-metal-dielectric stack may be formed vertically on sidewalls 2325 of openings 2322. Portions of the dielectric-metal-dielectric stack that are continuously coupled with the portions on sidewalls 2325 may also remain on contact 310 and bridge 302, thereby forming bridge contact 306 and a leg metal contact with metal layer 2314 of contact 310.

Dielectric layers 2324 and 2328 may be formed from, as examples, silicon dioxide or a silicon nitride. Metal layer 2326 may be a single metal layer formed form a homogeneous film of a single material or may include multiple materials (e.g., multiple layers of the same or different materials formed in multiple deposition operations). For example, metal layer 2326 may be formed from titanium, tungsten, copper, aluminum and/or other known metals.

Figure 23F:
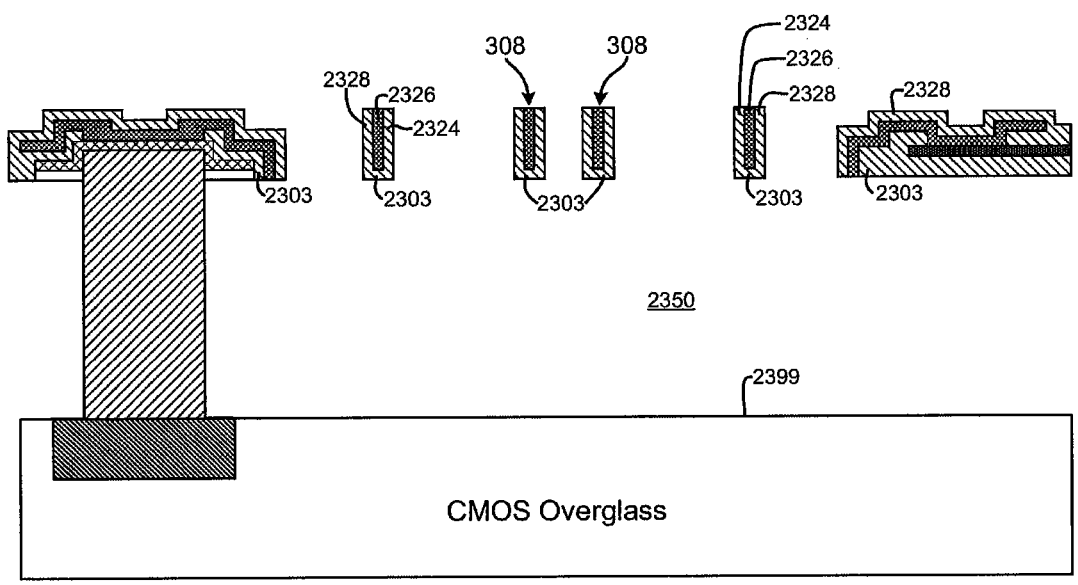

As shown in FIG. 23F, sacrificial layers 2300 and 2320 and portions of etch stop layer 2303 may then be removed to release bridge 302 and vertical legs 308 which remain suspended above the ROIC with a space 2350 interposed between the vertical legs and the ROIC. Vertical legs 308 of FIG. 23F may include at least a portion that runs non-perpendicularly to a plane defined by the surface 2399 of substrate 2302. For example, vertical legs 308 may run along a path that is parallel to the surface 2399. In another example, vertical legs 308 may run along a path that includes a portion that is parallel to surface 2399 and an additional portion that bends downward toward surface 2399 at anon-perpendicular angle.

Figure 24:
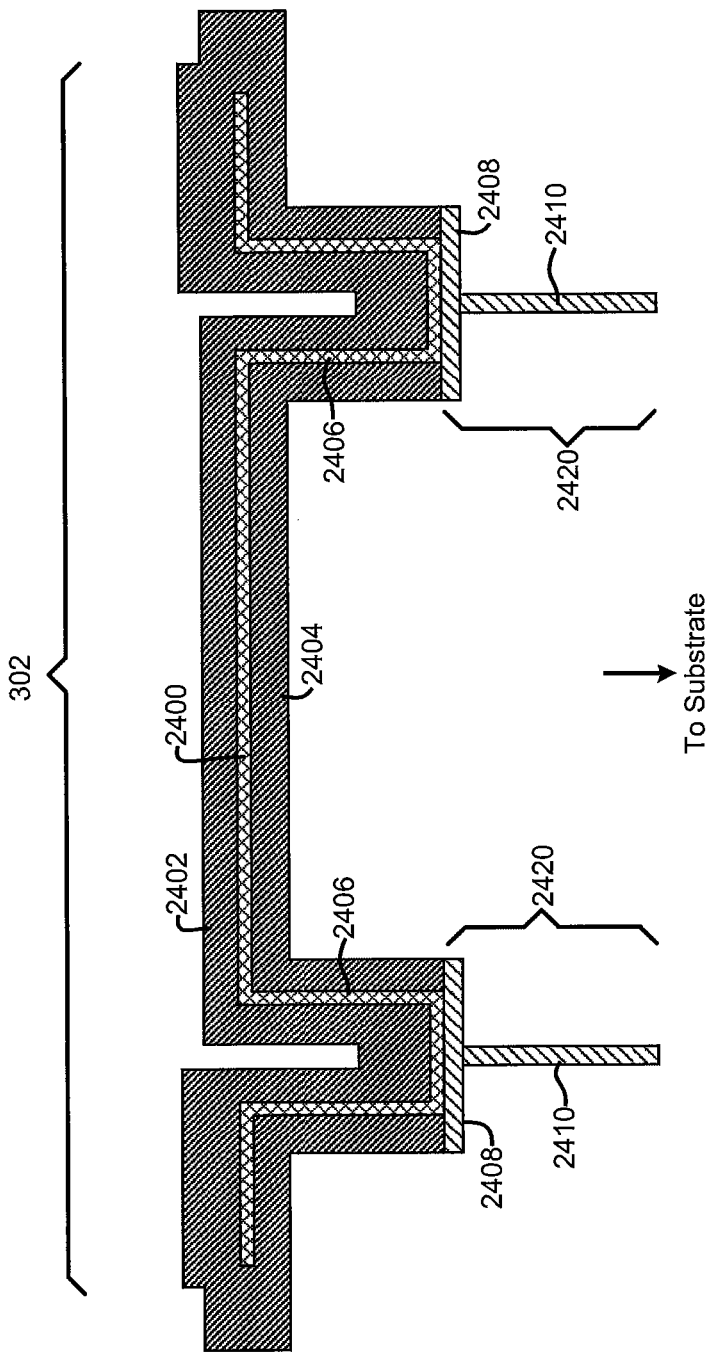
FIG. 24 shows a cross-sectional view of a portion of a focal plane array having legs, such as legs for an infrared detector, that are formed at least partially beneath a bridge portion of the infrared detector, in accordance with an embodiment.

FIG. 24 shows a cross-sectional side view of a microbolometer bridge that is coupled to legs formed beneath the bridge, according to an embodiment. In the example of FIG. 24, bridge 302 includes a sensor layer 2400 formed substantially between bridge dielectric layers 2402 and 2404. Sensor layer 240 (e.g., a temperature sensitive resistive material, such as VOx) may include one or more horizontal portions that extend in a plane that is parallel to the surface of a substrate over which bridge 302 is formed and may include portions 2406 that extend downward from the horizontal portions in the direction of the substrate (e.g., perpendicularly to the surface of the substrate. Portions 2406 may extend to contact one or more legs such as legs 2420 formed beneath the bridge 302 (e.g., disposed at least partially between bridge 302 and the substrate over which the bridge is disposed).

As shown in FIG. 24, legs 2420 are formed form a conductive material having a horizontal portion 2408 in contact with sensor layer 2306 and a vertical portion 2410 that extends perpendicularly to horizontal portion 2408. However, this is merely illustrative. In various embodiments, legs 2420 may include vertical and/or horizontal portions and/or may be covered partially or completely in an insulating material as in, for example, any of the examples described herein.

Figure 25:
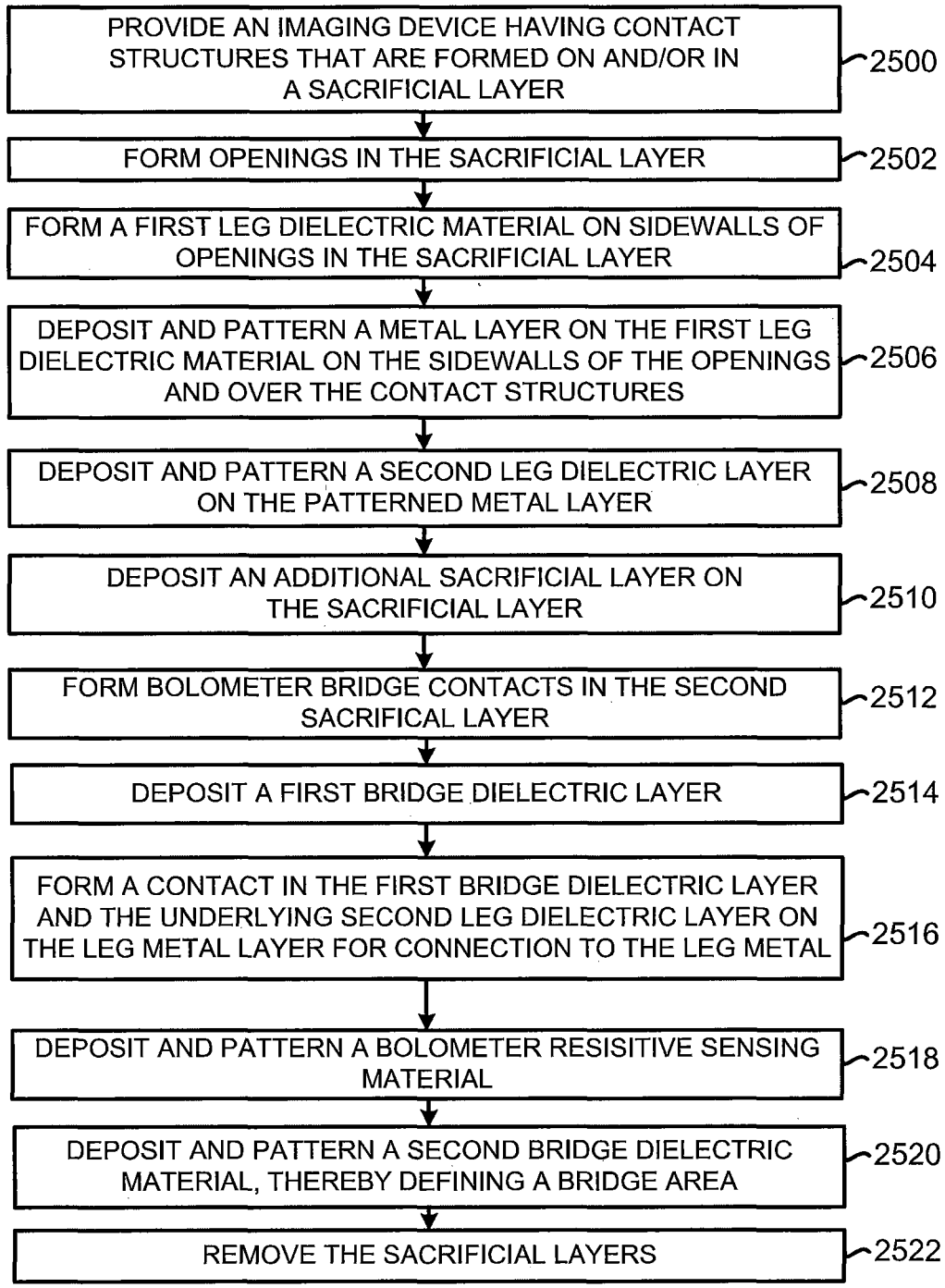
FIG. 25 illustrates a flow diagram for manufacturing a focal plane array having legs, such as legs for an infrared detector, that are formed at least partially beneath a bridge portion of the infrared detector, in accordance with an embodiment.

Illustrative operations that may be performed to form a bridge of the type shown in FIG. 24 are shown in FIG. 25.

At block 2500, an imaging device having contact structures that are formed on and/or in a sacrificial layer may be provided. The imaging device may include a partially fabricated focal plane array on which a sacrificial layer such as a polyimide layer is formed on a substrate such as a readout integrated circuit substrate. The contact structures may include an electrical contact on the substrate and, if desired conductive elements that extend from the electrical contact on the ROIC through some or all of the sacrificial layer. The conductive elements may include a stud or a basket contact and, if desired, one or more additional structures such as passivation layers, metal layers, and/or dielectric layers formed over the conductive elements.

At block 2502, openings may be formed in the sacrificial layer.

At block 2504, a first leg dielectric material may be formed at least on sidewalls of the openings in the sacrificial layer. Forming the first leg dielectric material on the sidewalls of the openings may include depositing the first leg dielectric layer and performing a spacer etch of the first leg dielectric layer.

At block 2506, one or more conductive layers such as a leg metal layer may be deposited (e.g., using a blanket metal deposition) and patterned on the first leg dielectric material that is on the sidewalls of the openings and over at least some of the contact structures. The leg metal layer may be formed in contact with a metal layer of the contact structures.

At block 2508, a second leg dielectric layer may be deposited and patterned on the leg metal layer. Patterning the second leg dielectric layer may include depositing the second leg dielectric layer over the leg metal layer prior to patterning the leg metal layer and performing an in-situ dielectric and metal etch of the leg metal layer and the second leg dielectric layer.

At block 2510, an additional sacrificial layer may be deposited on the sacrificial layer.

At block 2512, one or more bolometer bridge contacts may be formed in the second sacrificial layer.

At block 2514, a first bridge dielectric layer may be deposited.

At block 2516, one or more contacts may be formed in the first bridge dielectric layer and the underlying second leg dielectric layer on the leg metal layer for connection to the leg metal layer.

At block 2518, a bolometer resistive sensing material (e.g., a temperature sensitive resistive material such as VOx) may be deposited and patterned to form sensor layers of the bolometer bridges.

At block 2520, as second bridge dielectric material may be deposited and patterned, thereby defining a bridge area of each microbolometer formed over at least portions of the underlying leg materials.

At block 2522, the sacrificial layer and the additional sacrificial layer may be removed to release the bridge structures and the vertical leg structures so that the bridge and legs that are formed beneath the bridge are suspended above the substrate and the contact structures are coupled to the bridge structures by the vertical leg structures.

Figure 26:
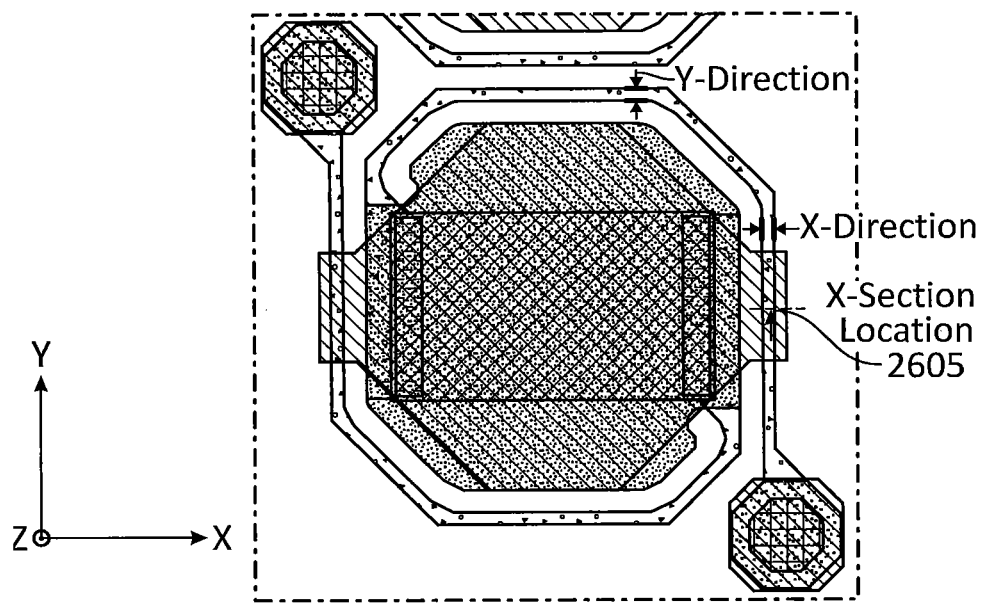
FIG. 26 shows a top-down view of a bolometer.
Figure 27:
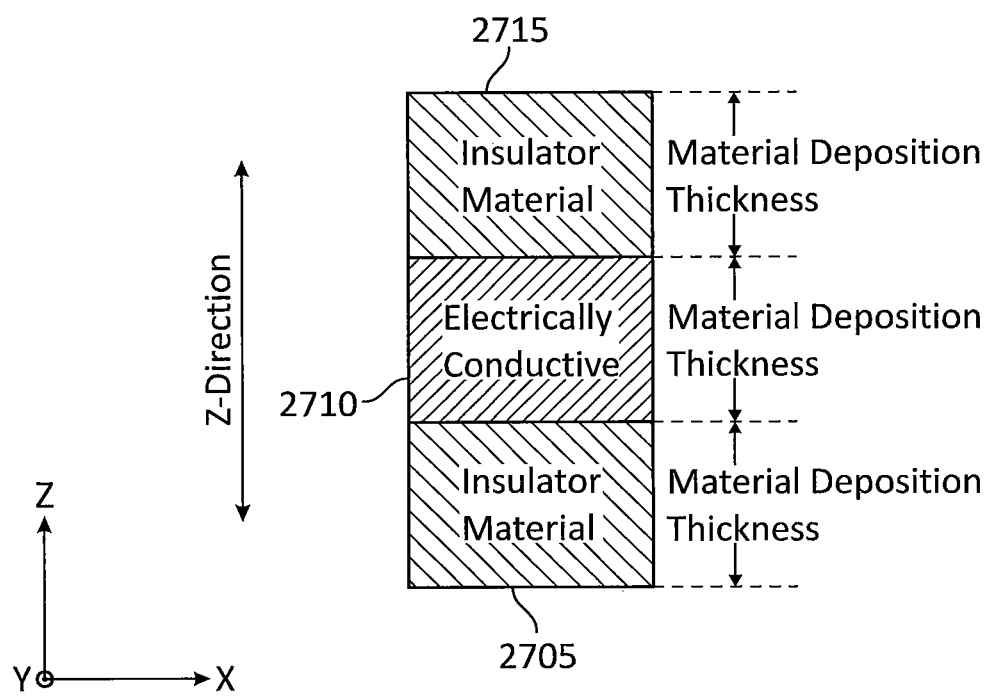
FIG. 27 shows a cross-section of a leg of the bolometer of FIG. 26.

In conventional approaches to manufacturing bolometers, patterning occurred along the x- and y-dimensions and a material thickness was deposited as a sheet film in the z-dimension. The sheet film controlled a thickness of a device in the z-dimension. FIG. 26 shows a top-down view of a bolometer. FIG. 27 shows a cross-section of a leg along a line 2605 of FIG. 26. In particular, the cross-section is a cut along the line 2605 in the x-direction (e.g., horizontal width direction) and looking in the y-direction (e.g., in the direction of the leg length). The leg includes an insulator material 2705, an electrically conductive layer 2710 disposed on the insulator material 2705, and an insulator material 2715 disposed on the electrically conductive layer 2710. The insulator material 2705, the electrically conductive layer 2710, and the insulator material 2715 are disposed one on top of the other along the z-dimension. It is noted that FIG. 27 shows an example in which a material deposition thickness (MDT) is around the same for the insulator material 2705, the electrically conductive layer 2710, and the insulator material 2715.

However, the MDTs need not be the same between these materials/layers.

As pixel sizes decrease, an amount of area in the x- and y-direction is reduced. To increase sensitivity, a thickness of bolometer materials is also reduced. Such reduction in the thickness of the bolometer materials is associated with a corresponding reduction in an amount of structural support the bolometer has built into it. To add rigidity to a bolometer of such a reduced size, a vertical component may be added to the bolometer structure.

Figure 28:
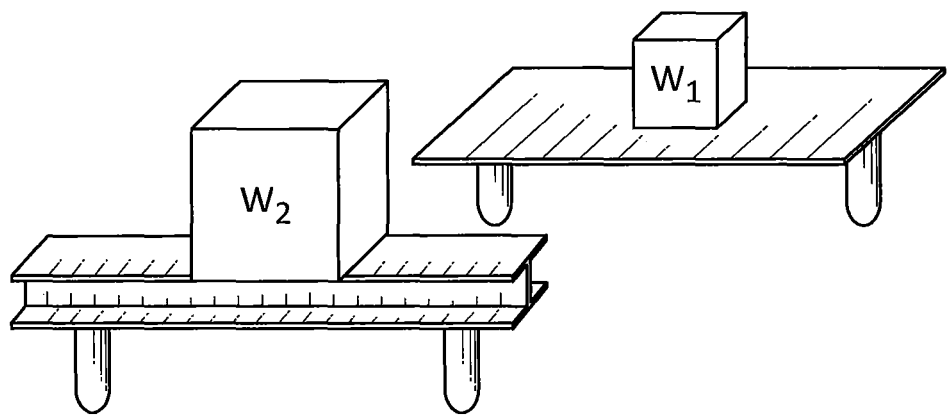
FIG. 28 shows rigidity provided by a vertical component.

FIG. 28 shows rigidity provided by a vertical component as an example. A flat piece of metal may have a total mass of M. If this flat piece of metal is supported at both ends, the flat piece of metal can support an amount of weight $W_1$. If that same metal having a total mass of M is formed into an I-beam structure or some other similar structure having a vertical component, the metal can hold a weight $W_2$ larger than the weight $W_1$.

With smaller pixels, material thicknesses are reduced to support a desired performance. As materials are thinned, rigidity diminishes until legs of the bolometer are unable to support a mass of the bolometer absent introduction of a vertical component added into the legs to add rigidity/support to the pixel. In a vertical leg design, material thickness may control more than the z-dimension. Variation in the height of the vertical component in the leg impacts thermal and electrical properties of the leg. Such impacts to the thermal and electrical properties may have an impact to the performance of the bolometer.

Figure 29:
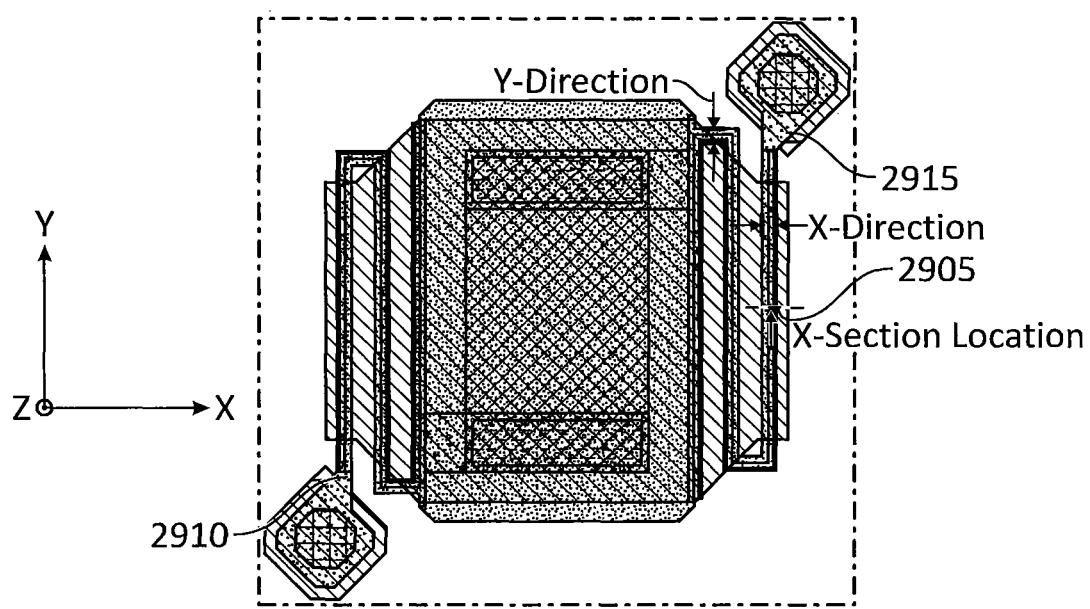
FIG. 29 shows a top-down view of a bolometer having vertical legs in accordance with an embodiment.

FIG. 29 shows a top-down view of a microbolometer array having vertical legs in accordance with an embodiment. FIG. 30A shows a cross-section of a leg along a line 2905 of FIG. 29. In particular, the cross-section is a cut along the line 2905 in the x-direction (e.g., horizontal width direction) and looking in the y-direction (e.g., in the direction of the leg length). The leg has a z-shaped cross-section (e.g., also considered an s-shaped cross-section). The leg includes an insulator material 3005, an electrically conductive layer 3010 disposed on the insulator material 3005, and an insulator material 3015 disposed on the electrically conductive layer 3010. The insulator material 3005, the electrically conductive layer 3010, and the insulator material 3015 are disposed one on top of the other along the z-dimension. The z-shaped cross-section provides a path from a bridge to a contact. The contact may be a contact of a substrate. Portions 2910 and 2915 of the bolometer show regions of transition from corresponding legs to corresponding contacts. It is noted that FIG. 30A shows an example in which an MDT is around the same for the insulator material 3005, the electrically conductive layer 3010, and the insulator material 3015. However, the MDTs need not be the same between these materials/layers.

As shown with respect to FIG. 30A, a serpentine-shaped cross-section of the leg has a first section (e.g., left-side section or lower section), a second section (e.g., right-side section or upper section) substantially parallel to the first section, and a third section (e.g., middle section) joining the first section and the second section. To couple the bridge to the contact of the substrate, the leg may extend between the bridge and the contact in a first direction (e.g., x-direction) and/or a second direction (e.g., y-direction) substantially parallel to a plane of the substrate. The serpentine-shaped cross section (e.g., s-shaped or z-shaped) is maintained along the x- and/or y-directions. In this regard, the first section and the second section extend along the first direction and/or second direction substantially parallel to the plane. The third section joins the first and second sections in a third direction (e.g., z-direction) that is substantially perpendicular to the plane.

With regard to the particular cross-section shown in FIG. 30A of the leg, the leg has a segment 3020 associated with the first section, a segment 3025 associated with the second section, and a segment 3030 associated with the third section. The segment 3030 is adjacent to the segment 3020 and the segment 3025. Each of the segments 3020, 3025, and 3030 has a first dimension (e.g., width) that extends in the x-direction substantially parallel to the plane of the surface of the substrate and a second dimension (e.g., height) that extends in the z-direction substantially perpendicular to the plane. For the segments 3020 and 3025, the first dimension is greater than the second dimension. For the segment 3030, the first dimension is less than the second dimension. Each of the segments 3020, 3025, and 3030 has a respective portion of the insulator material 3005, a respective portion of the electrically conductive layer 3010, and a respective portion of the insulator material 3015. The insulator material 3005 is formed on a first sidewall of the electrically conductive layer 3010 and a first side of the electrically conductive layer 3010. The insulator material 3015 is formed on a second sidewall of the electrically conductive layer 3010 and a second side of the electrically conductive layer 3010. The first sidewall is opposite the second sidewall. The first sidewall is substantially perpendicular to the first side. The first side is opposite the second side. In some aspects, two segments/sections/portions may be referred to as being substantially perpendicular if an angle between the segments/sections/portions is within ±10° of 90°. In some aspects, two segments/sections/portions may be referred to as being substantially parallel if an angle between the segments/sections/portions is within ±10° of 0°.

Various approaches may be utilized to define a vertical component of a leg. Each approach is associated with a complexity, variability, and material (e.g., which affects performance). Deposited films may have desirable uniformities across a wafer and have small variations from run to run (e.g., wafer to wafer). In this manner, a deposited film may be utilized to control a vertical component. In an aspect, a bolometer may include a deposited film of conductive material (e.g., metal) and a deposited film of non-conductive material (e.g., insulator). Dry etches associated with conventional CMOS processing may be utilized to selectively remove one type of film to another (e.g., a metal can be removed where it is not protected by an insulator). For instance, an insulator is an etch stop for a metal etch, and a metal is an etch stop for an insulator etch. A leg may have an insulator and/or a metal left on the leg after etching, which affects bolometer performance.

In some aspects, a z-height of the leg may be reduced (e.g., relative to that shown in FIG. 30A) while creating additional rigidity for the bolometer. FIG. 30B illustrates a cross-section of a leg having a height smaller than that of the leg of FIG. 30A, in accordance with an embodiment. The leg of FIG. 30B has a segment 3035 (e.g., associated with a first section), a segment 3040 (e.g., associated with a second section), and a segment 3045 (e.g., associated with a third section). In an aspect, the segments 3035, 3040, and 3045 may be considered as corresponding to the segments 3020, 3025, and 3030, respectively, of the leg of FIG. 30A. In some cases, control of the height across the wafer may be more relevant than an actual average of the z-dimension given that the z-dimension exceeds a desired threshold to meet a minimum rigidity for the bolometer, depending on the specific implementation.

While the third section is substantially perpendicular to the first section and the second section in FIGS. 30A and 30B, in various embodiments the third section is at an angle (e.g., nominally at an angle) relative to the first and second sections. In this regard, such a third section is slanted compared to the third section shown in FIGS. 30A and 30B. FIG. 31 illustrates an example cross-section of a leg 3100 having a slanted section in accordance with one or more embodiments. The cross-section of the leg 3100 has a first section, a second section substantially parallel to the first section, and a third section that is slanted and joins the first and second sections. With regard to the particular cross-section shown in FIG. 31 of the leg 3100, the leg 3100 has a segment 3105 associated with the first section, a segment 3110 associated with the second section, and a segment 3115 associated with the third section. The segment 3115 is at around 45° relative to a horizontal axis (e.g., left and right direction) associated with the segments 3105 and 3110. In other examples of leg structures, the middle section may be at a different angle from that shown in FIGS. 30A-30B (e.g., substantially perpendicular to its adjacent sections) and FIG. 31 (e.g., at around 45° relative to its adjacent sections). By way of non-limiting examples, the middle section may be at an angle between around 30° to 60° relative to the horizontal axis associated with the segments 3105 and/or 3110.

The leg 3100 has a dielectric layer 3120, a dielectric layer 3125 disposed on the dielectric layer 3120, a leg metal layer 3130 disposed on the dielectric layer 3125, and a dielectric layer 3135 disposed on the leg metal layer 3130. In this regard, the leg metal layer 3130 is surrounded on at least two opposite sides by the dielectric layers 3135 and 3125. The leg 3100 has a tail 3140 of the dielectric layer 3120. A gap 3145 is between the tail 3140 and a side of the dielectric layer 3125, such that the tail 3140 faces the dielectric layer 3125. In an aspect, the tail 3140 may be formed due to etching operations performed to form the leg 3100.

In one or more embodiments, leg manufacturing processes may include, or may be based on, directed self-assembly (DSA) (e.g., polymer-based), oxide patterning, and/or others. Each process has several variations. Different processes may be associated with different process complexity, exposure resolution, overlay, etc. In some aspects, each process has device feature order variation. For instance, legs, contact, and bridge can potentially be processed in any order. Each device feature order is associated with its set of tradeoffs (e.g., complexity, cost, etc.). In some aspects, various paths/options for facilitating vertical leg manufacture may allow for processing of the legs separate from a bridge. In some cases, leg materials can be independent (e.g., completely independent) from the bridge. In some cases, some leg materials are on the bridge (e.g., in contact with the bridge). Higher independence between the legs and the bridge is generally associated with a more complex process.

Figure 32:
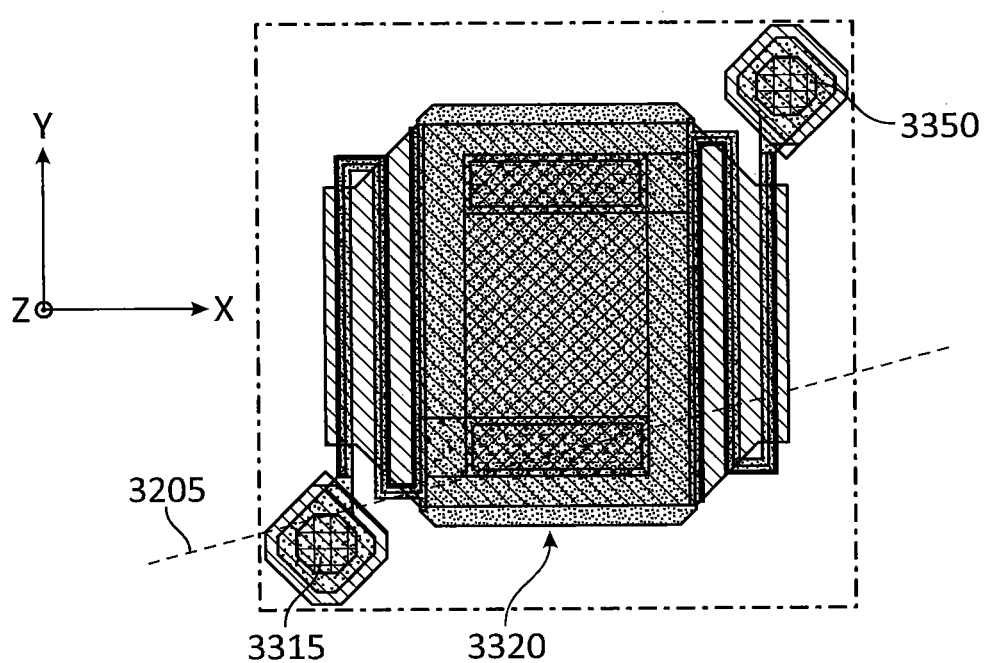
FIG. 32 shows a top-down view of a bolometer having a bridge, vertical legs, and contacts, in which an oxide approach is utilized to manufacture the bolometer, in accordance with an embodiment.
Figure 33:
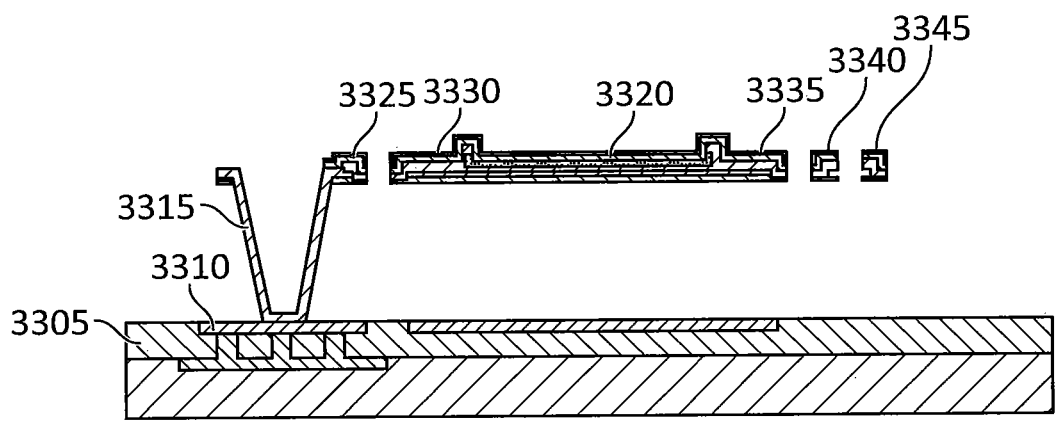
FIG. 33 shows a cross-section of a leg of FIG. 32 in accordance with an embodiment.

As an example, FIG. 32 shows a top-down view of a bolometer having a bridge 3320, vertical legs, and contacts 3315 and 3350, in which an oxide approach is utilized to manufacture the bolometer, in accordance with an embodiment. In some cases, the oxide approach may be associated with lower process complexity than a DSA approach. The oxide approach may facilitate model correlation/feedback. FIG. 33 shows a cross-section of a leg along a line 3205 of FIG. 32. The bolometer includes a substrate 3305, a pad 3310, the contact 3315 (e.g., a basket contact, a stud contact), the bridge 3320, and portions 3325, 3330, 3335, 3340, and 3345 of a leg, and the contact 3350. The portions 3325 and 3330 provide a path between the contact 3315 and the bridge 3320, with the portion 3330 of the leg transitioning to the bridge 3320. The portions 3335, 3340, and 3345 provide a path between the contact 3350 and the bridge 3320. The portion 3335 transitions to the bridge 3320.

Figure 34:
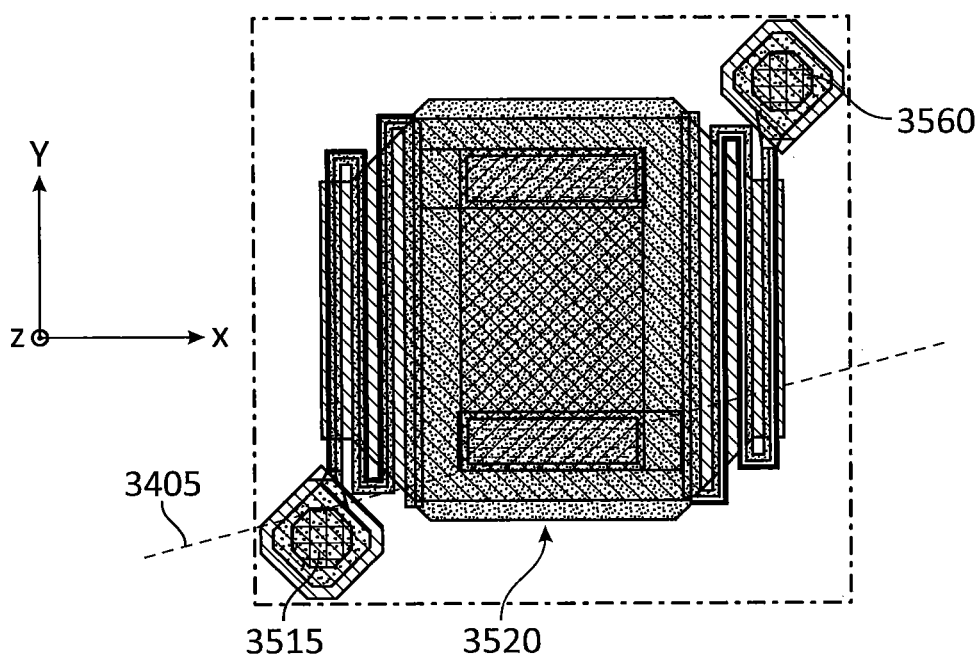
FIG. 34 shows a top-down view of a bolometer having a bridge, vertical legs, and contacts, in which a directed self-assembly approach is utilized to manufacture the bolometer, in accordance with an embodiment.
Figure 35:
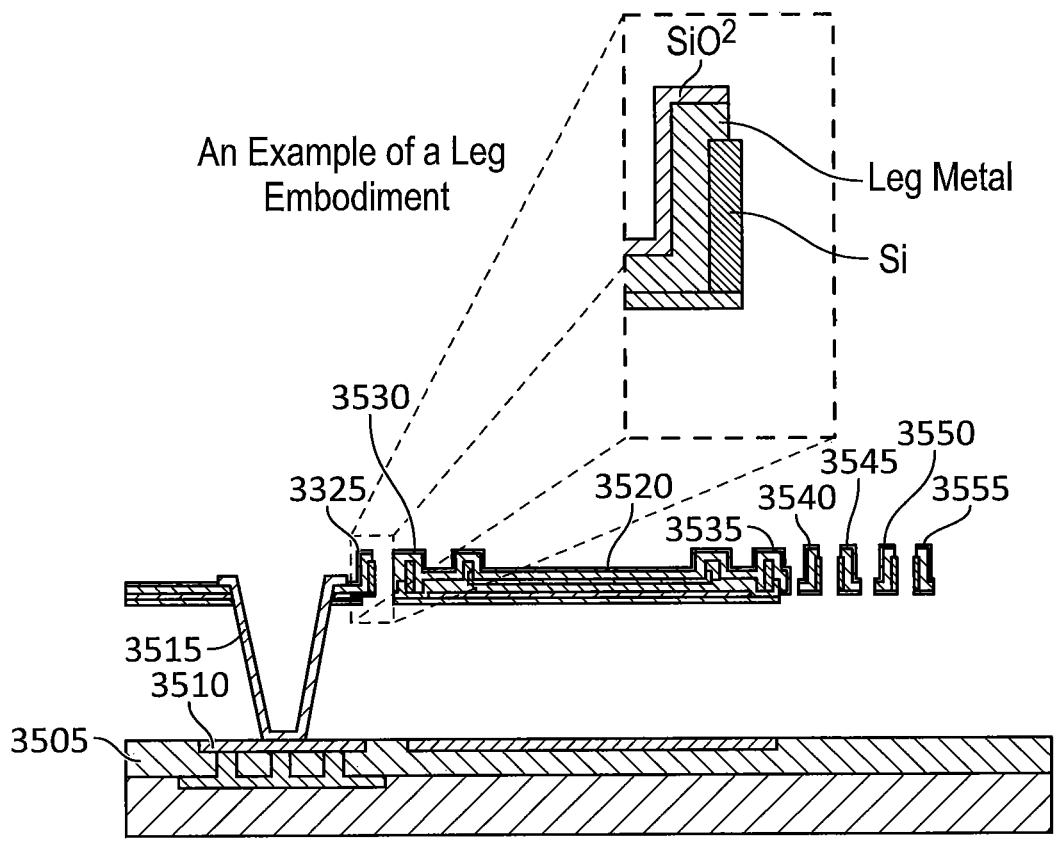
FIG. 35 shows a cross-section of a leg of FIG. 34 in accordance with an embodiment.

As another example, FIG. 34 shows a top-down view of a bolometer having a bridge 3520, vertical legs, and contacts 3515 and 3560, in which a DSA approach is utilized to manufacture the bolometer, in accordance with an embodiment. FIG. 35 shows a cross-section of a leg along a line 3405 of FIG. 34 in accordance with an embodiment. The bolometer includes a substrate 3505, a pad 3510, the contact 3515 (e.g., a basket contact), the bridge 3520, portions 3525, 3530, 3535, 3540, 3545, 3550, and 3555 of a leg, and the contact 3560. The portions 3525 and 3530 provide a path between the contact 3515 and the bridge 3520, with the portion 3530 of the leg transitioning to the bridge 3320. The portions 3535, 3540, 3545, 3550, and 3555 provide a path between the contact 3560 and the bridge 3520. The portion 3535 transitions to the bridge 3520. A zoomed-in view of a portion of the leg is shown in FIG. 35. The leg includes a vertically stacked arrangement of a $SiO_2$, a leg metal, and Si. A portion of the $SiO_2$ is disposed on the leg metal. A portion of the $SiO_2$ is below the leg metal and the Si. Such materials are provided by way of non-limiting examples.

Figure 36A:
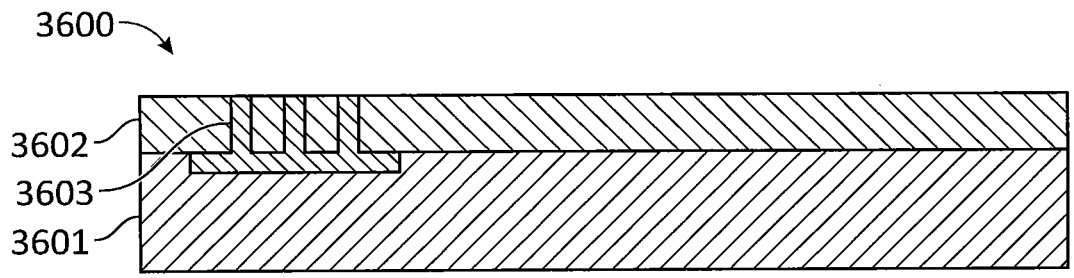
FIGS. 36A through 36N illustrate cross-sectional side views associated with an example process for forming a bolometer in accordance with an embodiment.
Figure 36B:
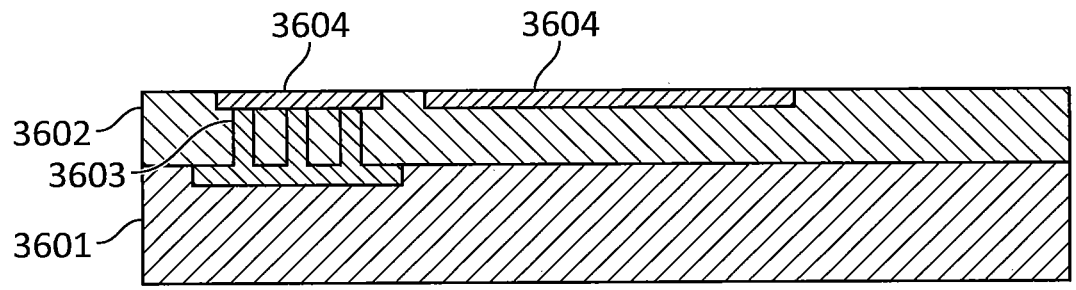
Figure 36C:
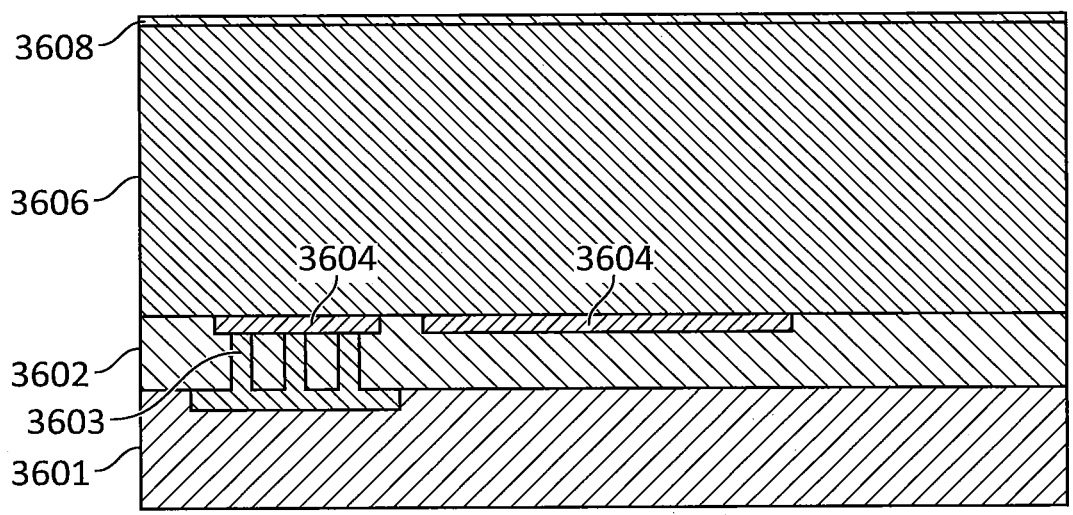
Figure 36D:
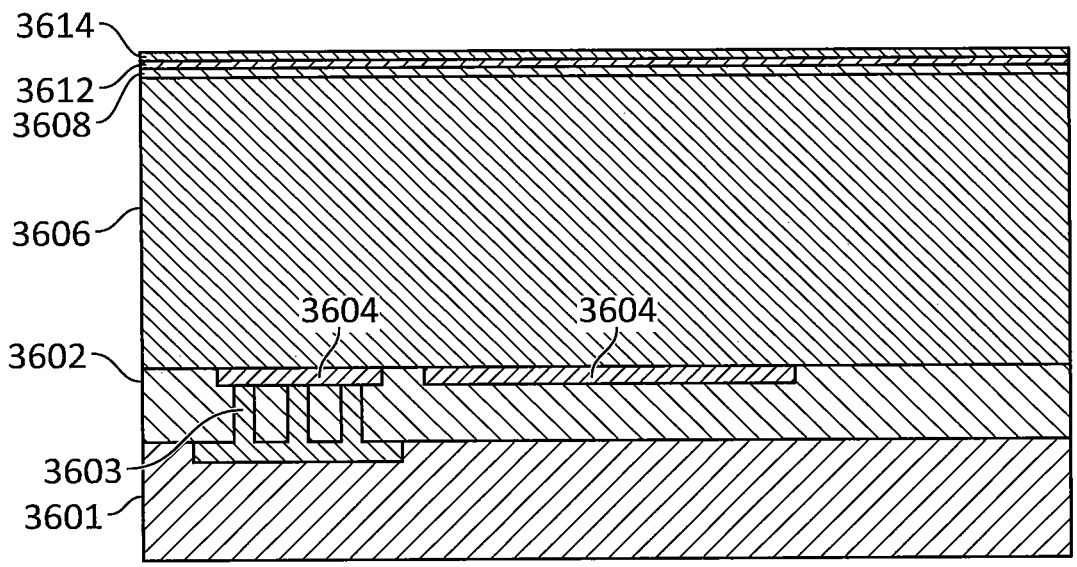
Figure 36E:
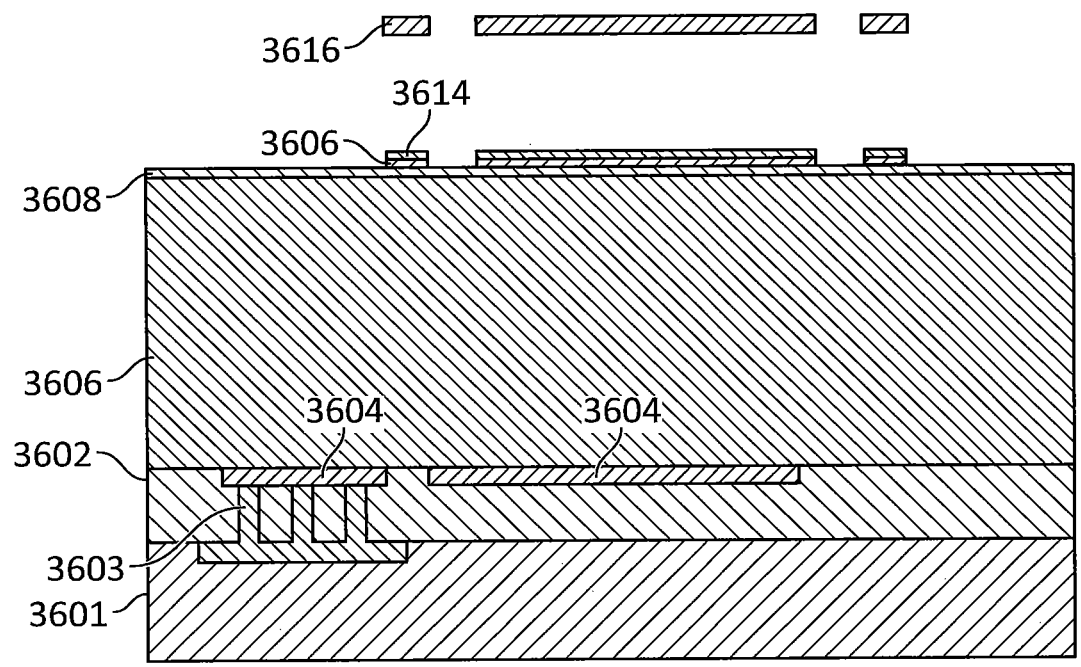
Figure 36F:
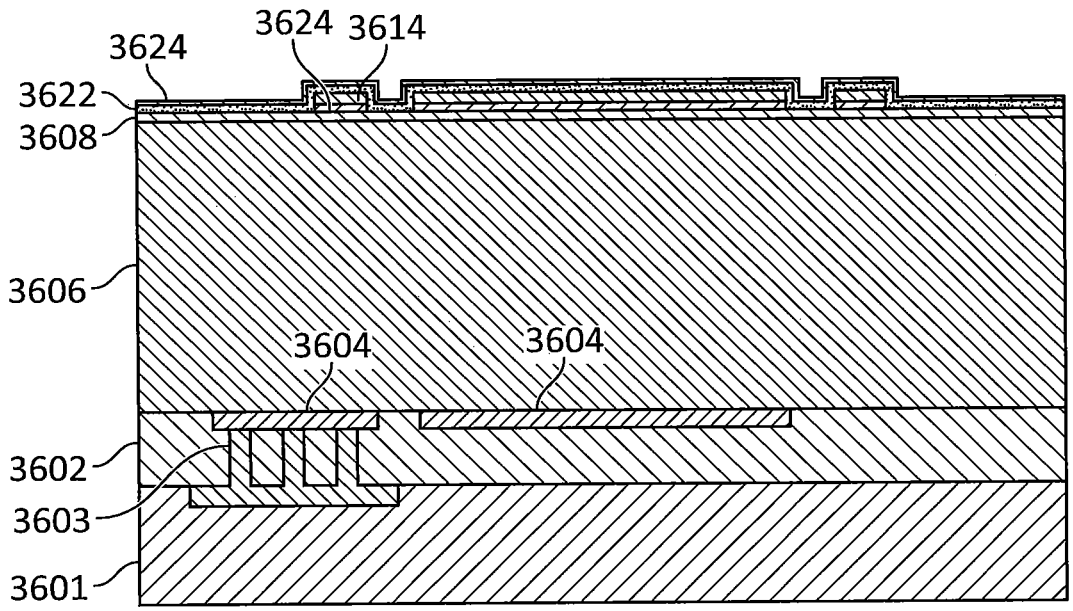
Figure 36G:
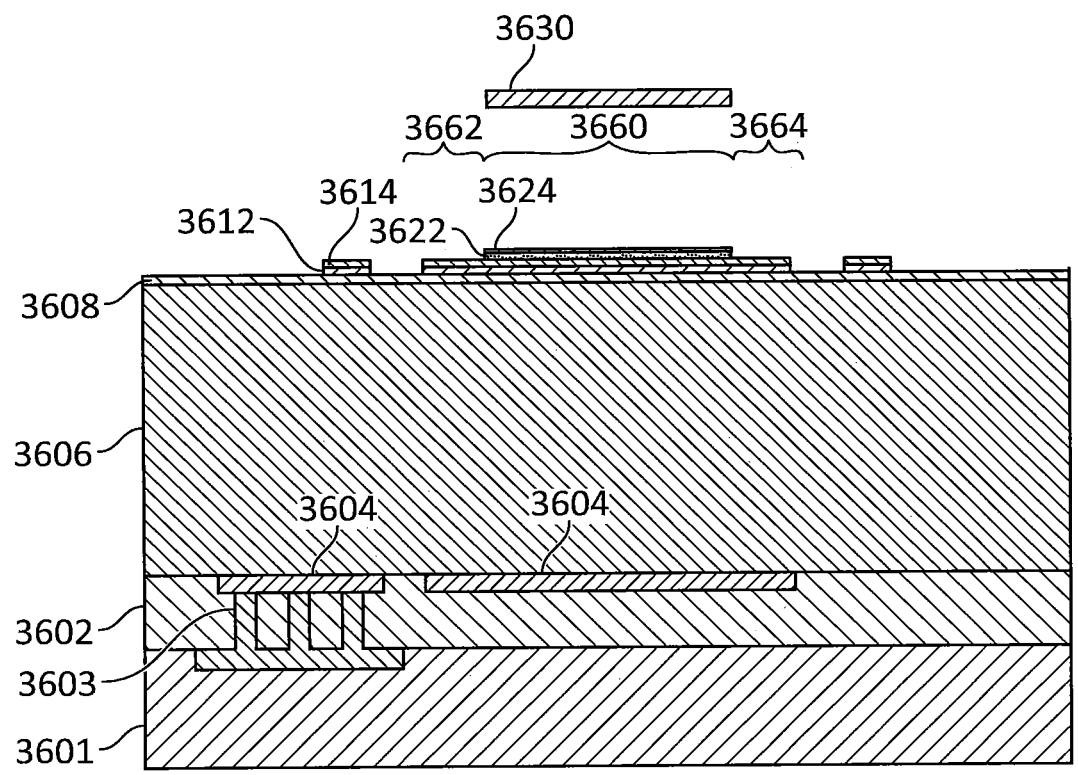
Figure 36H:
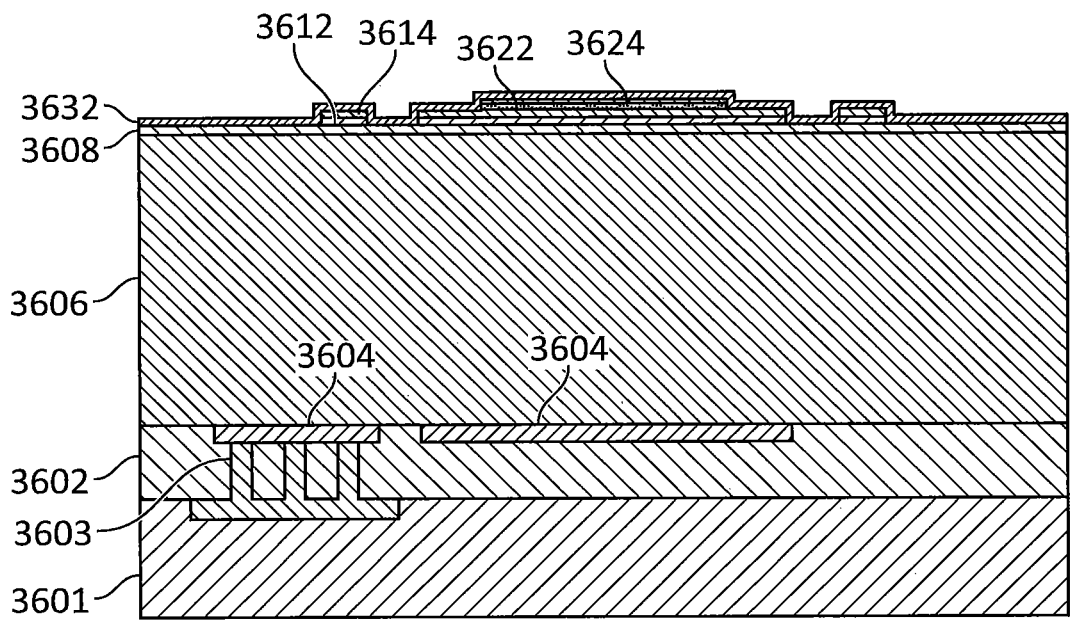
Figure 36I:
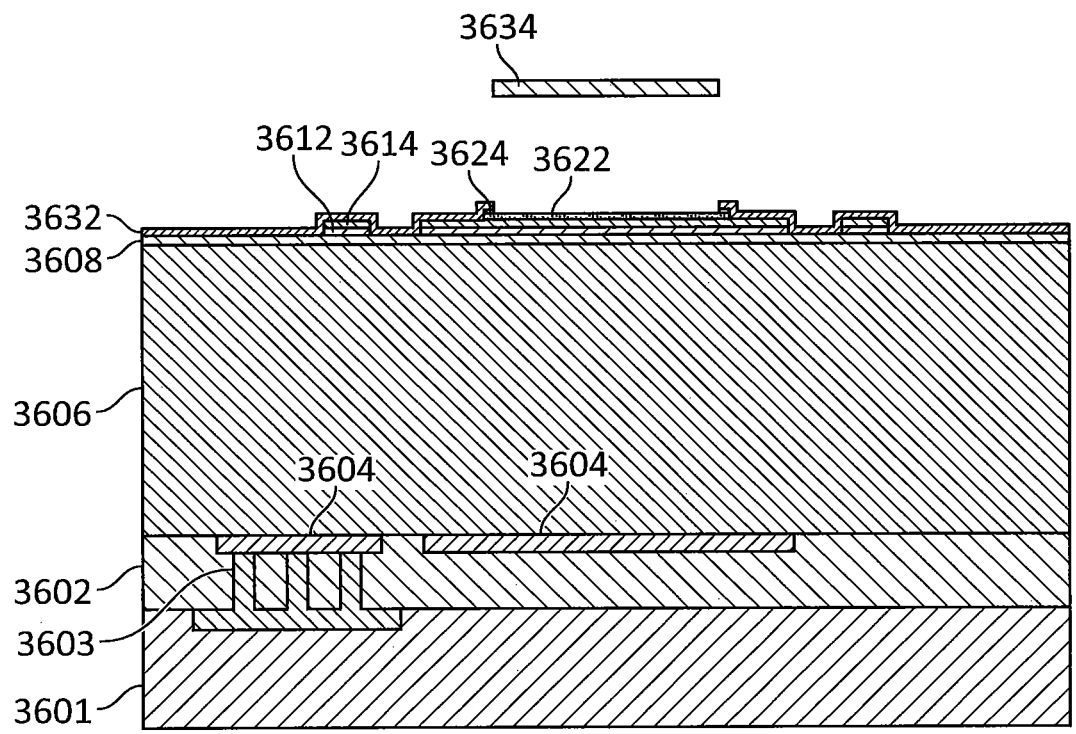
Figure 36J:
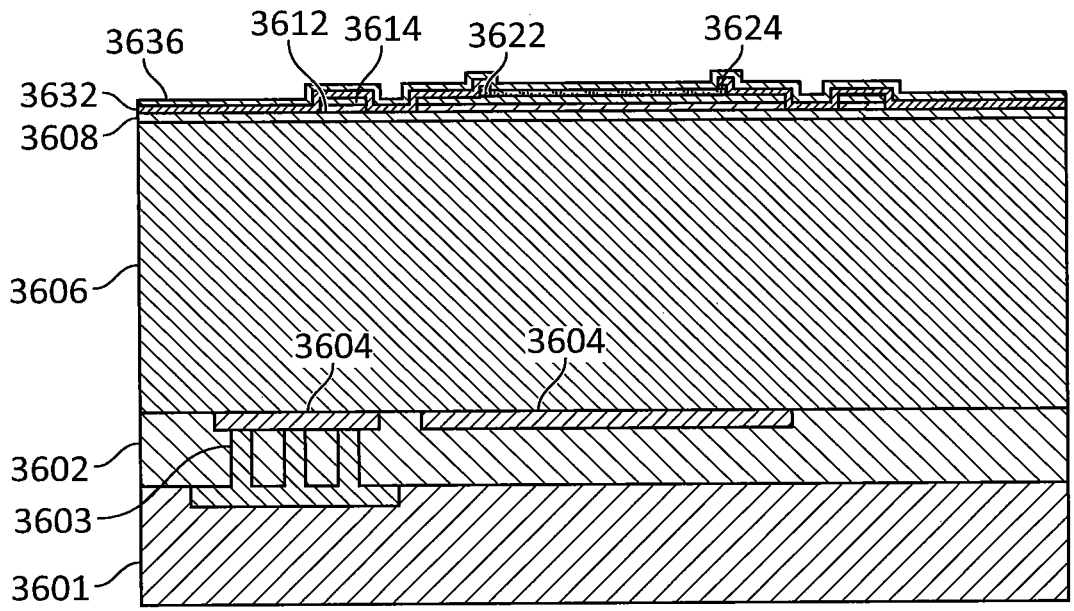
Figure 36K:
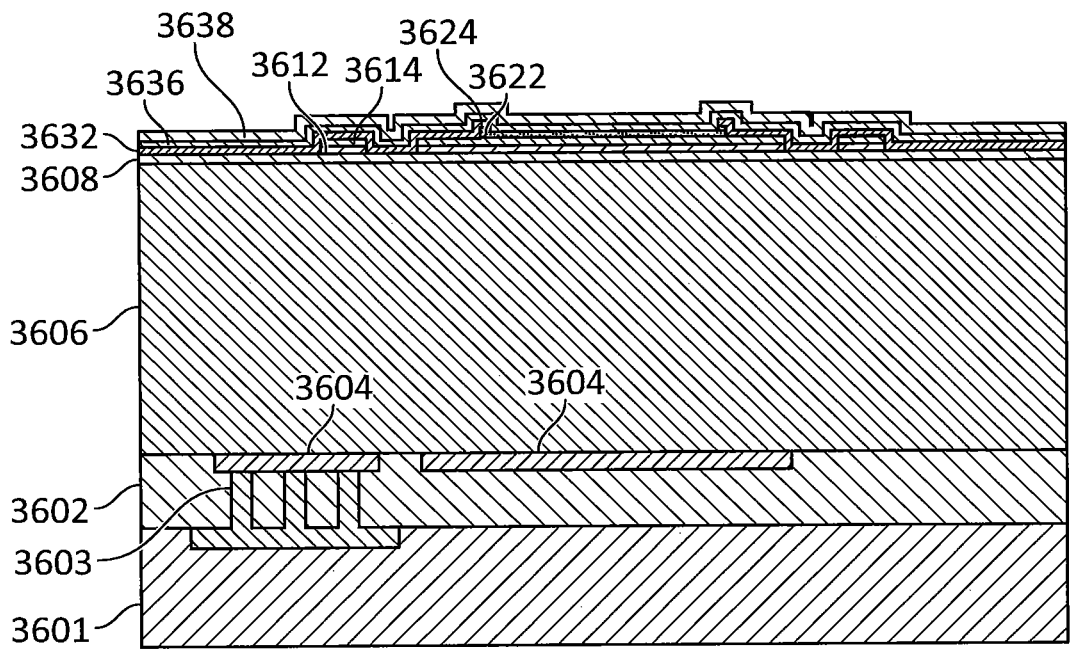
Figure 36L:
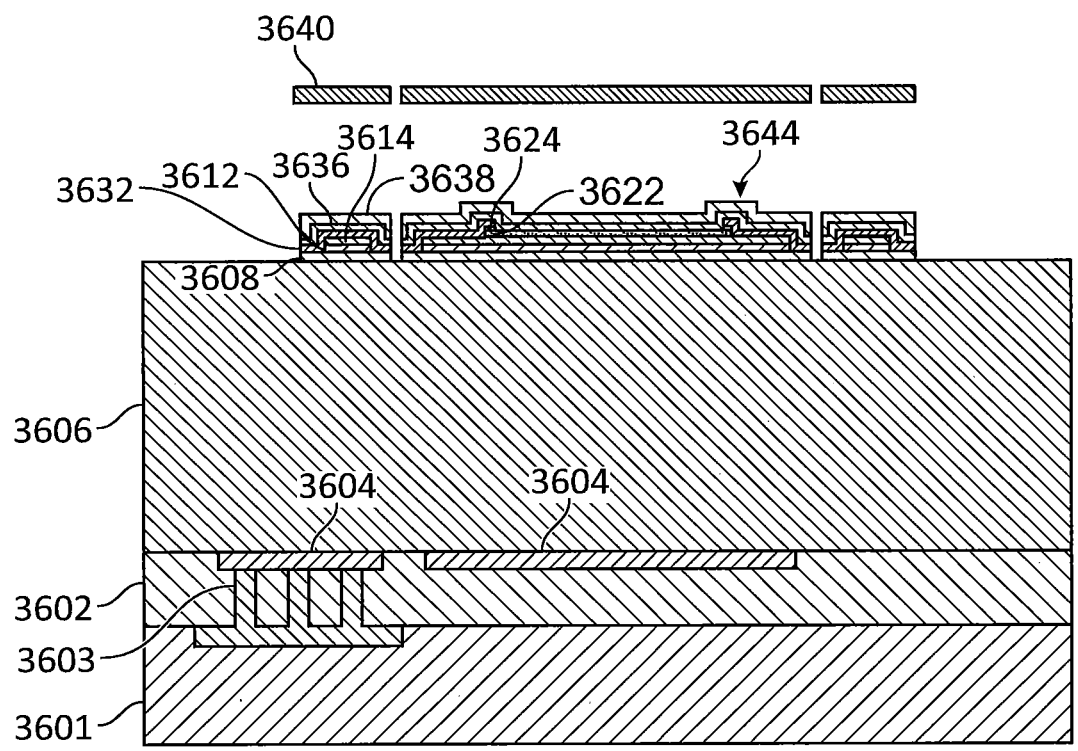
Figure 36M:
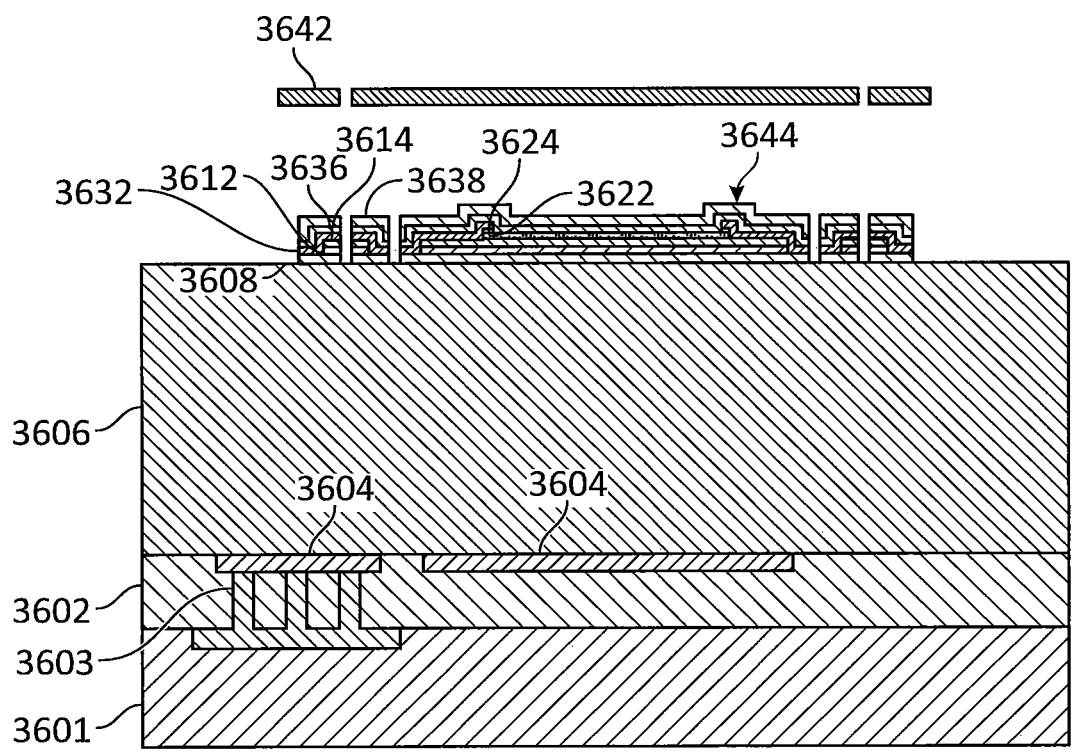
Figure 36N:
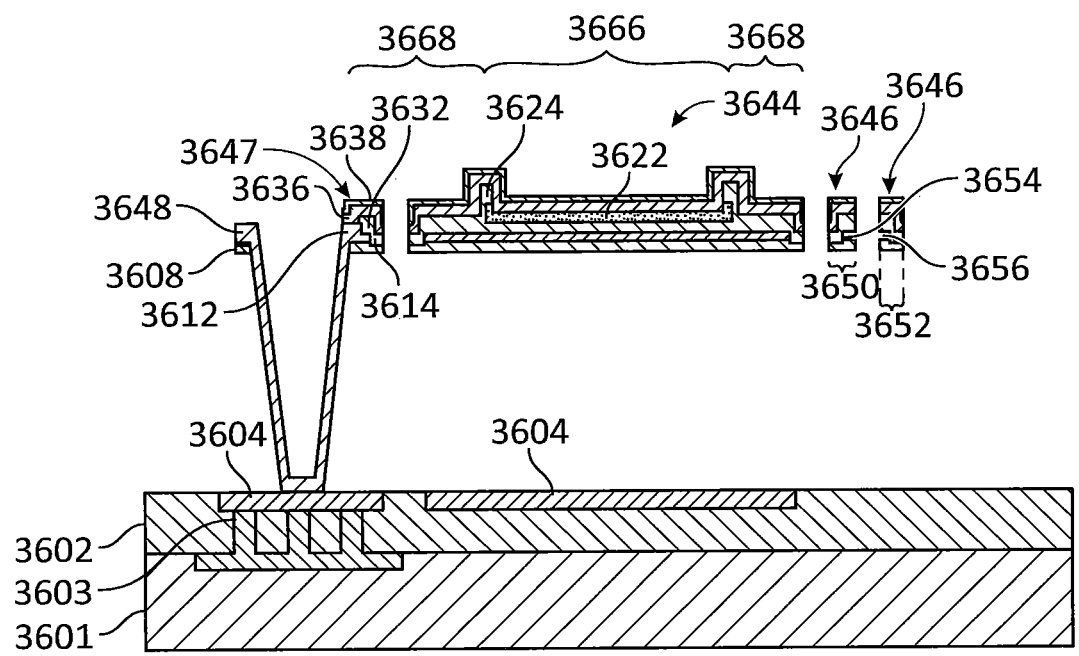
Figure 37:
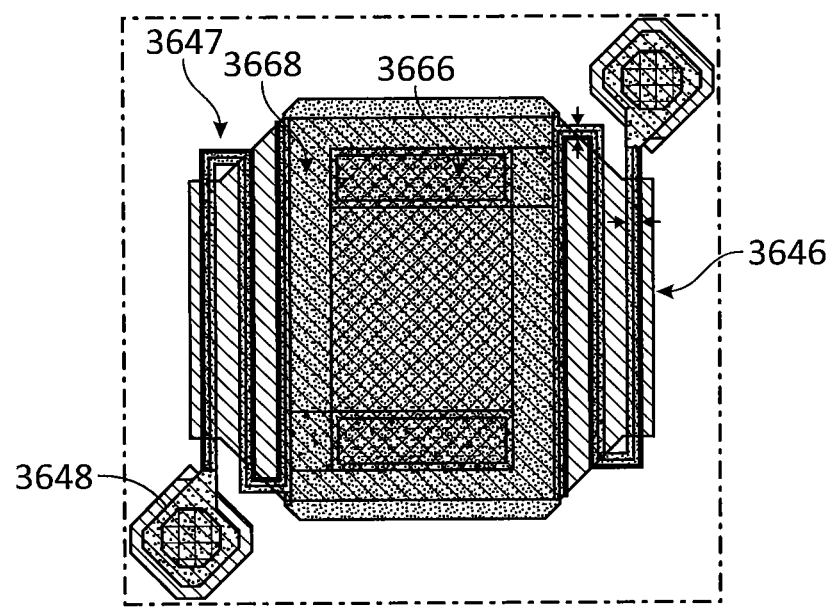
FIG. 37 illustrate a top-down view corresponding to the cross-sectional side view of FIG. 36N in accordance with an embodiment.

FIGS. 36A through 36N illustrate cross-sectional side views associated with an example process for forming a bolometer in accordance with an embodiment. FIG. 37 illustrates a top-down view corresponding to the cross-sectional side view of FIG. 36N in accordance with an embodiment.

In FIG. 36A, a readout circuit wafer 3600 (e.g., ROIC wafer) is provided. The readout circuit wafer 3600 includes a substrate 3601, an overglass layer 3602, and a metal layer 3603. The overglass layer 3602 is disposed on the substrate 3601. The metal layer 3603 extends through the overglass layer 3602. Bolometer processing is performed on the readout circuit wafer 3600 to form a bolometer that is coupled to the readout circuit wafer 3600. An example of bolometer processing is described with reference to FIGS. 36B through 36O. In FIG. 36B, pads 3604 are disposed on the readout circuit wafer 3600. The pads 3604 may form part of one or more metal layers. In FIG. 36C, a release layer 3606 (e.g., also referred to as a sacrificial layer) is disposed on the overglass layer 3602 and the pads 3604, and a protection layer 3608 is disposed on the release layer 3606. The release layer 3606 may be a polyimide coating. The protection layer 3608 may be deposited as a thin sheet film over the release layer 3606.

In FIG. 36D, a metal layer 3612 is disposed on the protection layer 3608, and a dielectric layer 3614 is disposed on the metal layer 3612. The metal layer 3612 may be a titanium layer. In some cases, the metal layer 3612 may form or may be referred to as an absorber layer. In these cases, this absorber layer may be formed of, for example, titanium. The metal layer 3612 may be utilized as an etch stop layer for subsequent etching operations (e.g., to allow etching of an oxide layer(s) down to the metal layer 3612). The dielectric layer 3614 may be formed of $Si_3N_4$. The metal layer 3612 and the dielectric layer 3614 may be deposited as thin sheet films.

In FIG. 36E, the metal layer 3612 and the dielectric layer 3614 are etched. To facilitate etching of the metal layer 3612 and the dielectric layer 3614, one or more patterning operations may be performed. In general, etching operations are preceded by depositing and patterning of photoresist to define portions of material to be etched/removed, and each etching operation may be isotropic or anisotropic. Patterning may include depositing a photoresist layer and exposing the photoresist layer appropriate to define portions of the metal layer 3612 and the dielectric layer 3614 to be etched. Etching may be performed on the metal layer 3612 and the dielectric layer 3614, and the photoresist layer then removed. In an aspect, a first etching operation (e.g., reactive ion etch) may be performed to etch down through the dielectric layer 3612 to the metal layer 3614. A second etching operation (e.g., of a different chemistry from the first etching operation) may be performed to etch down through the metal layer 3614 to the protection layer 3608. Blocks 3616 may identify portions of the metal layer 3612 and the dielectric layer 3614 that remain after etching. In some cases, the blocks 3616 may represent mask material utilized to facilitate patterning and etching to obtain the metal layer 3612 and the dielectric layer 3614 as shown in FIG. 36E.

In FIG. 36F, a resistive layer 3622 (e.g., VOx layer, TiOx layer, amorphous silicon) and a dielectric layer 3624 are disposed. The resistive layer 3622 is disposed such that the resistive layer 3622 is in contact with the protection layer 3608, the metal layer 3612, and the dielectric layer 3614. The dielectric layer 3624 is disposed on the resistive layer 3622. The dielectric layer 3624 may be a cap layer for the resistive layer 3622. In FIG. 36G, the resistive layer 3622 and the dielectric layer 3624 are etched. Such etching may etch the resistive layer 3622 and the dielectric layer 3624 such that they define a thermistor of the bolometer to be formed. A block 3630 identifies a portion of the resistive layer 3622 and the dielectric layer 3624 that remains after etching. In some cases, the block 3630 may represent mask material utilized to facilitate patterning and etching to obtain the resistive layer 3622 and the dielectric layer 3624 as shown in FIG. 36G. The block 3630 may be considered as defining a sensing portion of a bridge and a non-sensing portion of the bridge. The sensing portion of the bridge has the resistive layer 3622, whereas the non-sensing portion of the bridge does not have the resistive layer 3622. In FIG. 36G, the sensing portion of the bridge is directly below the block 3630 and associated with a region 3660, and the non-sensing portion of the bridge is associated with regions 3662 and 3664 adjacent to the region 3660. The regions 3662 and 3664 may form a region that surrounds the region 3660. In some embodiments, the non-sensing portion of the bridge may have perforations defined therein to reduce thermal mass associated with the bridge. An example of a bridge having perforations defined in the bridge's non-sensing portion is described with respect to FIG. 49.

In FIG. 36H, a dielectric layer 3632 is disposed such that the dielectric layer 3632 is in contact with the protection layer 3608, the metal layer 3612, the dielectric layer 3614, the resistive layer 3622, and the dielectric layer 3624. In some cases, the dielectric layer 3632 is formed of the same material as the dielectric layer 3624 and/or 3614. In FIG. 36I, the resistive layer 3622 and the dielectric layer 3624 are etched to expose the resistive layer 3622. A block 3634 identifies a portion of the resistive layer 3622 and the dielectric layer 3624 that are not removed after etching. In some cases, the block 3634 may represent mask material utilized to facilitate patterning and etching to obtain the resistive layer 3622 and the dielectric layer 3624 as shown in FIG. 36I. In FIG. 36J, a leg metal layer 3636 is disposed such that the leg metal layer 3636 is in contact with the dielectric layer 3632, the resistive layer 3622, and the dielectric layer 3624. A portion of the leg metal layer 3636 on the resistive layer 3622 may be referred to as resistive layer contacts (e.g., thermistor contacts). The leg metal layer 3636 may be made of, for example, titanium, tungsten, copper, or other metals. In FIG. 36K, a dielectric layer 3638 is disposed on the leg metal layer 3636. In an aspect, the dielectric layer 3638 may be disposed using very thin sheet films (e.g., atomic layer deposition (ALD)).

In FIG. 36L, a portion of the protection layer 3608, the dielectric layer 3632, the leg metal layer 3636, and the dielectric layer 3638 are etched. In some cases, performing of a metal etch and an oxide etch may be alternated as appropriate to etch the layers 3632, 3636, and 3638 one at a time. Blocks 3640 identify portions of the layer 3608, 3632, 3636, and 3638 that remain after etching. In some cases, the block 3640 may represent mask material utilized to facilitate patterning and etching to obtain the layers 3608, 3632, 3636, and 3638 as shown in FIG. 36L. In an aspect, various patterning and etching operations are performed to form a bridge 3644. In FIG. 36M, a portion of the layers 3608, 3632, 3636, and 3638 are etched. Blocks 3642 identify portions of the layer 3608, 3632, 3636, and 3638 that remain after etching. In some cases, the block 3642 may represent mask material utilized to facilitate patterning and etching to obtain the layers 3608, 3632, 3636, and 3638 as shown in FIG. 36M. FIGS. 36L and 36M help define vertical legs 3646 and 3647 in FIG. 36N. In an aspect, FIG. 36L is associated with opening/cutting a bottom of a leg structure, and FIG. 36M is associated with opening/cutting a top of a leg structure.

In FIGS. 36N and 37, various operations are performed to form a contact 3648 (e.g., basket contact) between the pads 3604 and the vertical leg 3647. A drilling operation may be performed to open a trench (e.g., also referred to as an opening) through the release layer 3606 to the readout circuit wafer 3600. In some cases, the drilling operation may include etching operations. The contact 3648 and the vertical legs 3646 collectively connect the bridge 3644 to the substrate 3601 (e.g., an ROIC). The contact 3648 may be made of, for example, aluminum. Various material deposition operations (e.g., basket metal deposition operations), patterning operations, etching operations, and/or other operations are performed to obtain the structure as shown in FIG. 36N. The etching operations cause a formation of tails 3650 and 3652 (e.g., also referred to as residual tabs). The tails 3650 and 3652 are portions of the protection layer 3608 that remain after etching, whereas portions of the metal layer 3612 (previously disposed on the tails 3650 and 3652) have been removed due to the etching operation(s). In this regard, in FIG. 36N, a gap 3654 and 3656 is above the tail 3650 and 3652, respectively. The tails 3650 and 3652 of the protection layer 3608 face the dielectric layer 3632. In FIGS. 36N and 37, a sensing portion of the bridge 3644 is associated with a region 3666, and anon-sensing portion of the bridge 3644 is associated with a region 3668 surrounding the region 3666. In some embodiments, the bridge 3644 may include a metal layer (e.g., an absorber layer) disposed on the dielectric layer 3638. A cap layer (e.g., $SiO_2$) may be disposed on the metal layer.

FIGS. 38A through 38D illustrate cross-sectional side views associated with an example process for forming a contact in accordance with an embodiment. The contact may be utilized to couple a bridge to a readout circuit wafer. Various features of FIGS. 38A through 38D may be implemented in the same or similar manner as corresponding features of FIGS. 36A-36N and/or other figures.

Figure 38A:
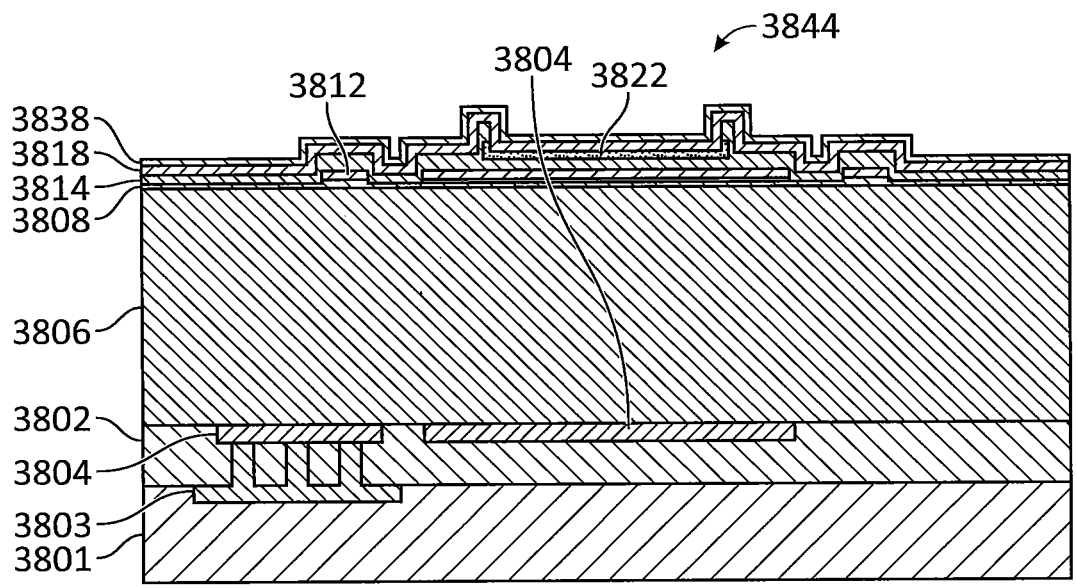
FIGS. 38A through 38D illustrate cross-sectional side views associated with an example process for forming a contact in accordance with an embodiment.

In FIG. 38A, a structure having a bridge 3844 is formed. In an aspect, the structure of FIG. 38A may be utilized as a starting structure prior to forming of a contact to couple the bridge 3844 to the readout circuit wafer. The readout circuit wafer includes a substrate 3801, an overglass layer 3802, and a metal layer 3803. Pads 3804 are disposed on the readout circuit wafer. The structure further includes a release layer 3806 (e.g., polyimide), a protection layer 3808, a metal layer 3812 (e.g., MUP layer formed of titanium), a dielectric layer 3614 (e.g., oxide), a resistive layer 3822 (e.g., $VO_x$ layer), and a dielectric layer 3838 (e.g., thin sheet film). It is noted this structure directly connects the bridge 3844 to the readout circuit wafer without utilizing a leg structure. In an aspect, in processing steps subsequent to FIG. 38D, legs may optionally be defined for connecting the bridge 3844 to the readout circuit wafer. If leg structures are to be formed, the metal layer 3818 may be utilized as a leg metal layer.

Figure 38B:
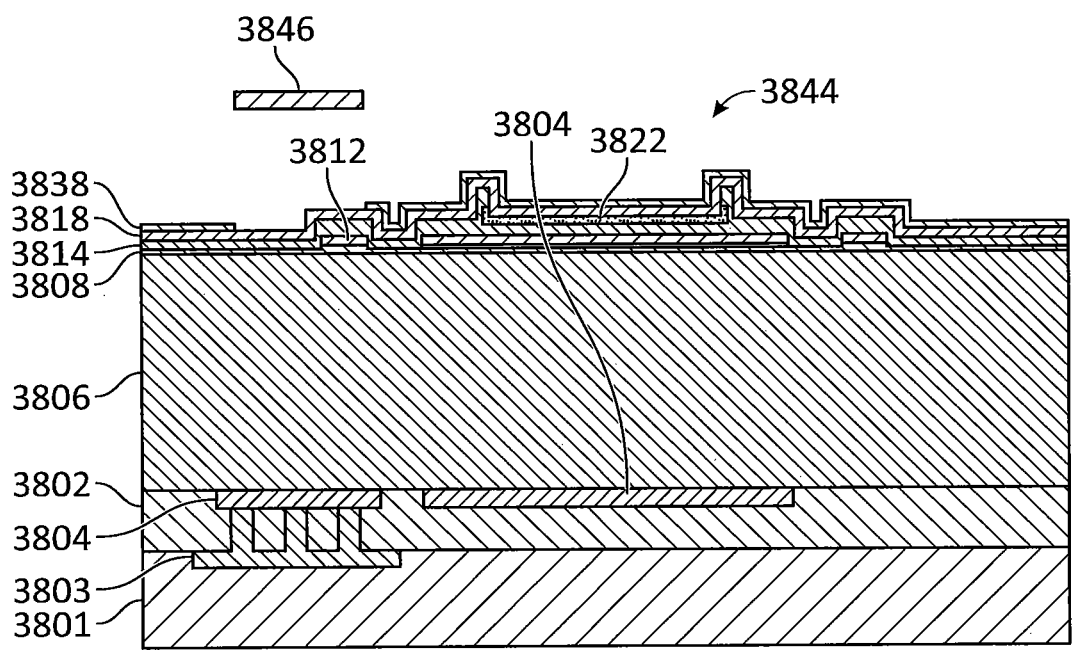
Figure 38C:
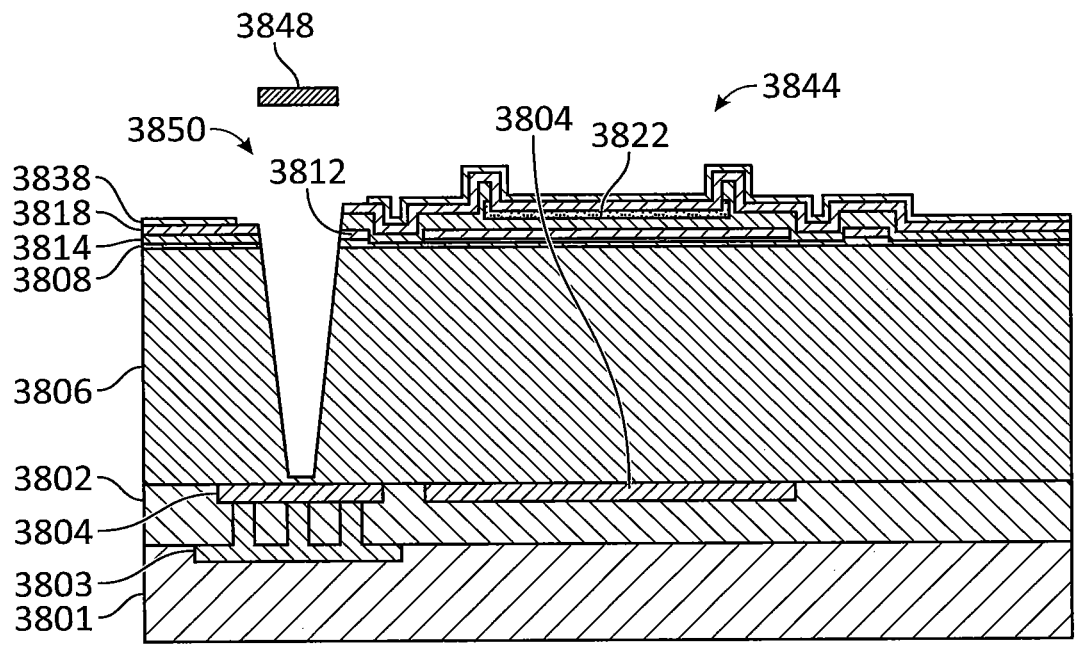
Figure 38D:
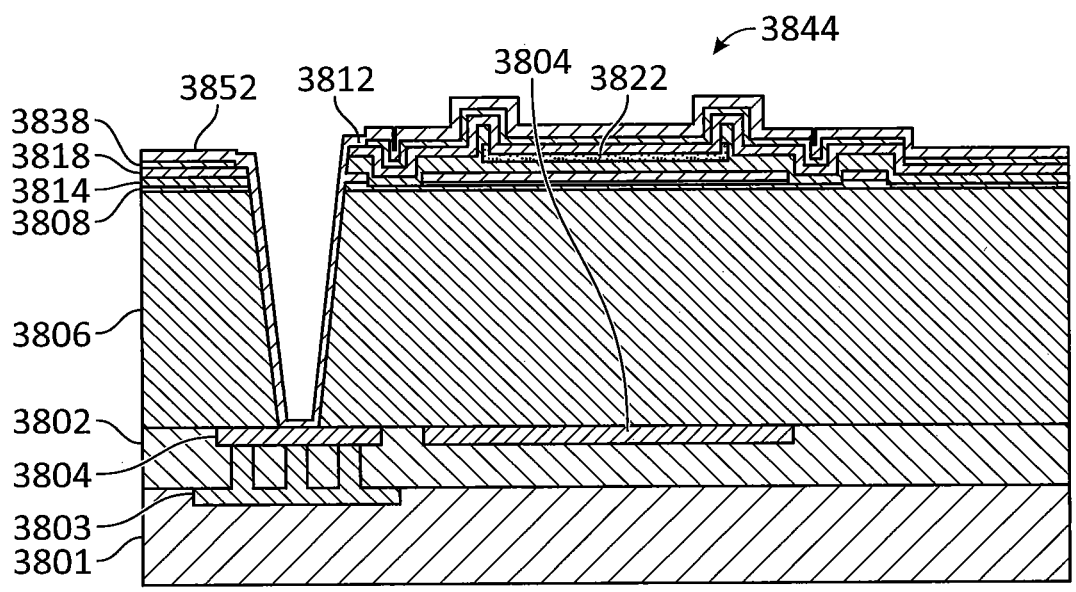

In FIG. 38B, the dielectric layer 3838 is etched. A block 3846 identifies a portion of the dielectric layer 3838 that is etched out. In some cases, the block 3846 may represent mask material utilized to facilitate patterning and etching to obtain the dielectric layer 3838 as shown in FIG. 38B. In FIG. 38C, to define a trench 3850, a portion of the release layer 3806, the protection layer 3808, the metal layer 3812, the dielectric layer 3814, and the metal layer 3818 is removed. The layers 3806, 3808, 3812, 3814, 3818, and 3838 may be etched using one or more etching operations. A block 3848 identifies a portion of the layers 3806, 3808, 3812, 3814, 3818, and 3838 that are etched out. In some cases, the block 3848 may represent one or more mask material utilized to facilitate patterning and etching to obtain the layers 3806, 3808, 3812, 3814, 3818, and 3838 as shown in FIG. 38C. In an aspect, the metal layer 3812 and/or the metal layer 3818 may be utilized as a hard mask for etching of the release layer 3806 (e.g., polyimide etch). In FIG. 38D, a contact metal layer 3852 is disposed. The contact metal layer 3852 is disposed on at least one of the pads 3804 (e.g., left pad in FIG. 38D) to couple the bridge 3844 to the readout circuit wafer. The contact metal layer 3852 is in contact with the release layer 3806, the protection layer 3808, the dielectric layer 3814, the metal layer 3812, the metal layer 3818, the dielectric layer 3838, and one of the pads 3804. Although a basket contact is formed in FIGS. 38A-38D, in other embodiments a stud contact or other type of contact may be formed. Additional operations may be performed on the structure shown in FIG. 38D, such as removing the release layer 3806, to form a bolometer. It is noted that legs may optionally be defined in the structure of FIG. 38D such that the legs are utilized to couple the bridge 3844 to the readout circuit wafer. Examples of additional operations, including leg formation, are described with respect to FIGS. 39A through 39D.

FIGS. 39A through 39D illustrate cross-sectional side views associated with an example process for forming legs after a contact to a readout circuit wafer has been formed in accordance with an embodiment. FIG. 40 illustrates a top-down view corresponding to the cross-sectional side view of FIG. 39D in accordance with an embodiment. Various features of FIGS. 39A through 39D may be implemented in the same or similar manner as corresponding features of FIGS. 36A-36N and/or other figures. In some embodiments, the process shown in relation to FIGS. 39A through 39D may be utilized to form the bolometer of FIGS. 34 and 35.

Figure 39A:
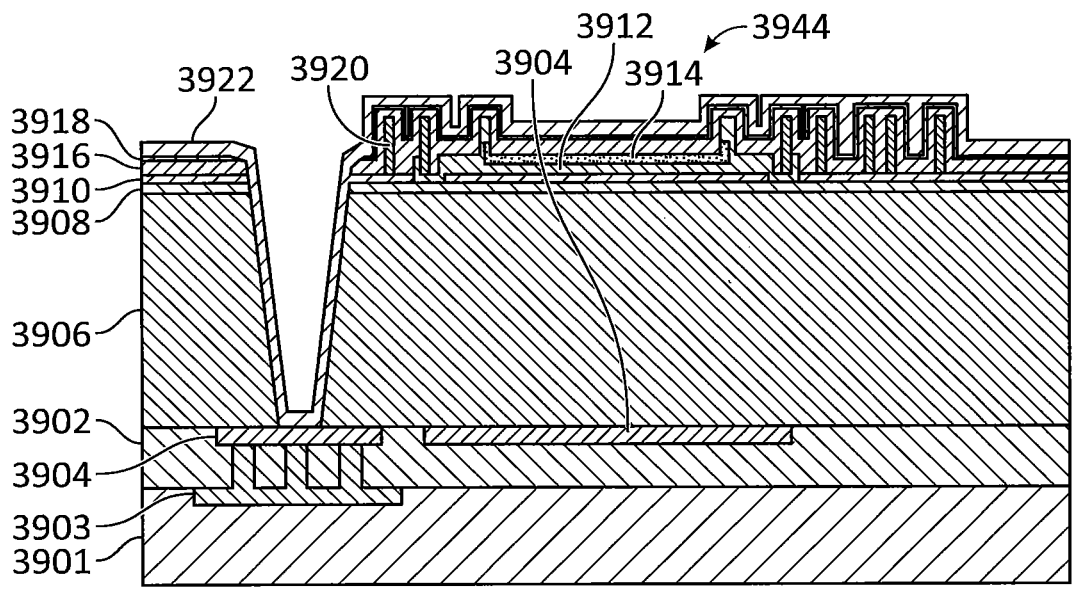
FIGS. 39A through 39D illustrate cross-sectional side views associated with an example process for forming legs after a contact to a readout circuit wafer has been formed in accordance with an embodiment.
Figure 39B:
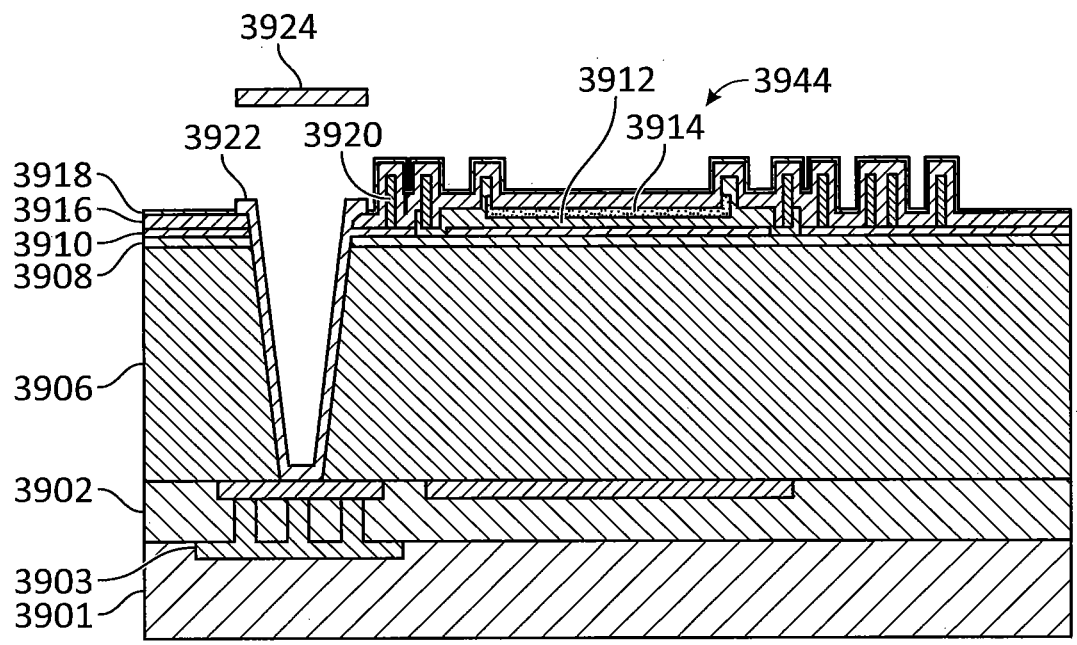
Figure 40:
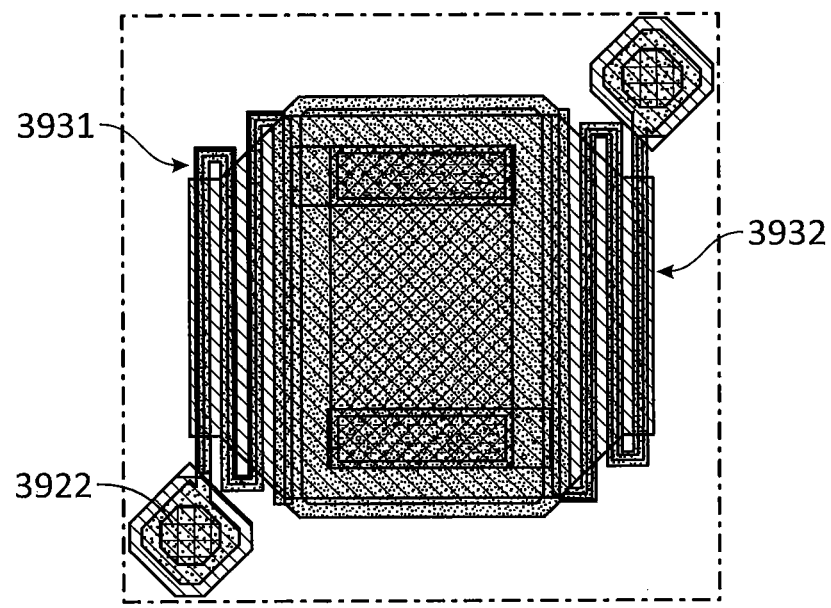
FIG. 40 illustrates a top-down view corresponding to the cross-sectional side view of FIG. 39D in accordance with an embodiment.

In FIG. 39A, a structure having a bridge 3944 and a contact metal layer 3922 for coupling the bridge 3944 to the readout circuit wafer are formed. In an aspect, the structure of FIG. 39A may be utilized as a starting structure prior to forming legs for coupling the bridge 3944 to the readout circuit wafer. The readout circuit wafer includes a substrate 3901, an overglass layer 3902, and a metal layer 3903. Pads 3904 are disposed on the readout circuit wafer. The structure further includes a release layer 3906 (e.g., polyimide), a protection layer 3908 (e.g., poly cap layer), a metal layer 3910 (e.g., formed of titanium), a dielectric layer 3912 (e.g., nitride (e.g., $Si_3N_4$) or oxide (e.g., $SiO_2$)), a resistive layer 3914 (e.g., VOx), a leg metal layer 3916, a dielectric layer 3918 (e.g., thin film layer formed of $SiO_2$ or $Si_3N_4$), and a semiconductor layer 3920. In FIG. 39B, the contact metal layer 3922 is etched. A block 3924 identifies a portion of the contact metal layer 3922 that remains after etching. In some cases, the block 3924 may represent a mask material utilized to facilitate patterning and etching to obtain the contact metal layer 3922 as shown in FIG. 39B.

Figure 39C:
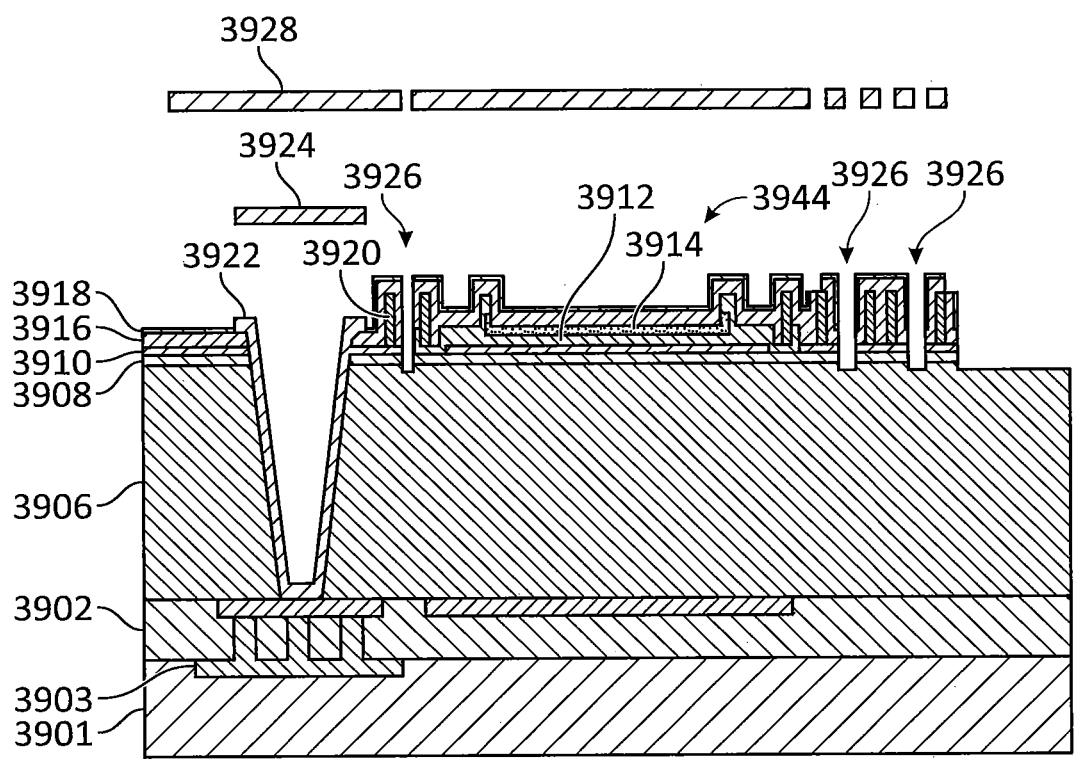
Figure 39D:
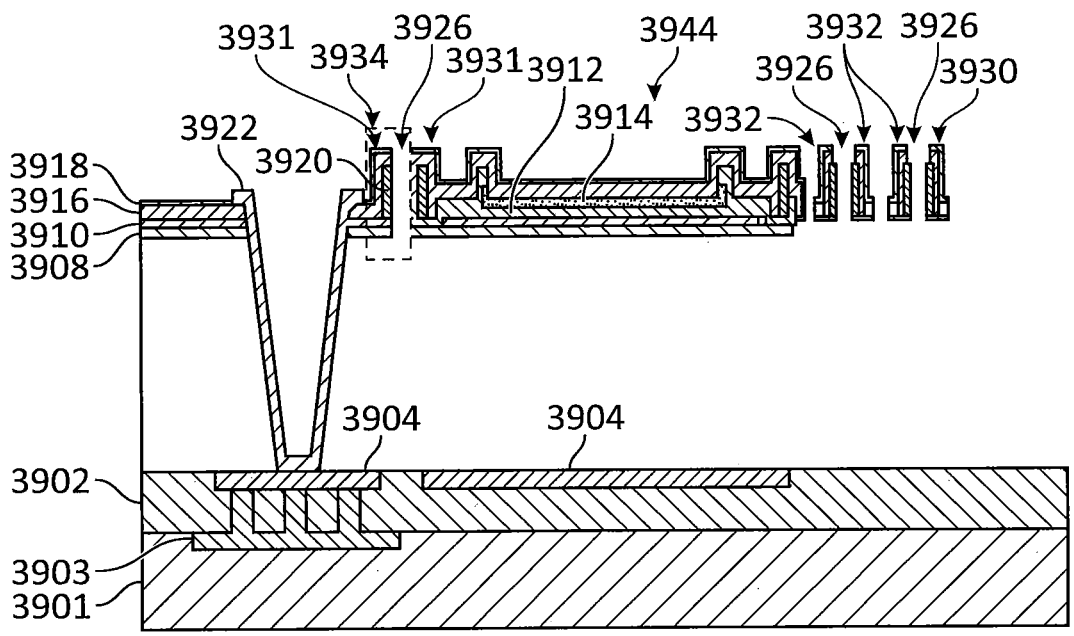

In FIG. 39C, a portion of each of the dielectric layer 3918, the leg metal layer 3916, the protection layer 3908, and the release layer 3906 is etched to define trenches 3926. Blocks 3928 identify portions of the structure of FIG. 39C that remain after etching. In some cases, the block 3928 may represent mask material utilized to facilitate patterning and etching to obtain the structure as shown in FIG. 39C. In FIGS. 39D and 40, the dielectric layer 3918 and the leg metal layer 3916 are etched to expose the semiconductor layer 3920, and the release layer 3906 is removed. As a result, legs 3931, 3932, and 3930 are formed. The legs 3931 and 3932 are associated with a current pixel (e.g., the bridge 3944). The leg 3930 may be associated with a next pixel.

Figure 39E:
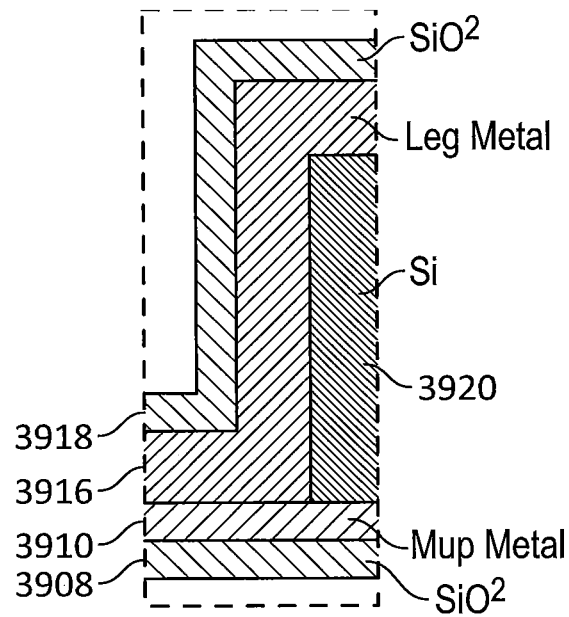
FIG. 39E illustrate a zoomed-in view of a portion of the structure of FIG. 39D.

A zoomed-in view of a portion 3934 of the structure of FIG. 39D is shown in FIG. 39E. In particular, the portion 3934 is a portion of a leg of the structure. It is noted that materials identified in FIG. 39E are provided by way of non-limiting example. The leg includes a vertically stacked arrangement of the semiconductor layer 3920 (e.g., Si, poly-styrine), the leg metal layer 3916, and the dielectric layer 3918 (e.g., $SiO_2$). The layers 3920, 3916, and 3918 are disposed on the metal layer 3910. The metal layer 3910 is disposed on the protection layer 3908.

Figure 41A:
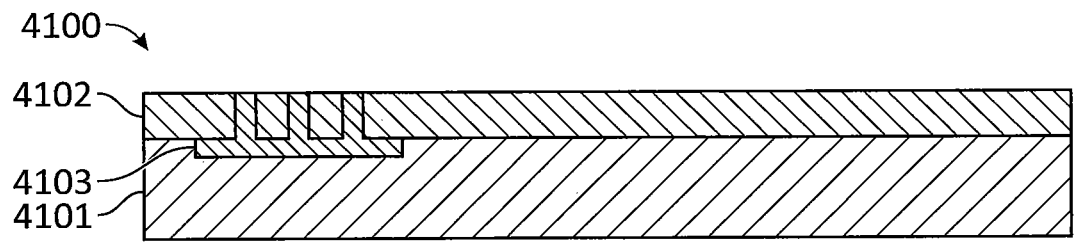
FIGS. 41A through 41T illustrate cross-sectional side view associated with an example process for forming a bolometer in accordance with an embodiment.
Figure 41B:
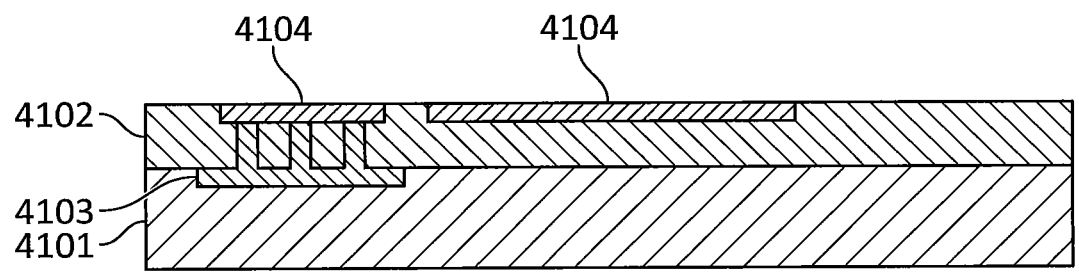
Figure 41C:
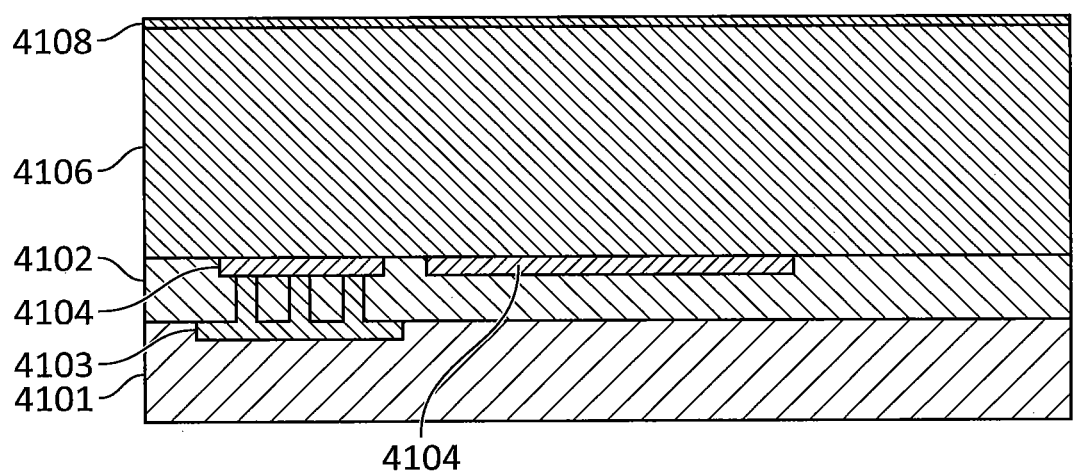
Figure 41D:
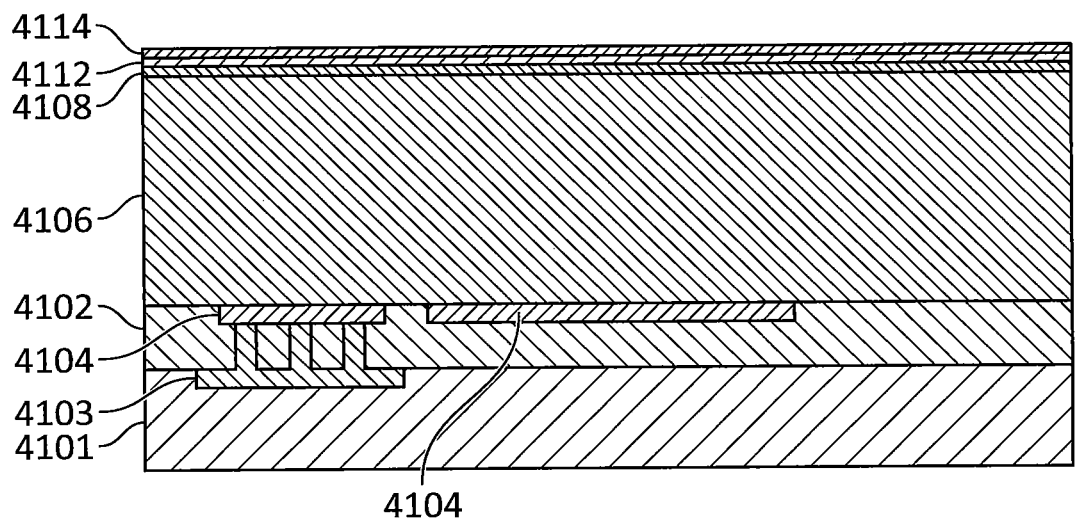
Figure 41E:
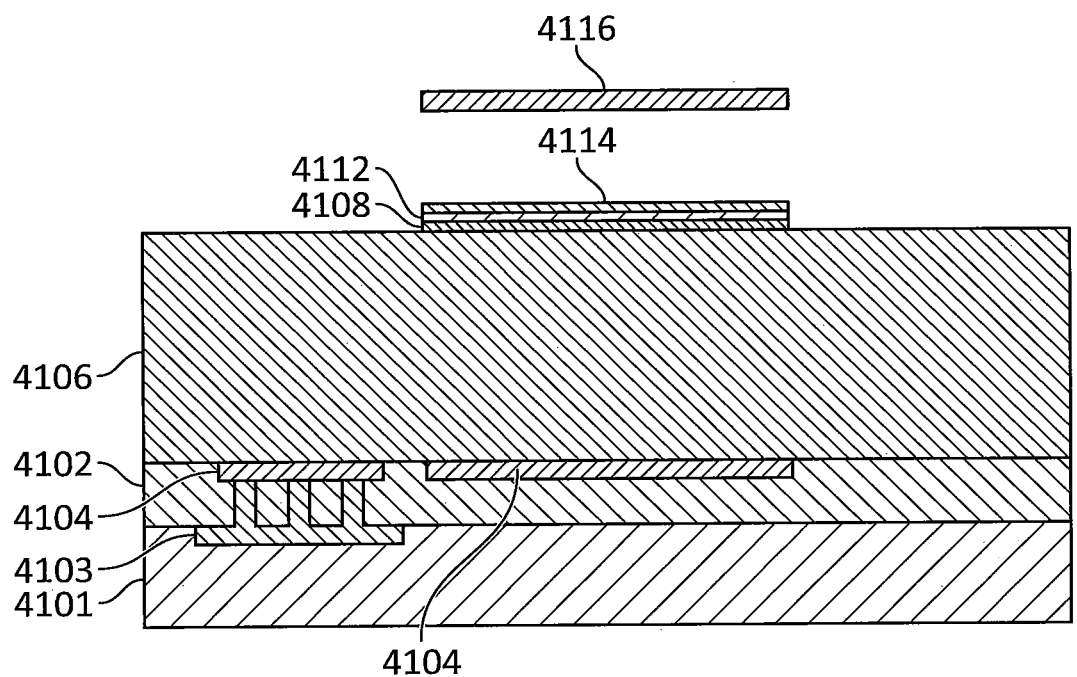
Figure 41F:
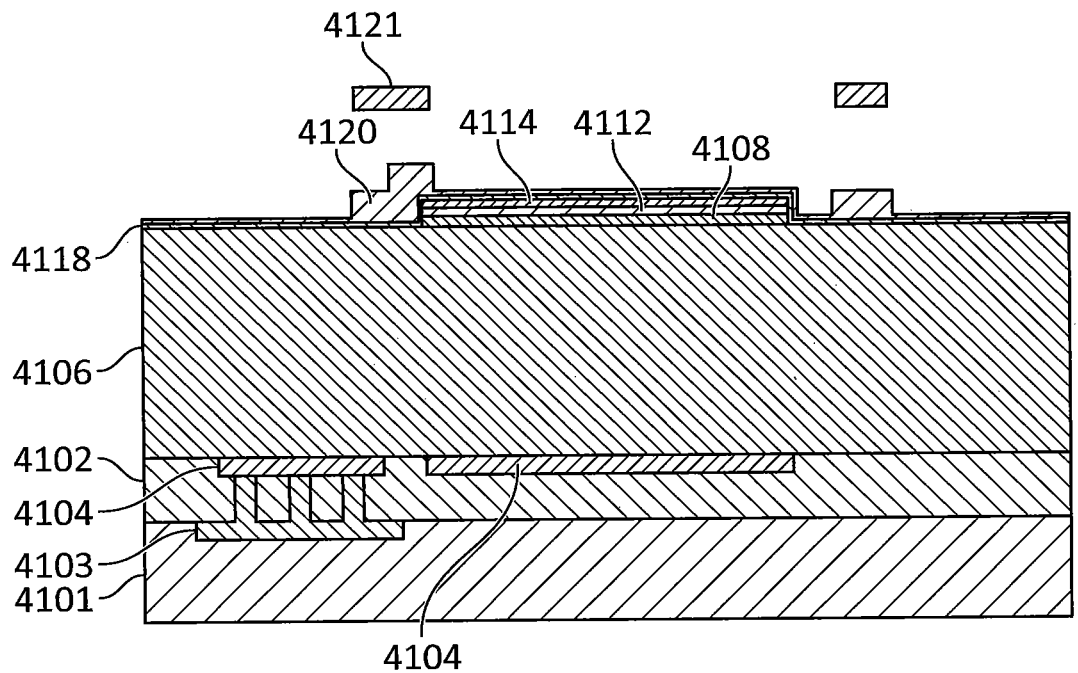
Figure 41G:
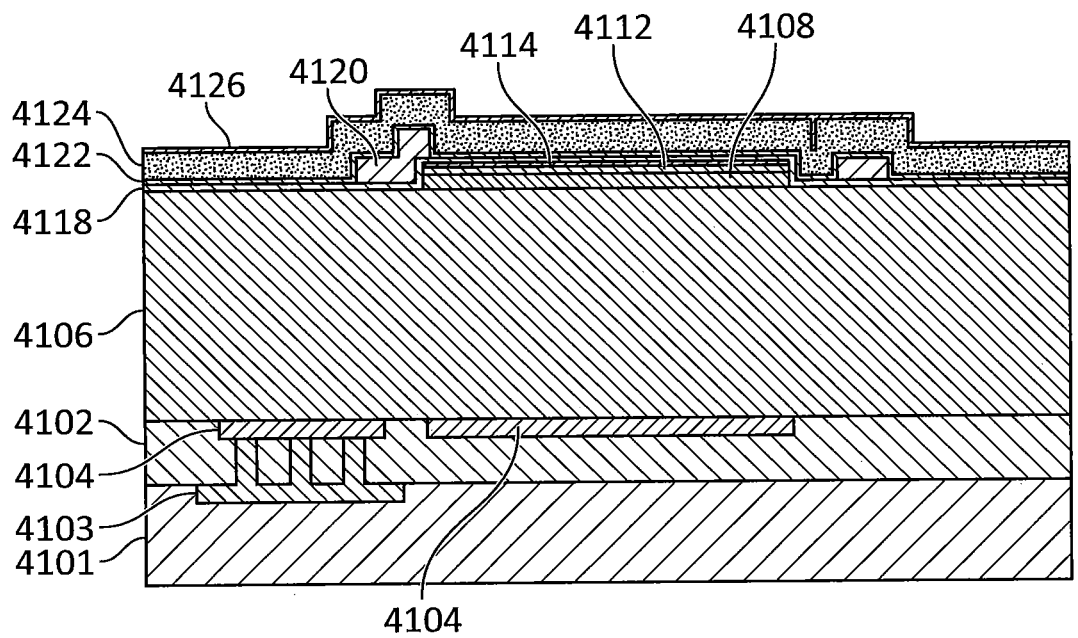
Figure 41H:
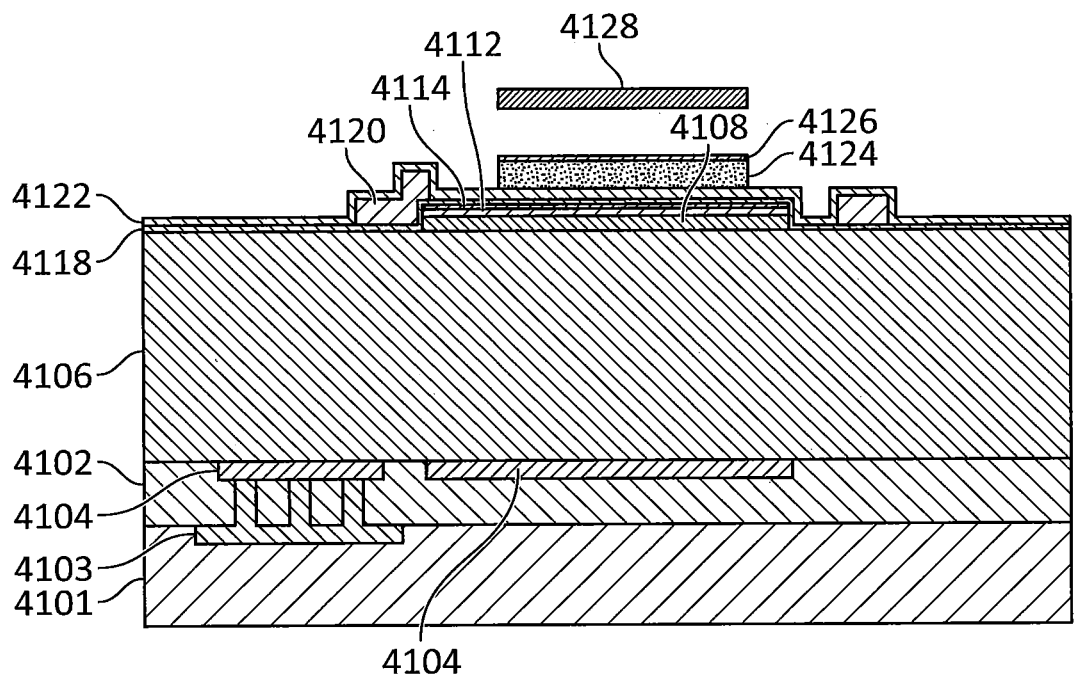
Figure 41I:
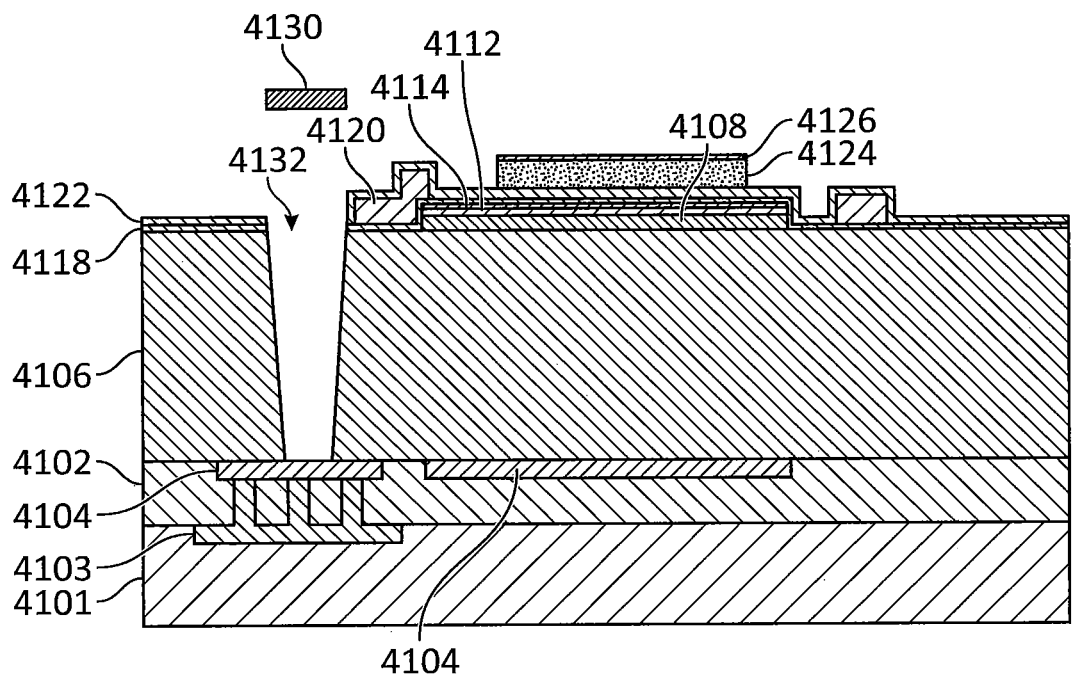
Figure 41J:
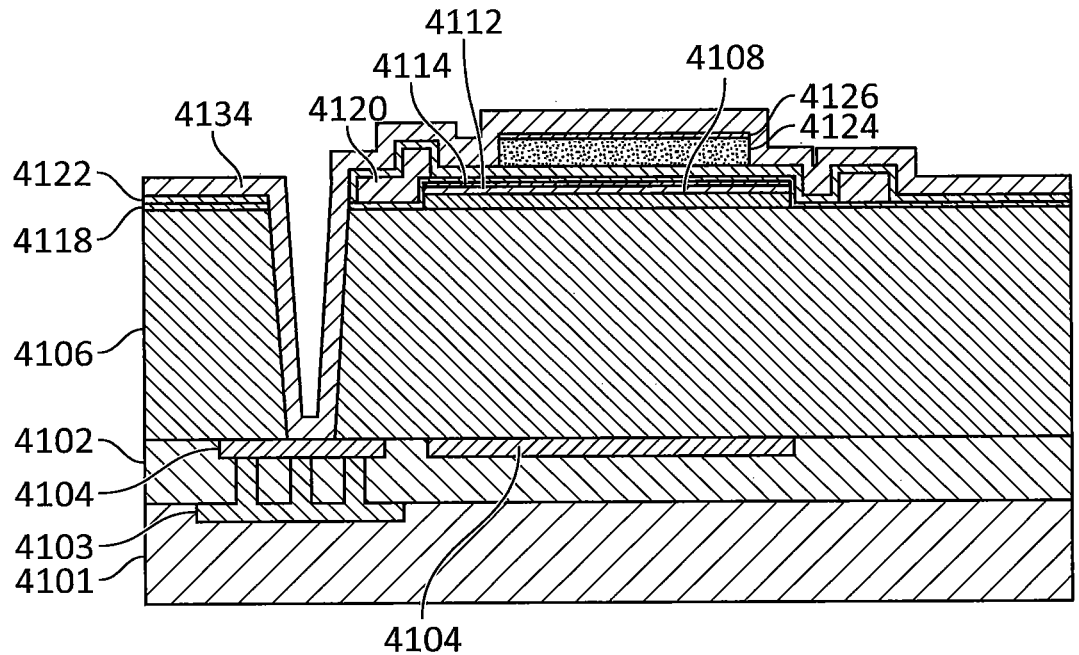
Figure 41K:
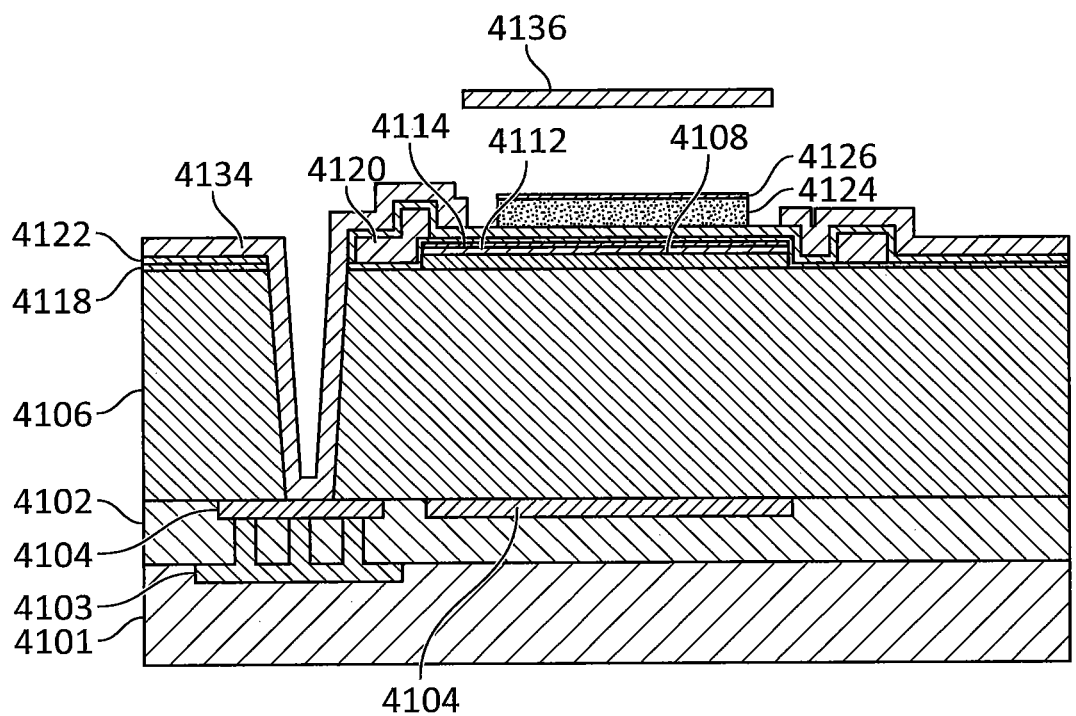
Figure 41L:
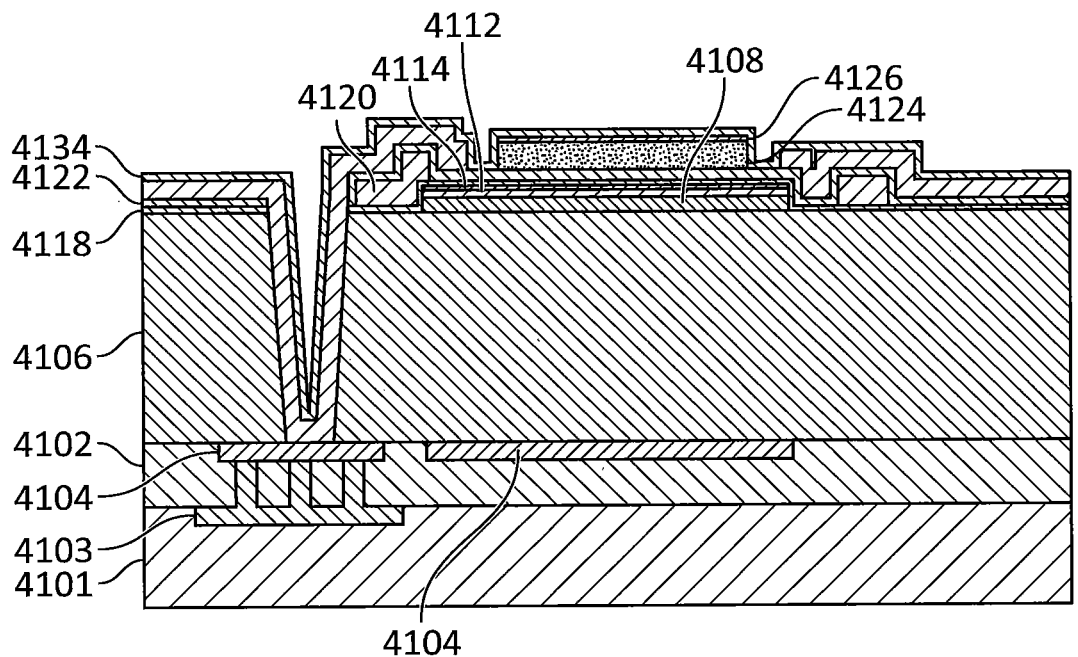
Figure 41M:
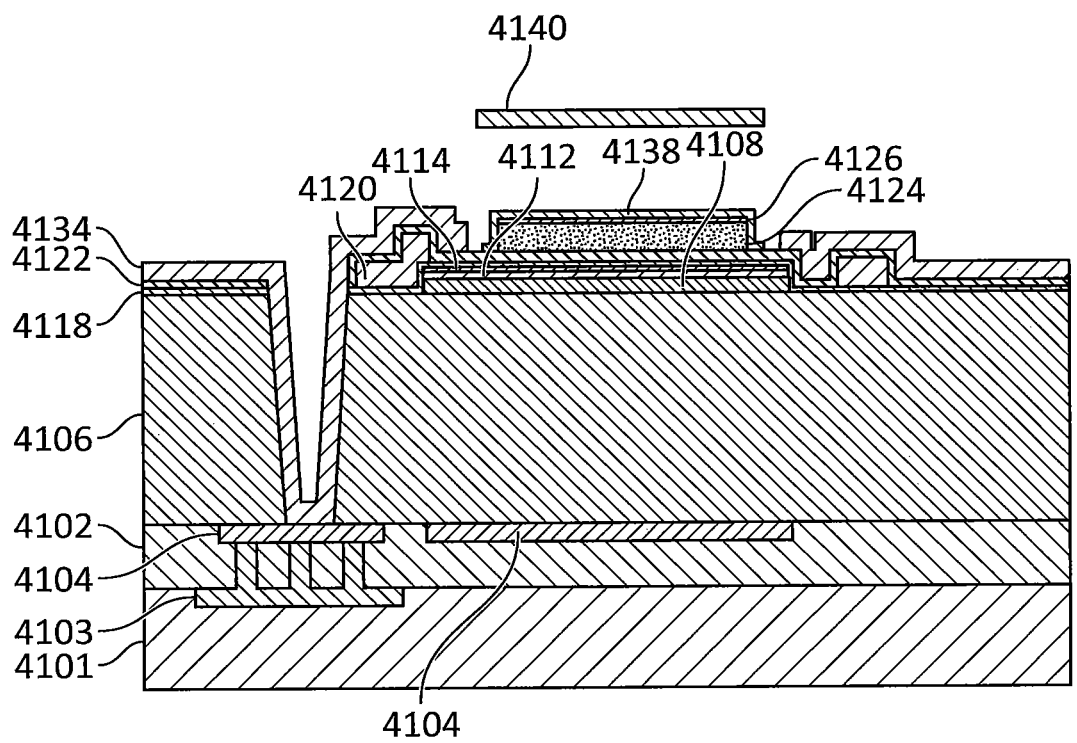
Figure 41N:
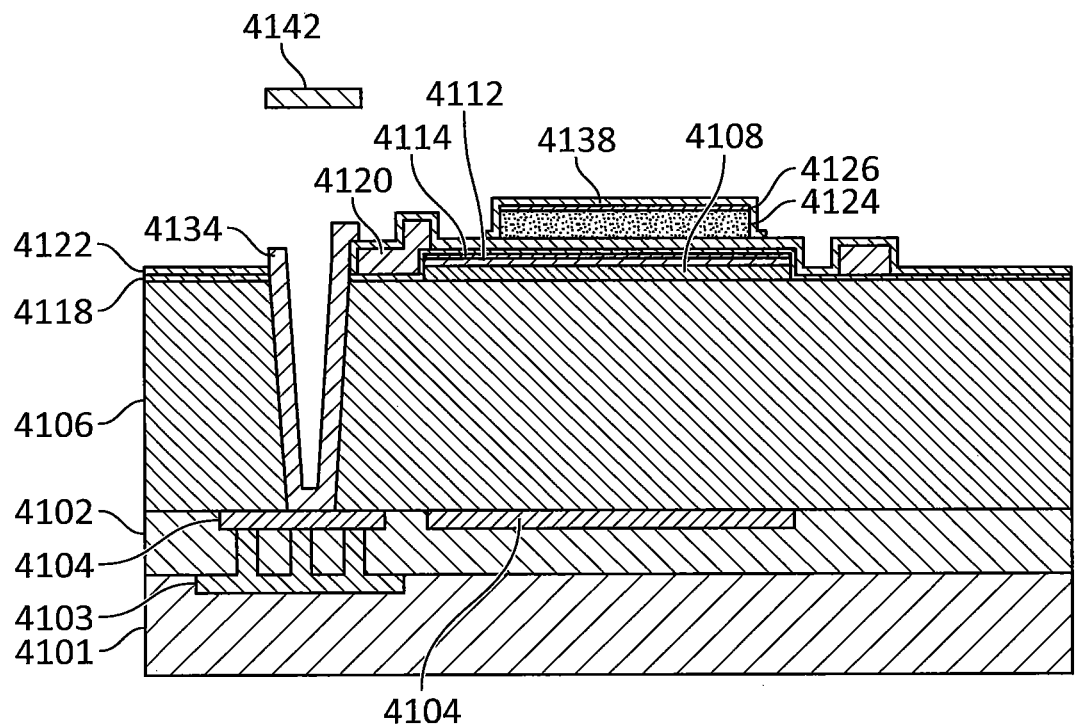
Figure 41O:
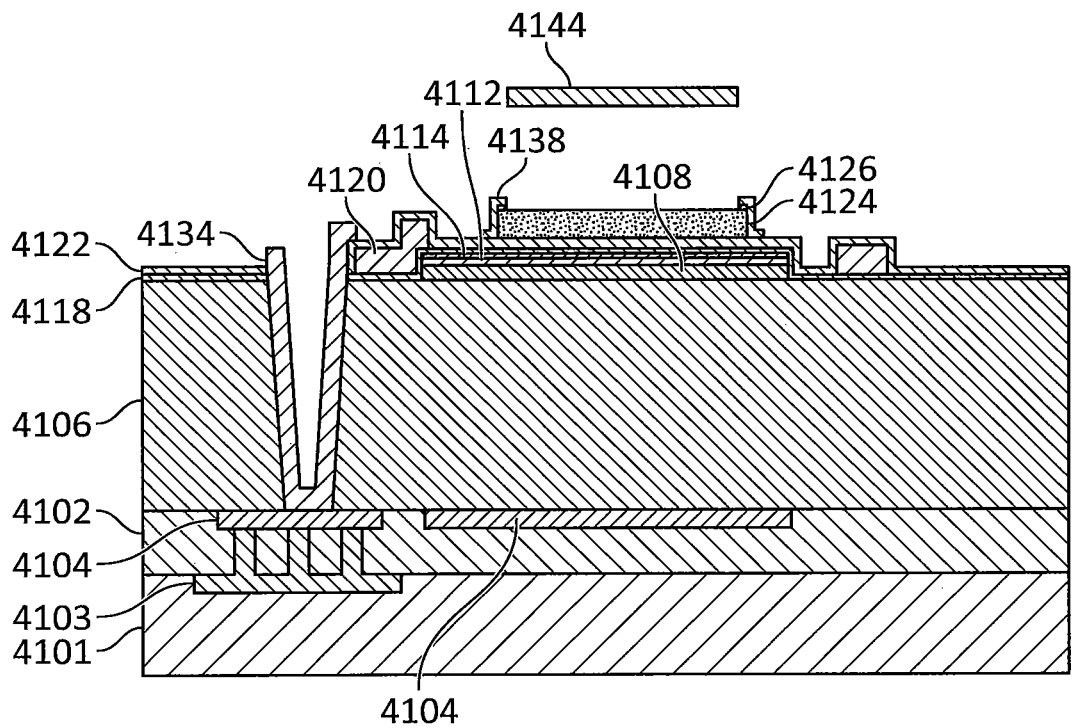
Figure 41P:
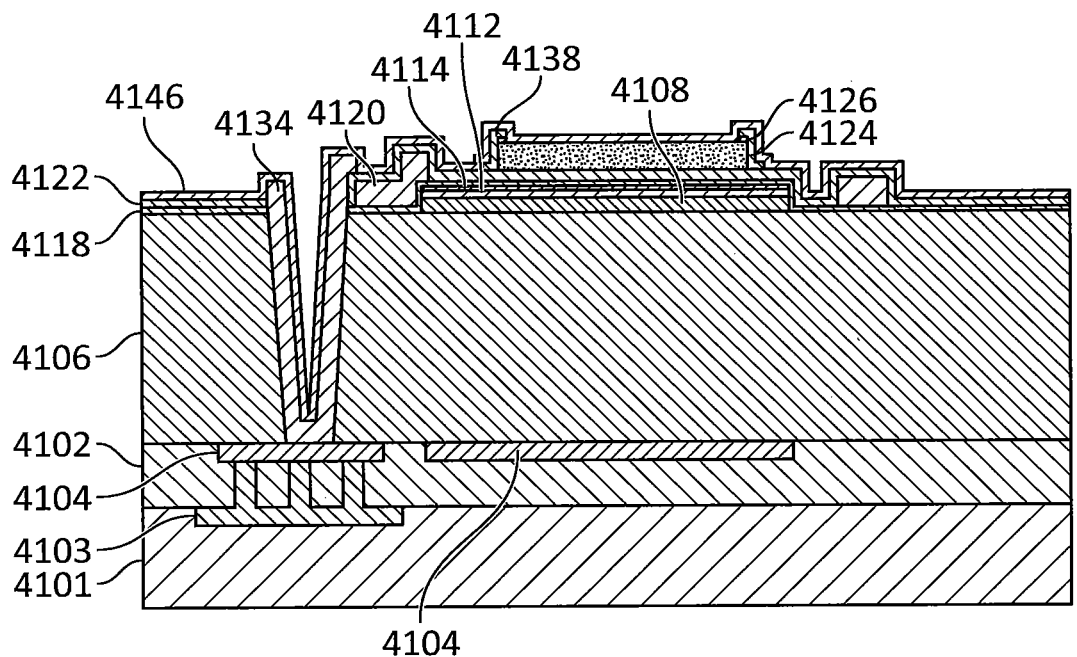
Figure 41Q:
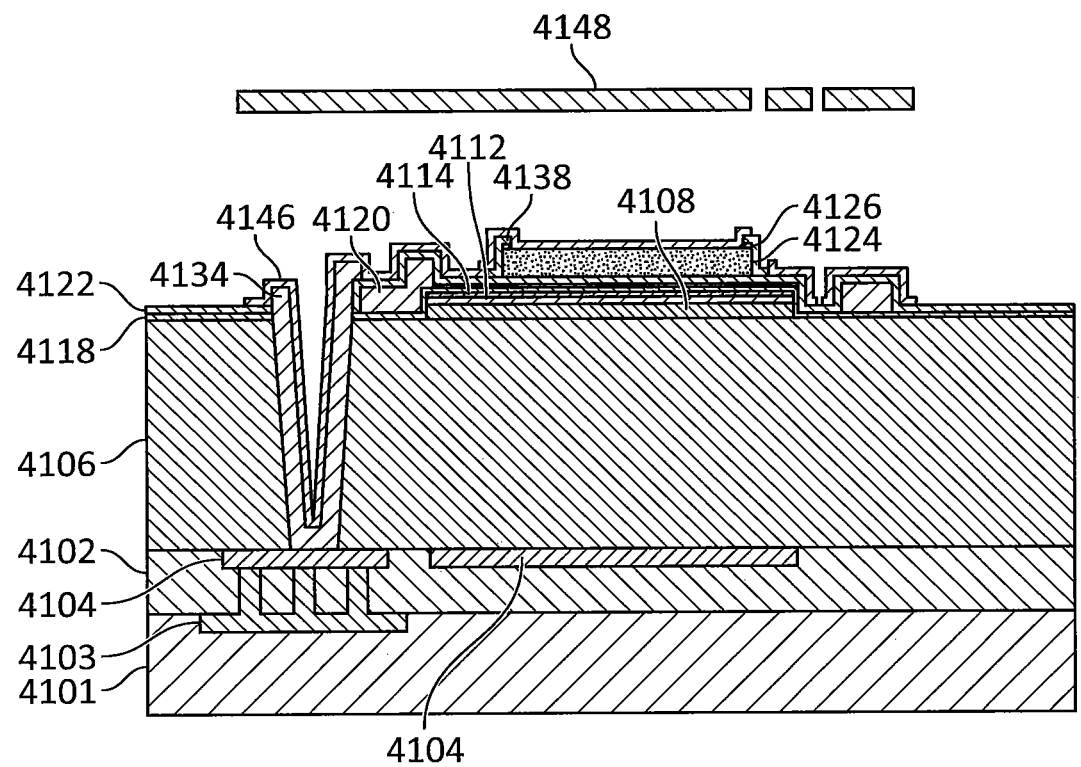
Figure 41R:
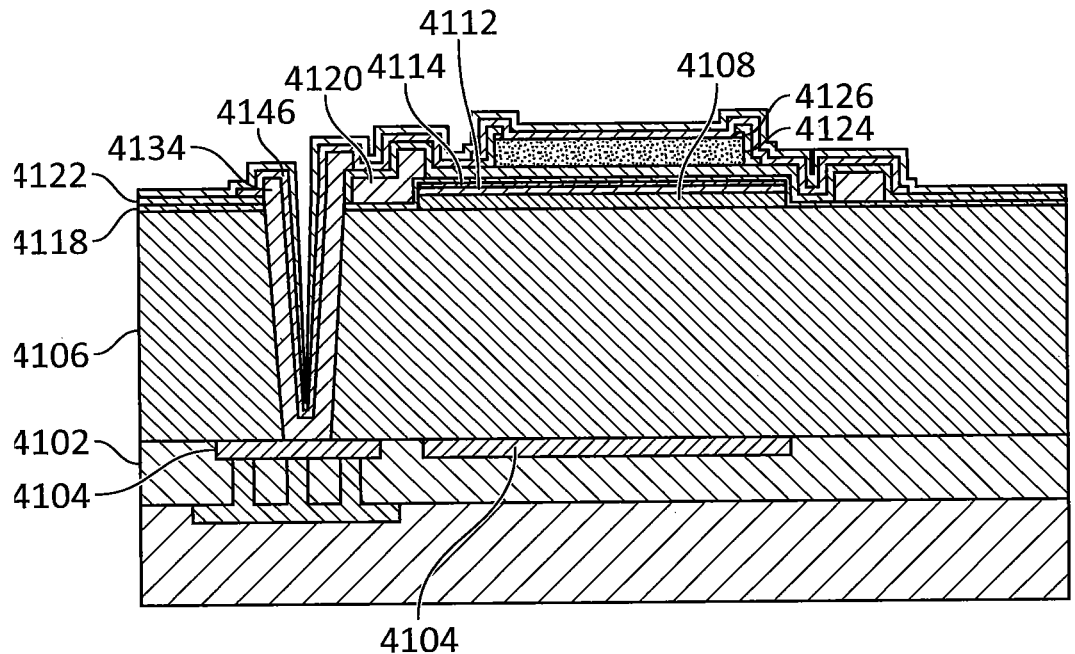
Figure 41S:
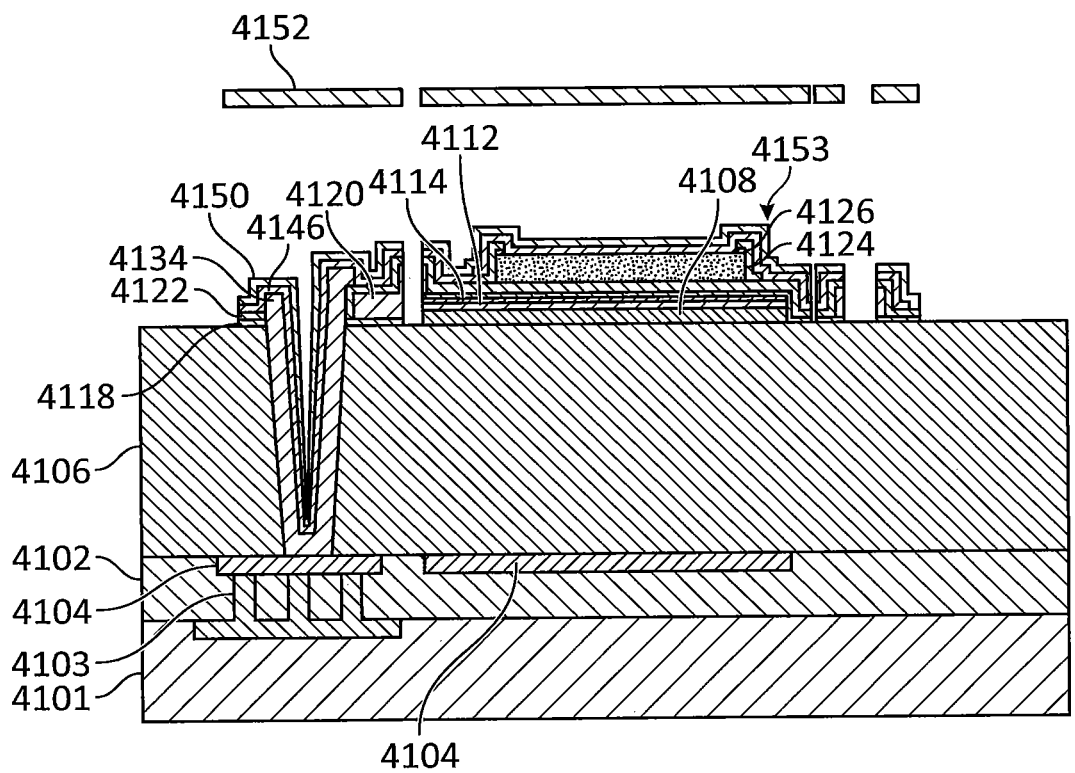
Figure 41T:
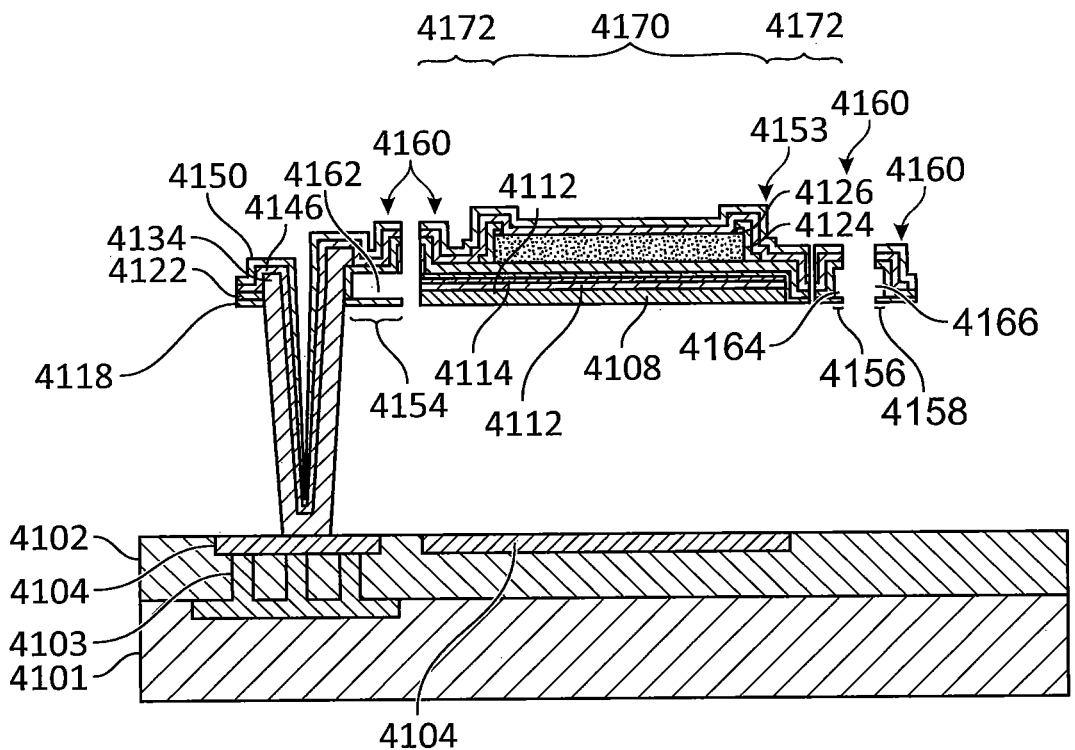
Figure 42:
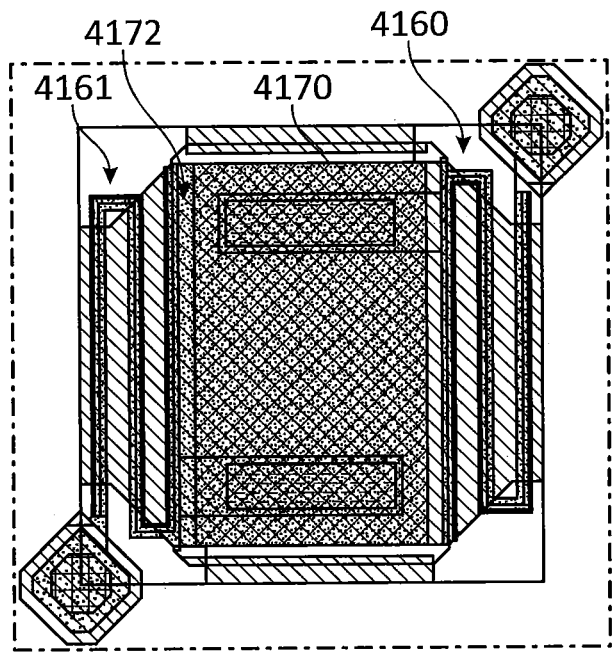
FIG. 42 illustrate top-down views corresponding to the cross-sectional side views of FIG. 41T in accordance with an embodiment.

FIGS. 41A through 41T illustrate cross-sectional side view associated with an example process for forming a bolometer in accordance with an embodiment. FIG. 42 illustrate a top-down view corresponding to the cross-sectional side view of FIG. 41T in accordance with an embodiment. Various features of FIGS. 41A through 41T may be implemented in the same or similar manner as corresponding features of FIGS. 36A-36N and/or other figures.

In FIG. 41A, a readout circuit wafer 4100 (e.g., ROIC wafer) is provided. The readout circuit wafer 4100 includes a substrate 4101, an overglass layer 4102, and a metal layer 4103. Bolometer processing is performed on the readout circuit wafer 4100 to form a bolometer that is coupled to the readout circuit wafer 4100. An example of bolometer processing is described with reference to FIGS. 41B through 41T. In FIG. 41B, pads 4104 are disposed on the readout circuit wafer 4100. The pads 4104 may form part of one or more metal layers. In FIG. 41C, a release layer 4106 is disposed on the dielectric layer 4102 and on the pads 4104, and a protection layer 4108 is disposed on the release layer 4106. In some aspects, one or more alignment marks may be etched in the protection layer 4108 (e.g., to facilitate alignment for bolometer processing using one or more masks). In FIG. 41D, a metal layer 4112 (e.g., metal absorber layer) is disposed on the protection layer 4108, and a dielectric layer 4114 (e.g., $Si_3N_4/SiO_2$) is disposed on the metal layer 4112. In FIG. 41E, the protection layer 4108, the metal layer 4112, and the dielectric layer 4114 are etched. Patterning may include depositing a photoresist layer and exposing the photoresist layer appropriate to define portions of the protection layer 4108, the metal layer 4112, and the dielectric layer 4114 to be etched. A block 4116 may identify a portion of the layers 4108, 4112, and 4114 that remain after etching. In some cases, the block 4116 may represent a mask material utilized to facilitate patterning and etching to obtain the layers 4108, 4112, and 4114 as shown in FIG. 41E.

In FIG. 41F, a dielectric layer 4118 (e.g., thin film oxide layer) and a metal layer 4120 are disposed, and the metal layer 4120 is etched. Blocks 4121 may identify portions of the metal layer 4120 that remain after etching. In some cases, the blocks 4121 may represent mask material utilized to facilitate patterning and etching to obtain the metal layer 4120 as shown in FIG. 41F. In FIG. 41G, a dielectric layer 4122 (e.g., thin film oxide layer), a resistive layer 4124 (e.g., VOx layer), and a dielectric layer 4126 are disposed. The dielectric layer 4122 is in contact with the dielectric layer 4118, the metal layer 4120, and the resistive layer 4124. The dielectric layer 4126 is in contact with the resistive layer 4124. In FIG. 41H, the resistive layer 4124 and the dielectric layer 4126 are etched. Such an etch may help define a bridge portion of the bolometer to be formed. A block 4128 may identify portions of the resistive layer 4124 and the dielectric layer 4126 that remain after etching. In some cases, the blocks 4128 may represent mask material utilized to facilitate patterning and etching to obtain the resistive layer 4124 and the dielectric layer 4126 as shown in FIG. 41H. The block 4128 may be considered as defining a sensing portion of a bridge and a non-sensing portion of the bridge. In FIG. 41I, one or more patterning operations and etching operations are performed to remove (e.g., etch) the release layer 4106, the dielectric layer 4118, and the dielectric layer 4122 to form a trench 4132 down to the readout circuit wafer 4100. In an aspect, a process of defining the trench 4132 (and, in some cases, trenches associated with other pixels of the bolometer) may be referred to as a reticulation pattern. A block 4130 may identify portions of the layers 4122, 4118, and 4106 to be removed to form the trench 4132.

In FIG. 41J, a contact metal layer 4134 is disposed. The contact metal layer 4434 is disposed on at least one of the pads 4104 (e.g., left pad in FIG. 41J) to couple the bridge portion of the bolometer to the readout circuit wafer 4100. The contact metal layer 4134 is in contact with the release layer 4106, the dielectric layer 4118, the dielectric layer 4122, and at least one of the pads 4104. The contact metal layer 4134 is utilized to form a contact basket. In FIG. 41K, the contact metal layer 4134 is etched to expose the dielectric layer 4126 and 4122. A block 4136 may identify a portion of the contact metal layer 4134 that is removed by etching. In some cases, the block 4136 may represent mask material utilized to facilitate patterning and etching to obtain the contact metal layer 4134 as shown in FIG. 41K. In FIG. 41L, a dielectric layer 4138 is disposed. In FIG. 41M, the dielectric layer 4138 is etched. A block 4140 may identify a portion of the dielectric layer 4138 that remains after etching. In some cases, the block 4140 may represent mask material utilized to facilitate patterning and etching to obtain the dielectric layer 4138 as shown in FIG. 41M. In FIG. 41N, the contact metal layer 4134 is etched. A block 4142 may identify a portion of the contact metal layer 4134 that remains after etching. In some cases, the block 4142 may represent mask material utilized to facilitate patterning and etching to obtain the contact metal layer 4134 as shown in FIG. 41N.

In FIG. 41O, the dielectric layer 4138, the dielectric layer 4126, and the resistive layer 4124 are etched to expose the resistive layer 4124. A block 4144 may identify a portion of the layers 4138, 4126, and 4124 that is removed after etching. In some cases, the block 4144 may represent mask material utilized to facilitate patterning and etching to obtain the layers 4138, 4126, and 4124 as shown in FIG. 41O. In FIG. 41P, a leg metal layer 4146 is disposed. In FIG. 41Q, the leg metal layer 4146 is etched. Blocks 4148 may identify portions of the leg metal layer 4146 that remain after etching. In some cases, the blocks 4148 may represent mask material utilized to facilitate patterning and etching to obtain the leg metal layer 4146 as shown in FIG. 41Q. In FIG. 41R, a dielectric layer 4150 (e.g., thin film layer) is disposed.

In FIG. 41S, portions of the dielectric layer 4112, the dielectric layer 4114, the dielectric layer 4118, the dielectric layer 4122, the metal layer 4120, the leg metal layer 4146, and the dielectric layer 4150 are removed, thus forming a bridge 4153. Blocks 4152 may identify portions of the layers 4112, 4114, 4118, 4122, 4120, 4146, and 4150 that remain after etching. In some cases, the blocks 4152 may represent mask material utilized to facilitate patterning and etching to obtain the layers 4112, 4114, 4118, 4122, 4120, 4146, and 4150 as shown in FIG. 41S. In FIGS. 41T and 42, one or more patterning operations and etching operations are performed and the release layer 4106 removed to form the bolometer of FIG. 41T. The bolometer includes the bridge 4153 and legs 4160 and 4161. The etching operations cause a formation of tails 4154, 4156, and 4158. The etching operations cause a formation of tails 4154, 4156, and 4158 and gaps 4162, 4164, and 4166, respectively, above the tails 4154, 4156, and 4158. In FIGS. 41T and 42, a sensing portion of the bridge 4153 is associated with a region 4170, and a non-sensing portion of the bridge 4153 is associated with a region 4172 surrounding the region 4170. In some embodiments, the bridge 4153 may include a metal layer (e.g., an absorber layer) disposed on the dielectric layer 4126. A cap layer may be disposed on this metal layer.

FIGS. 43A and 43B illustrate views associated with a bolometer 4300 having a bridge 4305, vertical legs 4308 and 4310, and contacts 4315 and 4320, in accordance with an embodiment. FIG. 43A shows a perspective view of the bolometer 4300. FIG. 43B shows a cross-section of the bolometer 4300 along a line 4325. In this regard, the cross-section shows a portion 4330 of the bolometer 4300 along the line 4325. In some embodiments, the bolometer 4300 may be formed using techniques that are the same as or similar to those provided herein. As shown in FIG. 43B, the bolometer 4300 includes a dielectric layer 4335 (e.g., insulator), a metal layer 4340 (e.g., titanium), a dielectric layer 4345 (e.g., insulator), a resistive layer 4350 (e.g., VOx), a leg metal layer 4355 (e.g., titanium, copper), a dielectric layer 4360 (e.g., thin insulator/oxide layer formed of $Si_3N_4$), a dielectric layer 4365 (e.g., $Si_3N_4$), and a dielectric layer 4370 (e.g., $SiO_2$). The dielectric layer 4335 may be referred to as a protection layer.

The metal layer 4340 is disposed on the dielectric layer 4335. The dielectric layer 4345 is disposed on the metal layer 4340. The resistive layer 4350 is disposed on the dielectric layer 4345. The dielectric layer 4370 is disposed on the resistive layer 4350. The leg metal layer 4355 is disposed on the resistive layer 4350. The dielectric layer 4360 is disposed on the leg metal layer 4355. The dielectric layer 4370 is in contact with the leg metal layer 4355 and the resistive layer 4350. The contact 4315 includes a basket fill layer 4375, the leg metal layer 4355, the dielectric layer 4365, the dielectric layer 4345, the cap layer 4335, and a leg metal layer 4380. The contact 4320 includes a basket fill layer 4385, the metal layer 4355, the dielectric layer 4365, the dielectric layer 4345, the cap layer 4335, and a leg metal layer 4390. The basket fills layers 4375 and 4385 may be made, for example, of aluminum. The leg metal layers 4380 and 4390 may be made, for example, of titanium, tungsten, copper, or other metals.

The dielectric layers 4365 and 4345 may be utilized as passivation in the contacts 4315 and 4320. Although FIG. 43A shows the contacts 4315 and 4320 as basket-shaped contacts, in other embodiments, differently shaped contact and/or different types of contacts, such as stud contacts, may be utilized to implement the contacts 4315 and/or 4320.

In some aspects, as shown in FIG. 43B, etching operations performed to obtain the bolometer 4300 form tails 4391 and 4393 of the dielectric layer 4335. In this regard, the tails 4391 and 4393 remain after etching, whereas portions of the metal layer 4340 (previously disposed on the tails 4391 and 4393 prior to being etched out) have been removed to form gaps 4392 and 4394 above the tails 4391 and 4393.

The resistive layer 4350 is coupled to the contacts 4315 and 4320 via the vertical legs 4308 and 4310. In this regard, the leg metal layer 4355 of the vertical legs 4308 and 4310 are in contact with the resistive layer 4350. By way of non-limiting examples, the resistive layer 4350 may include VOx, TiOx, or amorphous silicon. The vertical legs 4308 and 4310 connect to the bridge 4305 and the contacts 4315 and 4320. The leg metal layers 4380 and 4390 of the contacts 4315 and 4320, respectively, are connected to a substrate (e.g., of an ROIC). As such, the bridge 4305 is coupled to the substrate via the vertical legs 4308 and 4310 and the contacts 4315 and 4320. The contacts 4315 and 4320 may contact (e.g., physically contact) a metal layer of the substrate. In some cases, the substrate may have an overglass layer formed thereon.

As non-limiting examples, a thickness of the cap layer 4335, the metal layer 4340, the dielectric layer 4345, the resistive layer 4350, the metal layer 4355, the dielectric layer 4360, the dielectric layer 4370, and the dielectric layer 4365 is 250 Å, 300 Å, 750 Å, 600 Å, 300 Å, 300 Å, 300 Å, and 500 Å, respectively. A distance D is a distance between a bottom side of the cap layer 4335 and a bottom side of the leg metal layer 4390. A non-limiting example of the distance D may be around 1.5 μm. As non-limiting examples, a width W and a height H of a vertical leg may be around 0.24 μm and 0.25 μm, respectively.

Figure 44A:
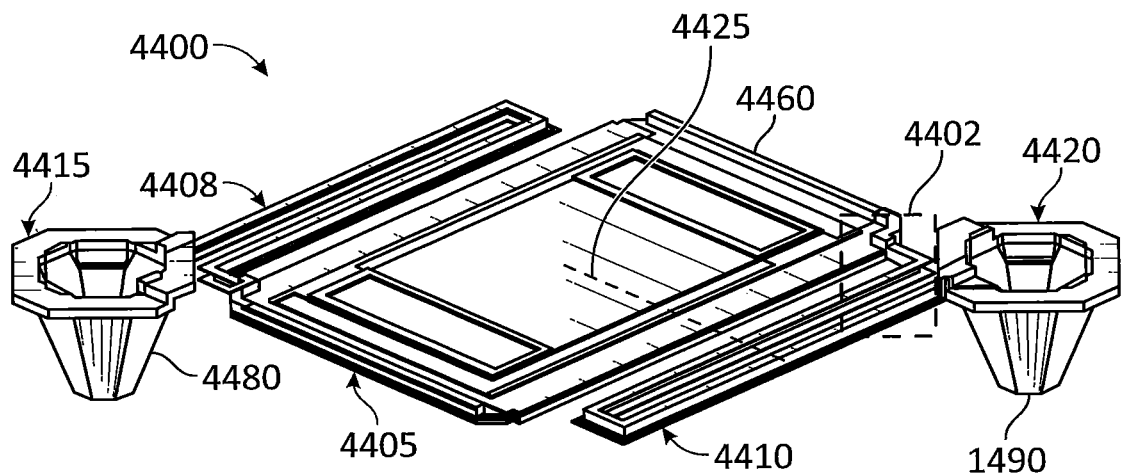
FIGS. 44A through 44E illustrate various views associated with another bolometer in accordance with an embodiment.
Figure 44B:
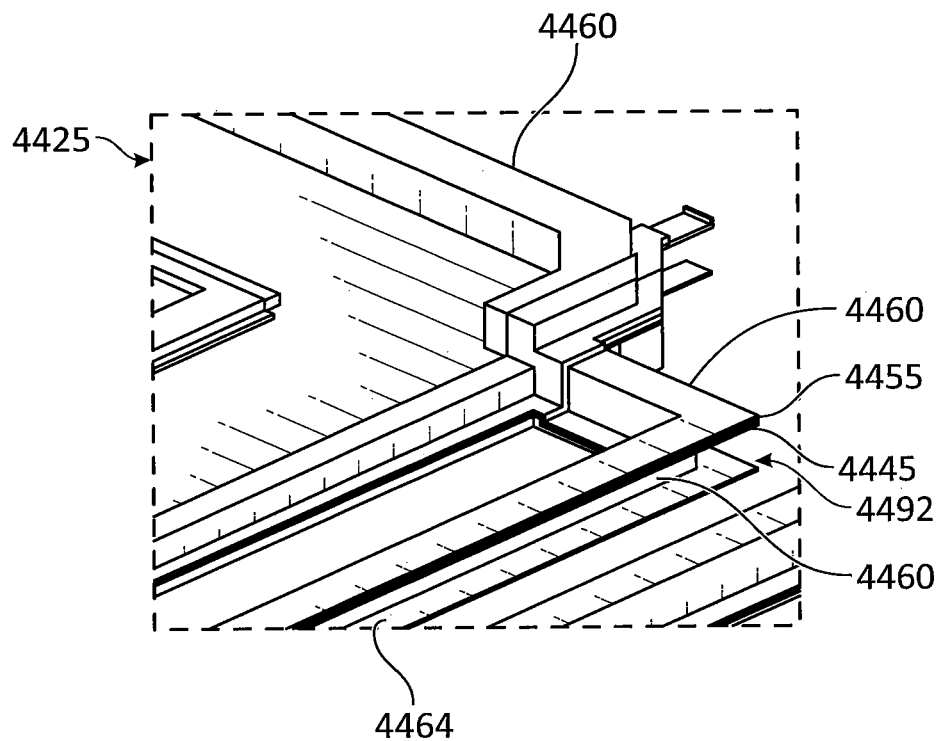
Figure 44C:
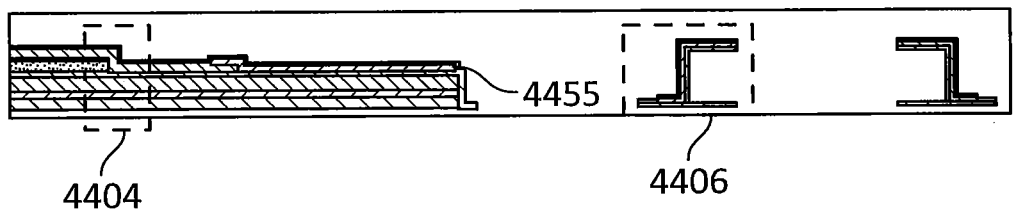
Figure 44D:
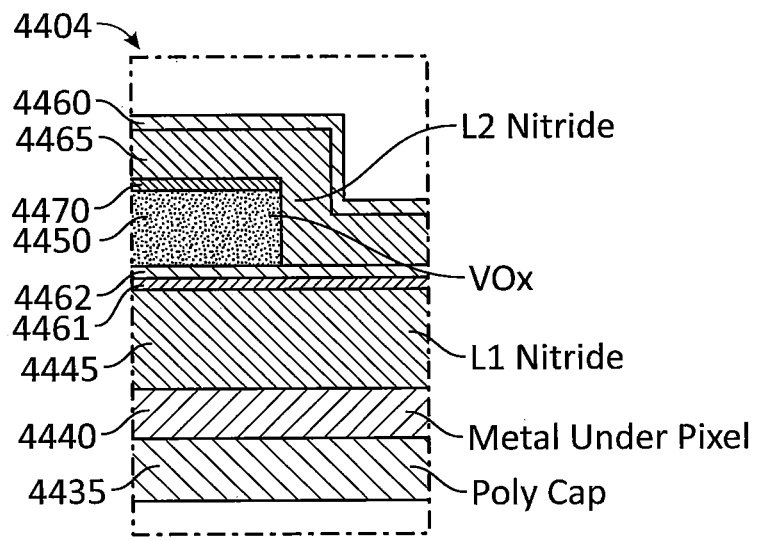
Figure 44E:
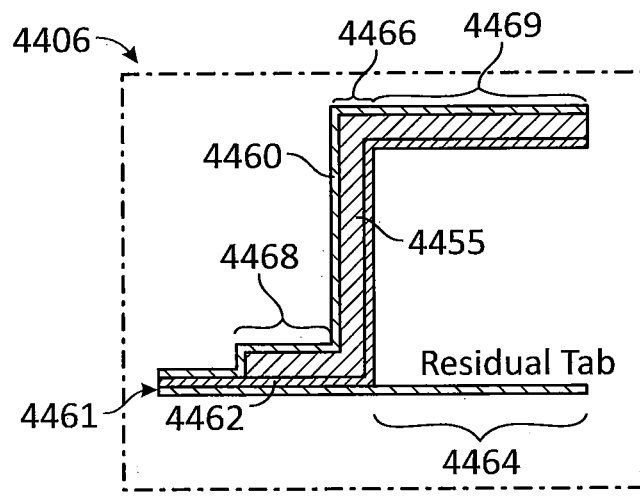

FIGS. 44A through 44E illustrate various views associated with a bolometer 4400 having a bridge 4405, vertical legs 4408 and 4410, and contacts 4415 and 4420, in accordance with an embodiment. FIG. 44A shows a perspective view of the bolometer 4400. FIG. 44B shows a zoomed-in view of a portion 4424 of the bolometer 4400. The portion 4424 shows a connection of the vertical leg 4410 to the bridge 4405. FIG. 44C shows a side-view cross-section of the bolometer 4400 along a line 4425. FIG. 44D shows a zoomed-in view of a portion 4404 of the side-view cross-section of FIG. 44C. FIG. 44E shows a zoomed-in view of a portion 4406 of the side-view cross-section of FIG. 44C. The bolometer 4400 includes a cap layer 4435

The bolometer 4400 includes a cap layer 4435 (e.g., a poly cap), a metal layer 4440 (e.g., titanium), a dielectric layer 4445 (e.g., $Si_3N_4$), a dielectric layer 4460, a dielectric layer 4461, a dielectric layer 4462, a resistive layer 4450 (e.g., VOx), a leg metal layer 4455 (e.g., titanium), a dielectric layer 4465 (e.g., $Si_3N_4$), and a dielectric layer 4470 (e.g., VOx cap formed of $SiO_2$). In an aspect, the dielectric layers 4460, 4461, 4462, and 4460 may be a thin dielectric layer, such as a thin layer of $Si_3N_4$. The contact 4415 includes a basket liner layer 4480. The contact 4420 includes a basket liner layer 4490.

At the portion 4404 of the bridge 4405, the cross-sectional views of FIGS. 44C and 44D show that the metal layer 4440 is disposed on the cap layer 4435. The dielectric layer 4445 is disposed on the metal layer 4440. The dielectric layer 4461 is disposed on the dielectric layer 4445. The dielectric layer 4462 is disposed on the dielectric layer 4461. The resistive layer 4450 is disposed on the dielectric layer 4462. The dielectric layer 4470 is disposed on the resistive layer 4450. The dielectric layer 4465 is disposed on the dielectric layer 4470 and the dielectric layer 4462. The dielectric layer 4460 is disposed on the dielectric layer 4465.

At the portion 4406 of the vertical leg 4410, the cross-sectional views of FIGS. 44C and 44E (and also FIG. 45F further described below) show the dielectric layer 4462 is disposed on the dielectric layer 4461. The leg metal layer 4455 is disposed on the dielectric layer 4462 and is surrounded on at least two opposite sides by the dielectric layers 4460 and 4462. The vertical leg 4410 has a tail 4464 of the dielectric layer 4461. A gap 4492 is between the tail 4464 and a side of the dielectric layer 4462, such that the tail 4464 faces the dielectric layer 4462. In some aspects, as shown for example in FIGS. 44A and 44B, a ridge or step may be formed in the dielectric layer 4460 that is formed from an attachment of the leg 4410 to the bridge 4405 which adds structural support to the bridge 4405. In this regard, various steps may be included in the bridge 4405 to improve structural integrity of the bridge 4405.

As shown for example in FIG. 44E, the vertical leg 4410 has a s-shaped (e.g., also considered z-shaped or serpentine-shaped) cross section formed of the leg metal layer 4455 surrounded by (e.g., passivated by) the dielectric layers 4460 and 4462, with the tail 4464 forming a residual tab of the dielectric layer 4461. In this regard, the vertical leg 4410 has a bottom horizontal segment 4468, a top horizontal segment 4469, and a middle vertical segment 4466 between (e.g., adjacent to) the bottom horizontal segment 4468 and the top horizontal segment 4469 that collectively define the s-shaped cross section. The bottom horizontal segment 4468 is substantially perpendicular to the middle vertical segment 4466 and substantially parallel to the top horizontal segment 4469. The top horizontal segment 4469 is substantially perpendicular to the middle vertical segment 4466. In some aspects, two segments/portions may be referred to as being substantially perpendicular if an angle between the segments/portions is within ±10° of 90°. In some aspects, two segments/portions may be referred to as being substantially parallel if an angle between the segments/portions is within ±10° of 0°.

The dielectric layer 4460 is formed on a first sidewall of the leg metal layer 4455 and a first side of the leg metal layer 4455. The dielectric layer 4462 is formed on a second sidewall of the leg metal layer 4455 and a second side of the leg metal layer 4455. The first sidewall is opposite the second sidewall and the first side is opposite the second side. The first sidewall is substantially perpendicular to the first side. The second sidewall is substantially perpendicular to the second side. The vertical leg 4406 (e.g., each of its segments) has a first dimension that extends in a first direction that is substantially perpendicular to a plane defined by a surface of a substrate (e.g., the substrate 4101) and a second dimension that extends in a second direction that is substantially parallel to the plane. In some aspects, as shown at least in FIGS. 44C and 44E, in the middle vertical segment 4466, the first dimension (e.g., dimension along the z-direction) of the vertical leg 4406 is greater than the second dimension (e.g., dimension along the x- or y-direction) of the vertical leg 4406. In this regard, in the middle vertical segment 4465, the first dimension of the leg metal layer 4455 is greater than the second dimension of the leg metal layer 4455, the first dimension of the dielectric layer 4460 is greater than the second dimension of the dielectric layer 4460, and the first dimension of the dielectric layer 4462 is greater than the second dimension of the dielectric layer 4462. In the bottom horizontal segment 4468 and the top horizontal segment 4469, the first dimension of the vertical leg 4406 is less than the second dimension of the vertical leg 4406. In this regard, the first dimension of the leg metal layer 4455, the dielectric layer 4460, and the dielectric layer 4462 is less than the second dimension of the leg metal layer 4455, the dielectric layer 4460, and the dielectric layer 4462, respectively.

Figure 45A:
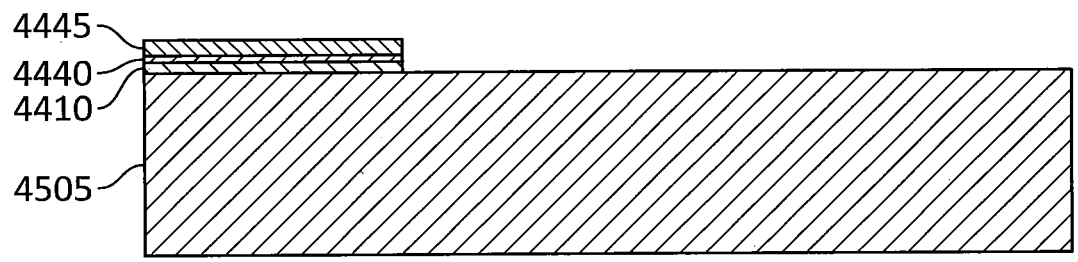
FIGS. 45A through 45F illustrate cross-sectional side views associated with an example process for forming a bolometer in accordance with an embodiment.
Figure 45B:
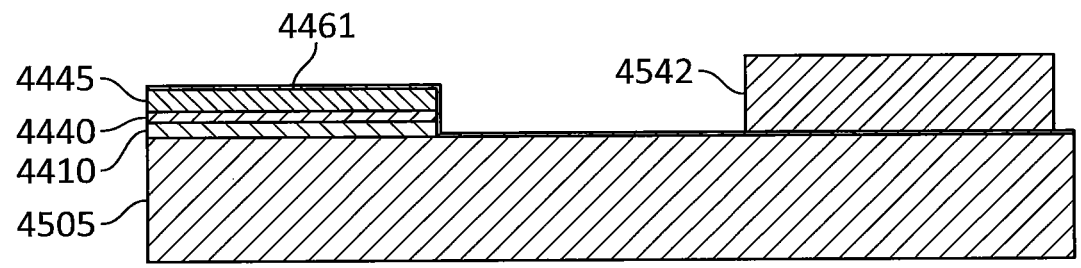
Figure 45C:
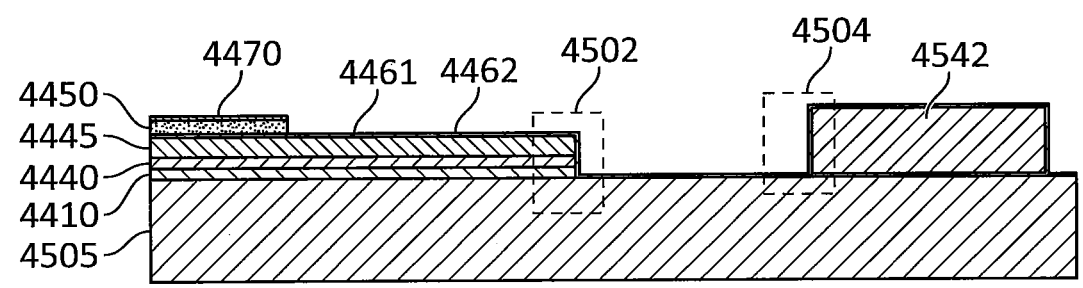
Figure 45D:
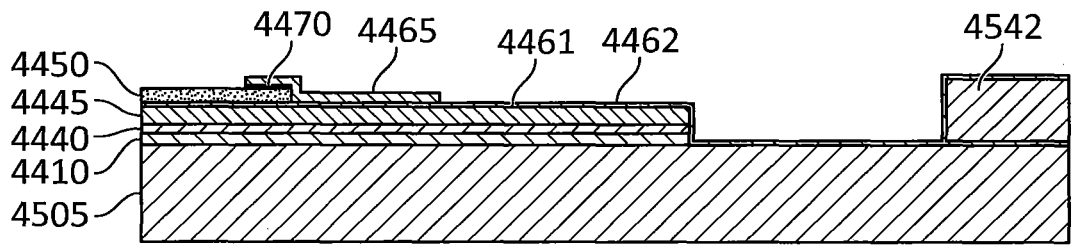
Figure 45E:
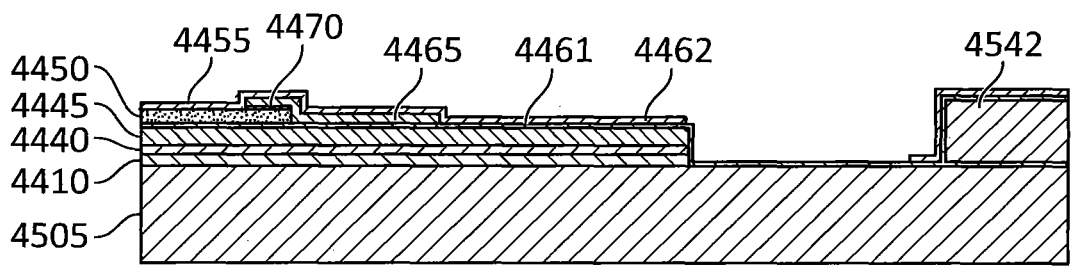
Figure 45F:
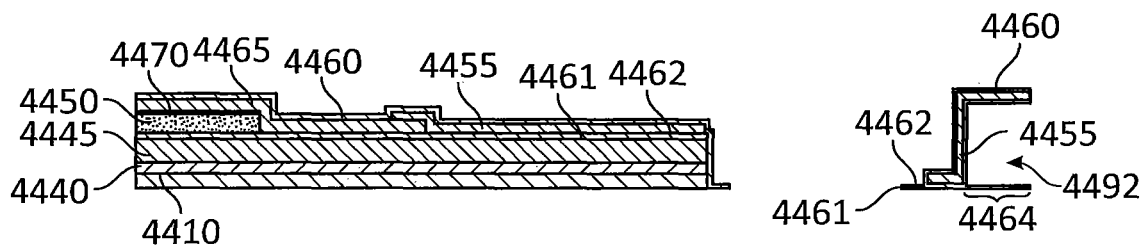
Figure 46A:
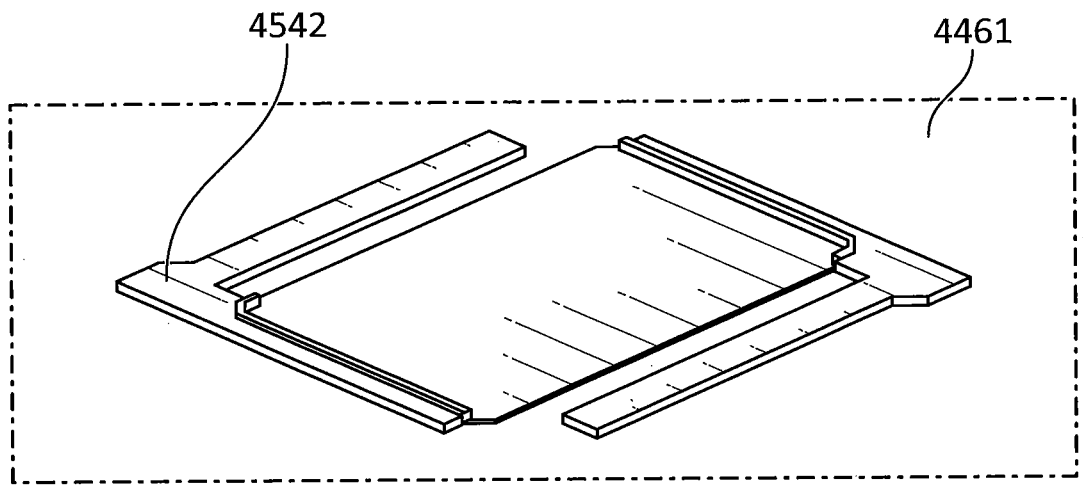
FIGS. 46A through 46F illustrate top-views associated with the example process of FIGS. 45A through 45F in accordance with an embodiment.
Figure 46B:
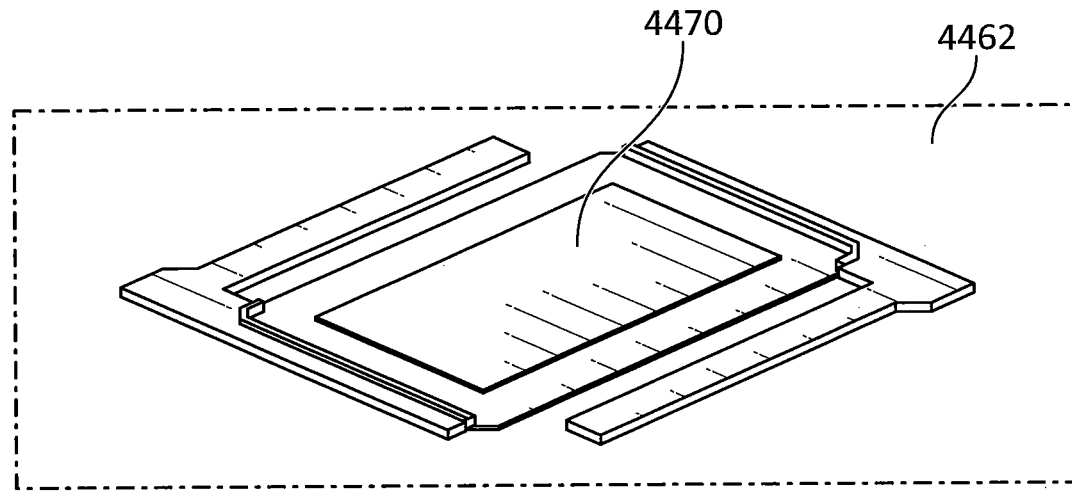

FIGS. 45A through 45F illustrate cross-sectional side views associated with an example process for forming the bolometer 4400 in accordance with an embodiment. FIGS. 46A through 46F illustrate top-views associated with the example process in accordance with an embodiment. The cross-sectional side-views are along the line 4425 of FIG. 44A. In FIG. 45A, a release layer 4505 (e.g., polyimide) is deposited (e.g., on a substrate (not shown in FIG. 45A)). The cap layer 4435 is deposited on the release layer 4505, the metal layer 4440 is deposited on the cap layer 4435, and the dielectric layer 4445 is deposited on the metal layer 4440. In FIGS. 45B and 46A, the dielectric layer 4461 is disposed (e.g., using thin sheet film deposition). A metal layer 4542 (e.g., a sacrificial metal layer) is disposed on the dielectric layer 4461 and etched. In FIGS. 45C and 46B, the dielectric layer 4462 is disposed (e.g., using thin sheet film deposition) on the dielectric layer 4461 and the metal layer 4542. The resistive layer 4450 is deposited on the dielectric layer 4462 and patterned/etched. The dielectric layer 4470 is disposed on the resistive layer 4450. A zoom-in view of portions 4502 and 4504 of FIG. 45C is shown in FIGS. 47A and 47B.

Figure 46C:
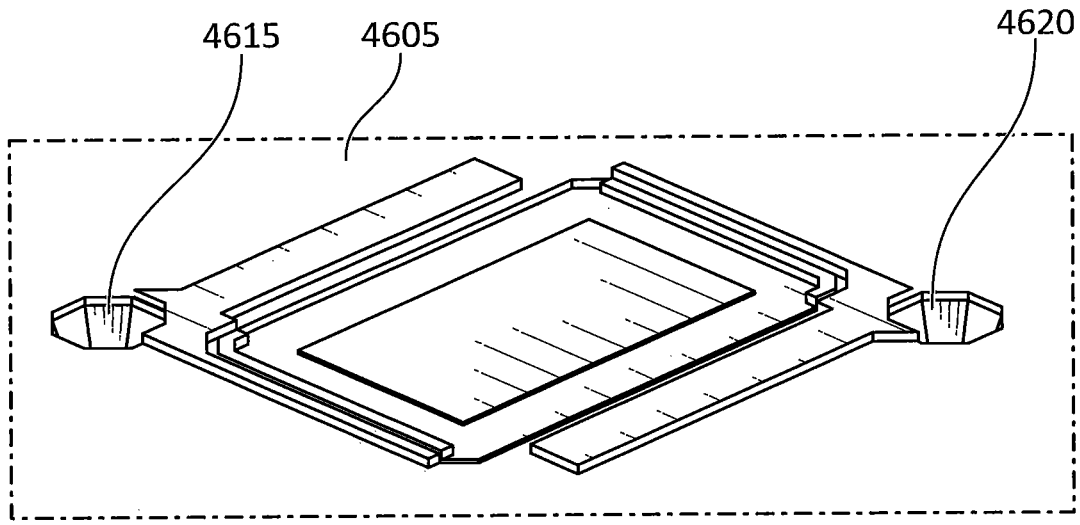
Figure 46D:
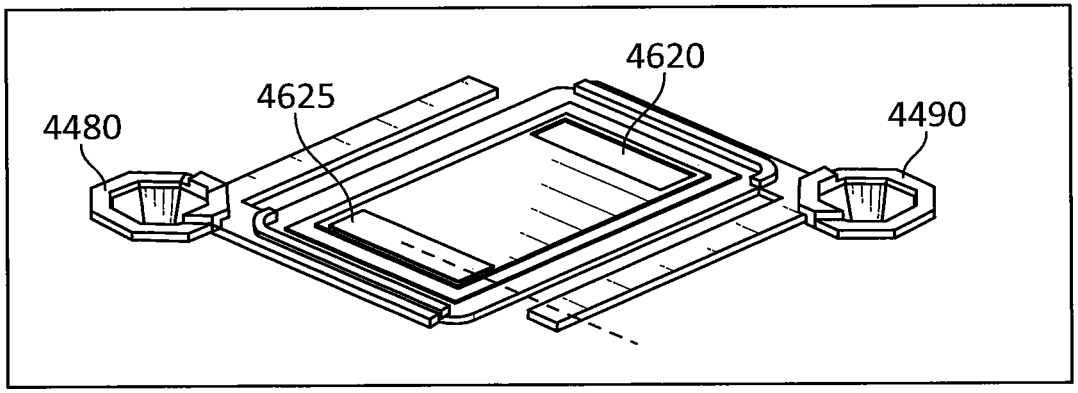
Figure 46E:
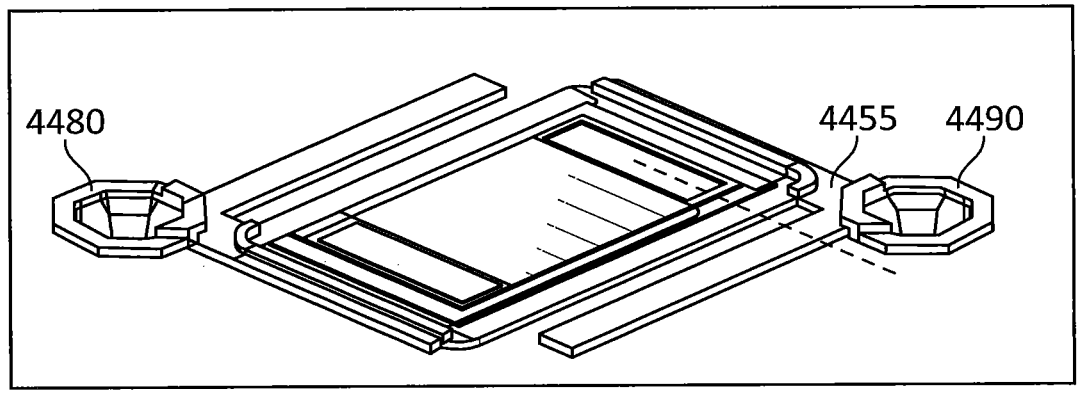
Figure 47A:
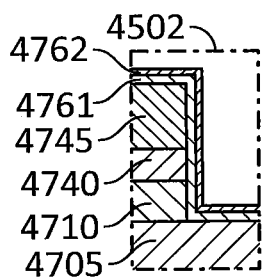
FIGS. 47A and 47B illustrate zoom-in views of portions identified in FIG. 45C.
Figure 47B:
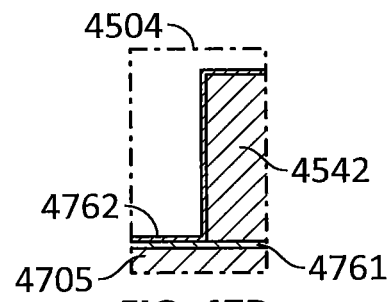

In FIG. 46C, trenches 4615 and 4620 to be utilized to form the contacts 4415 and 4420, respectively, are formed. A metal layer 4605 is deposited and then etched away from a portion that is to form the bridge 4405 of the bolometer 4400. In FIGS. 45D and 46D, the basket liner layers 4480 and 4490 are disposed, and the dielectric layer 4465 is deposited and etched. A basket is patterned and portions 4620 and 4625 are etched. to form contacts for the resistive layer 4450. In FIGS. 45E and 46E, the leg metal layer 4455 is deposited and partially etched off. In this regard, a portion of the leg metal layer 4455 remains on the portions 4620 and 4625 of the resistive layer 4450. The leg metal layer 4455 is disposed on the basket liner layers 4480 and 4490. In FIGS.

Figure 46F:
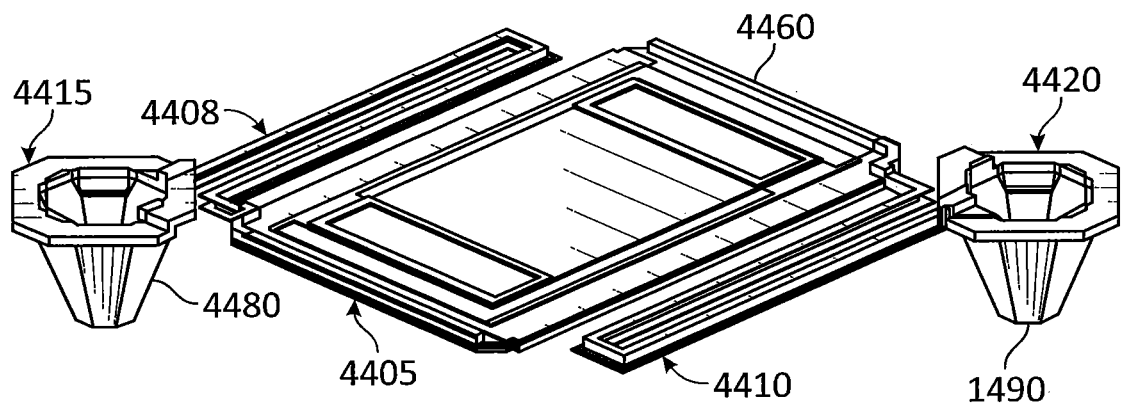

45F and 46F, the dielectric layer 4460 is deposited, the leg metal layer 4455 is cut to form the vertical legs 4408 and 4410, the metal layer 4542 is removed, and the release layer 4505 is removed to release the bridge 4405 and the vertical legs 4408 and 4410. It is noted that FIG. 45F shows a portion of the same cross-sectional side view of FIG. 44C. It is further noted that FIG. 46F shows the same perspective view as FIG. 44A.

In some embodiments, bolometers may have perforations defined through portions of the bolometers that do not contain a resistive layer (e.g., VOx). In some aspects, the perforations defined through a bolometer are along a same plane/layer as the legs and bridge of the bolometer. The perforations may be appropriately sized to reduce thermal mass associated with the bolometers while maintaining the bolometers' infrared sensing capabilities and structural integrity. In this regard, the perforations reduce thermal mass while allowing the bolometers to capture incoming photons having a wavelength component within a desired wavelength range. The reduced thermal mass for faster cooling and faster heating of the bolometers. In some aspects, such bolometers may include vertical legs as described herein for connecting the bridges of the bolometers with the readout circuit (e.g., ROIC). In other aspects, such bolometers do not utilize vertical legs to connect the bridges of the bolometers with the readout circuit.

Figure 48:
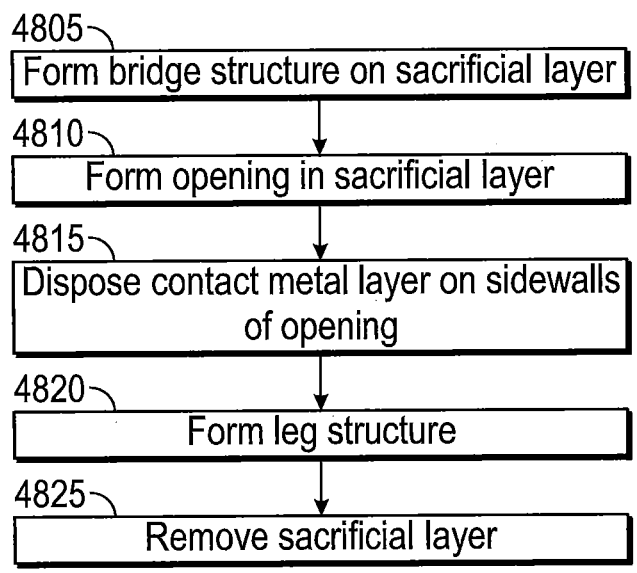
FIG. 48 is a flowchart of illustrative operations that may be performed for forming a bolometer according to an embodiment.

FIG. 48 is a flowchart of illustrative operations that may be performed for forming a bolometer according to an embodiment. In some embodiments, the bolometer may be any one of the bolometers described with respect to, for example, FIGS. 29, 32, 34, 36N, 37, 39D, 40, 41T, 42, 43A, 43B, and 44A-44E. By way of non-limiting example, the flowchart is described with respect to one or more of FIGS. 41A through 41T.

At block 4805, a bridge structure is formed on a sacrificial layer. For example, with reference to FIGS. 41S and 41T, the bridge structure may include the bridge 4153 and the sacrificial layer may include the release layer 4106. The bridge 4153 includes the protection layer 4108, the metal layer 4112 (e.g., metal absorber layer), the dielectric layer 4114, the dielectric layer 4118 (e.g., thin film oxide layer), the dielectric layer 4122 (e.g., thin film oxide layer), the resistive layer 4124, and the dielectric layer 4150 (e.g., thin film layer). In some portions of the bridge 4153, the leg metal layer 4146 is disposed on the resistive layer 4124 (e.g., to facilitate coupling of the bridge 4153 to the substrate 4101 via the legs 4160). In some portions of the bridge 4154, a cap layer (e.g., VOx cap) is disposed on the resistive layer 4124.

At block 4810, an opening is formed in the sacrificial layer. For example, with reference to FIG. 41I, the opening may be the trench 4132. At block 4815, a contact metal layer is disposed on sidewalls of the opening. For example, with reference to FIGS. 41J through 41N, the contact metal layer may be the contact metal layer 4134. As shown in FIGS. 41J through 41N, a layer of contact metal material may be deposited and appropriately etched.

At block 4820, a leg structure is formed. The leg structure couples the bridge structure to the contact metal layer. For example, with reference to FIG. 41T, the leg structure may include the leg 4160 that couples the bridge 4153 to the contact metal layer 4134. The leg 4160 includes the dielectric layer 4118, the dielectric layer 4122, the leg metal layer 4146, and the dielectric layer 4150. Different portions of the leg 4160 may have a z-shaped cross section (e.g., right-most portion of the leg 4160 in FIG. 41T) or an s-shaped cross section (e.g., portion immediately to the left of the right-most portion of the leg 4160 in FIG. 41T). The leg 4160 has tails 4154, 4156, and 4158 and the gaps 4162, 4164, and 4166, respectively, above the tails 4154, 4156, and 4158.

At block 4825, the sacrificial layer is removed to release the bridge structure and the leg structure. After removal of the sacrificial layer, the bridge structure and the leg structure are suspended above the substrate 4101.

It is noted that the flowchart of FIG. 48 illustrates formation of one bolometer. In some cases, one or more additional bolometers may be formed (e.g., formed concurrently) with the formation of the one bolometer. For example, multiple bridge structures may be formed on the sacrificial layer at block 4805, multiple openings may be formed in the sacrificial layers at block 4810, and so forth.

Figure 49:
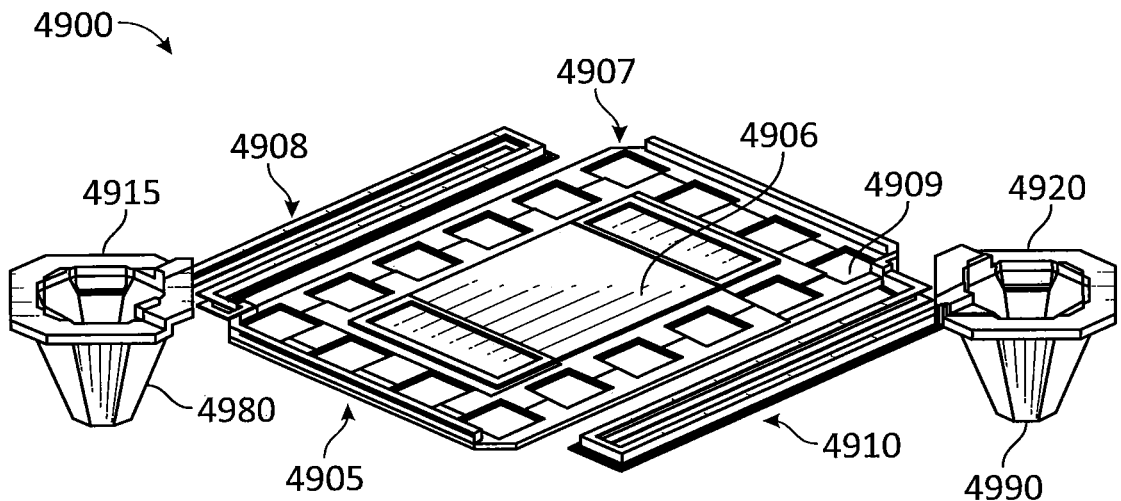
FIG. 49 illustrates a perspective view of a bolometer in accordance with an embodiment.
Figure 50:
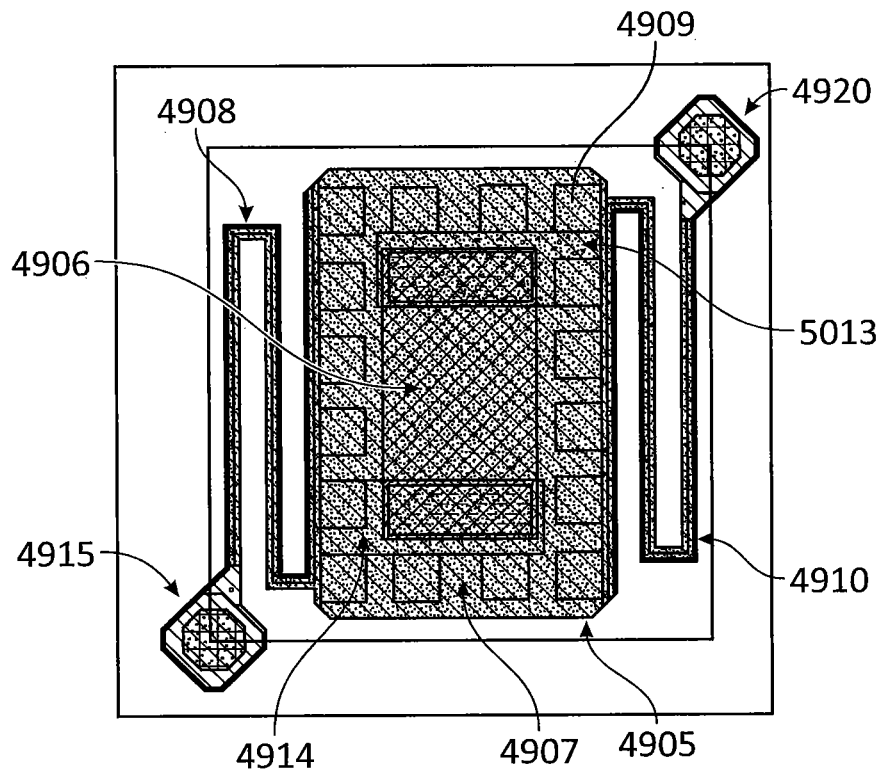
FIG. 50 illustrates a top view of the bolometer of FIG. 49 in accordance with an embodiment.

FIG. 49 illustrates a perspective view of a bolometer 4900 in accordance with an embodiment. FIG. 50 illustrates a top view of the bolometer 4900 in accordance with an embodiment. The dielectric layer 4906 may be a thin film layer formed of $Si_3N_4$. The bolometer 4900 includes a bridge 4905, vertical legs 4908 and 4910, and contacts 4915 and 4920. The bridge 4905 includes a sensing portion 4906 and a remaining portion 4907 (e.g., also referred to as anon-sensing portion). The sensing portion 4906 is a portion of the bridge 4905 that includes a resistive layer (e.g., VOx layer). The remaining portion 4907 is a portion of the bridge 4805 that does not include the resistive layer. The remaining portion 4907 surrounds the sensing portion 4906. The remaining portion 4907 has perforations defined herein, of which a perforation 4909 is labeled. The vertical leg 4908 connects to the sensing portion 4906 of the bridge 4905 via a leg/bridge contact 5014. The vertical leg 4910 connects to the sensing portion 4906 of the bridge 4905 via a leg/bridge contact 5013. The contact 4915 includes a basket liner layer 4980. The contact 4920 includes a basket liner layer 4990.

Figure 51A:
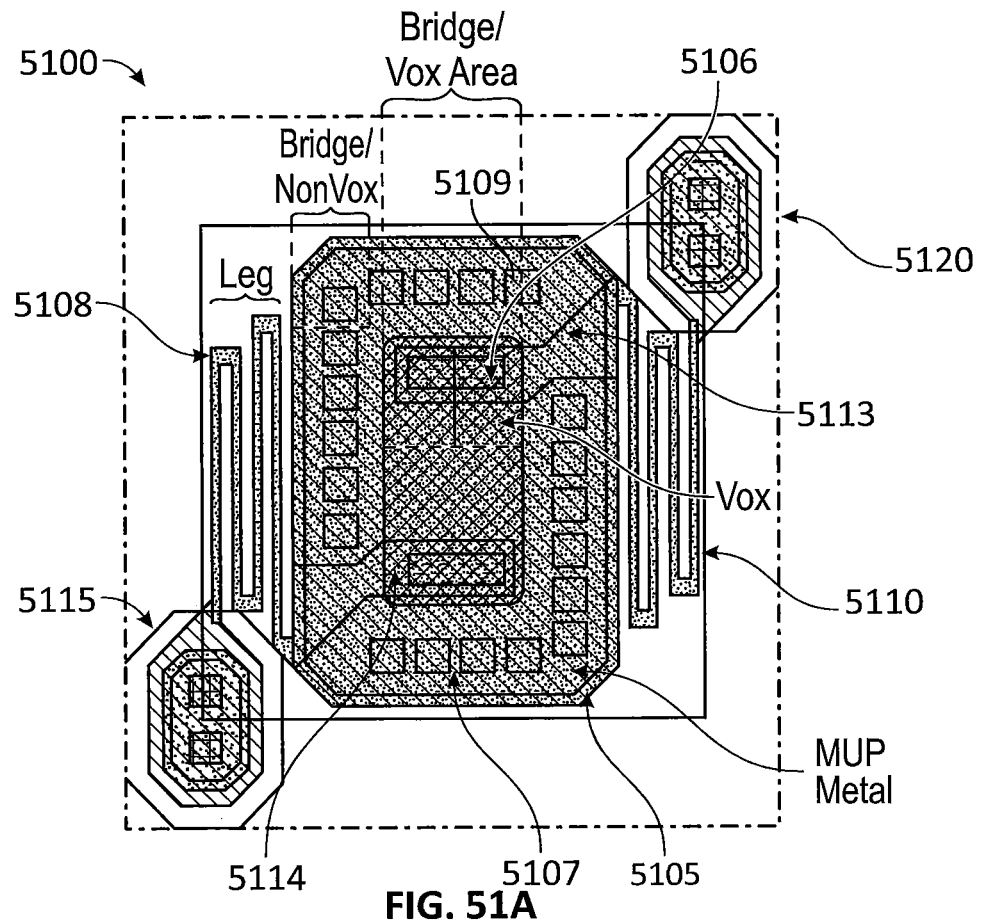
FIGS. 51A through 51C illustrate additional examples of bolometers in accordance with one or more embodiments.
Figure 51B:
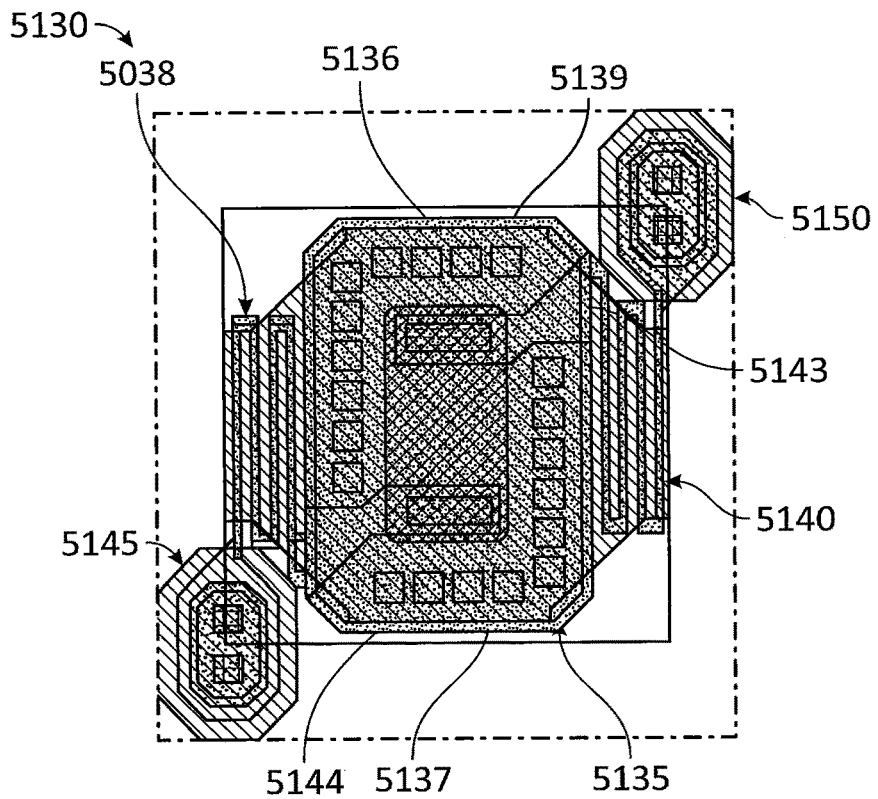
Figure 51C:
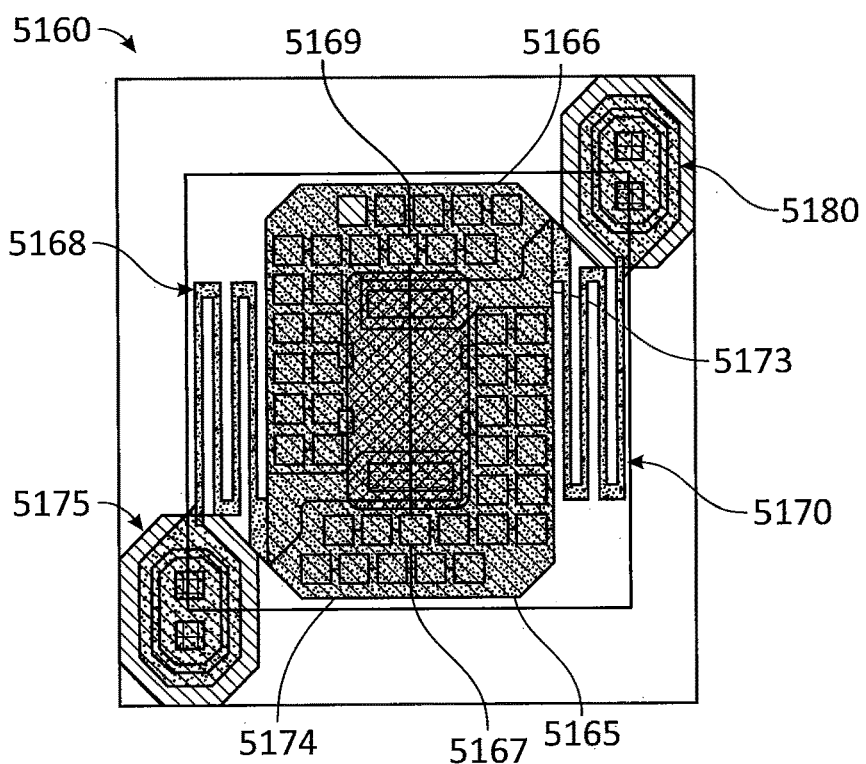

FIGS. 51A through 51C illustrate additional examples of bolometers in accordance with one or more embodiments. In particular, FIGS. 51A, 51B, and 51C illustrate a top view of a bolometer 5100, 5130, and 5160, respectively. The bolometer 5100 of FIG. 51A includes a bridge 5105 with a sensing portion 5106 and a non-sensing portion 5107, vertical legs 5108 and 5110, leg/bridge contacts 5113 and 5114, and contacts 5115 and 5120. The non-sensing portion 5107 includes perforations, of which a perforation 5109 is labeled. The bolometer 5130 of FIG. 51B includes a bridge 5135 with a sensing portion 5136 and anon-sensing portion 5137, vertical legs 5138 and 5140, leg/bridge contacts 5143 and 5144, and contacts 5145 and 5150. The non-sensing portion 5137 includes perforations, of which a perforation 5139 is labeled. The bolometer 5160 of FIG. 51C includes a bridge 5165 with a sensing portion 5166 and anon-sensing portion 5167, vertical legs 5168 and 5170, leg/bridge contacts 5173 and 5174, and contacts 5175 and 5170. The non-sensing portion 5167 includes perforations, of which a perforation 5169 is labeled.

As shown in FIGS. 50 and 51A-51C, bolometers may have structural characteristics that may be varied to obtain desired performance. As non-limiting examples, such structural characteristics include a number of bends in a leg (e.g., a vertical leg), dimensions of a leg, materials utilized to form the leg, a number of perforations in anon-sensing portion of a bridge, and an arrangement of the perforations.

Figure 52:
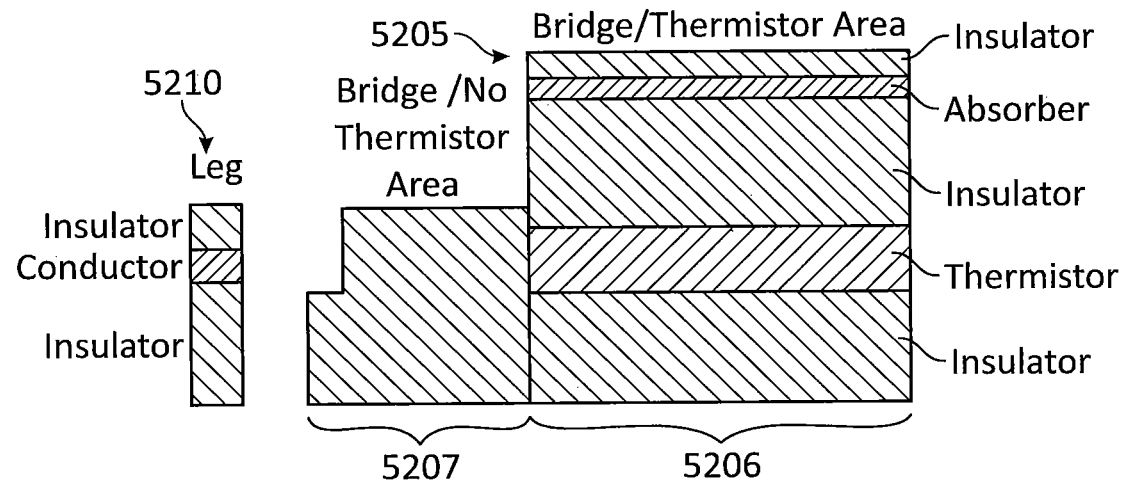
FIG. 52 illustrates a cross-sectional side view of a portion of a bolometer in accordance with an embodiment.
Figure 53:
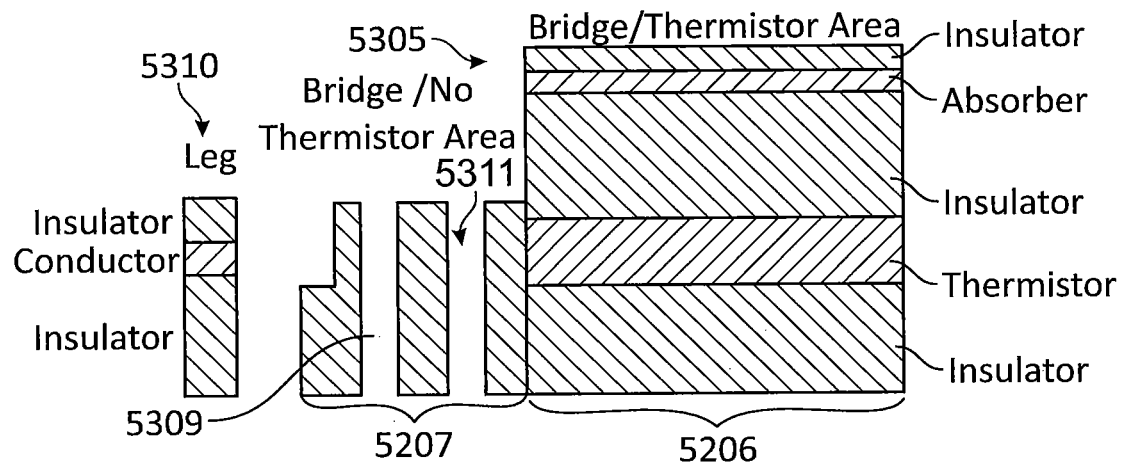
FIG. 53 illustrates a cross-section side view of a portion of a bolometer having perforations defined therein in accordance with an embodiment.

FIG. 52 illustrates a cross-sectional side view of a portion of a bolometer in accordance with an embodiment. The bolometer includes a bridge 5205 and a leg 5210 coupled to the bridge 5205. The bridge 5205 includes a sensing portion 5206 having a thermistor, and a non-sensing portion 5207 that does not have a thermistor (e.g., VOx). FIG. 53 illustrates a cross-sectional side view of a portion of a bolometer having perforations defined therein in accordance with an embodiment. The bolometer includes a bridge 5305 and a leg 5310 coupled to the bridge 5305. The bridge 5305 includes a sensing portion 5306 having a thermistor, and anon-sensing portion 5307 that does not have a thermistor. The thermistor may be disposed on a first insulator. A second insulator may be disposed on the thermistor. An absorber layer may be disposed on the second insulator. A third insulator may be disposed on the metal layer. Each of the first insulator, second insulator, or third insulator may include one or more insulator layers. Alternatively or in addition to the absorber layer shown in FIG. 53, an absorber layer may be disposed between insulator layers of the first insulator.

Perforations 5309 and 5311 are formed in the non-sensing portion 5307. The perforations 5309 and 5311 may be formed using one or more etching operations. In some aspects, each etching operation may be implemented using a different etch chemistry (e.g., dependent on the material to be etched). In some embodiments, the bolometer of FIG. 52 may have perforations formed in the non-sensing portion 5207 to arrive at the bolometer of FIG. 53. In one case, each layer of material may be formed such that the layer has perforations defined therein. For example, a first layer of material may be formed with perforations defined therein. A second layer of material may then be formed on the first layer of material, where the second layer of material has perforations defined therein that align appropriately with the perforations of the first layer of material. In another case, the bolometer of FIG. 52 may be formed and then perforations formed through all the insulators of the non-sensing portion 5207.

Figure 54:
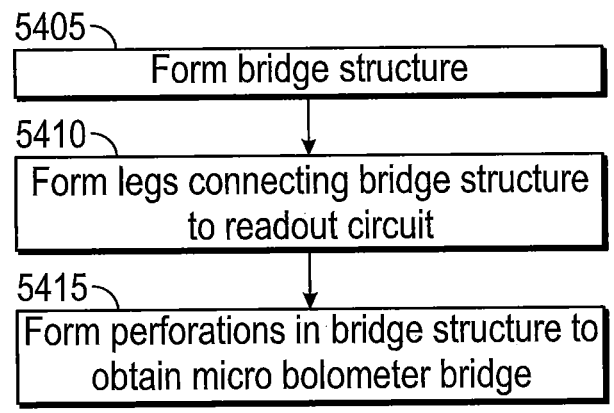
FIG. 54 is a flowchart of illustrative operations that may be performed for forming a bolometer having perforations defined in the bolometer's bridge in accordance with an embodiment.

FIG. 54 is a flowchart of illustrative operations that may be performed for forming a bolometer having perforations defined therein according to an embodiment. In some embodiments, the bolometer may be any one of the bolometers described with respect to, for example, FIG. 49, 51A-51C, and 53.

At block 5405, a bridge structure is formed. In some embodiments, the bridge structure may be formed by performing operations similar to those provided in FIG. 25. In some cases, some or all of the blocks shown in FIG. 25 may be performed to form a bridge structure.

At block 5410, legs for connecting the bridge structure to a readout circuit are formed. In some aspects, the legs are vertical legs as described with reference to one or more embodiments. In some cases, the vertical legs may be formed as the bridge structure is formed. In some embodiments, the legs may be formed by performing operations similar to those provided in one or more of FIGS. 20-22.

At block 5415, perforations are formed in the bridge structure to obtain a microbolometer bridge. The perforations may be formed using one or more etching operations. In some aspects, each etching operation may be implemented using a different etch chemistry (e.g., dependent on the material to be etched). Alternatively, perforations may be formed with each layer. In this case, semiconductor processing techniques are performed to directly form the microbolometer bridge (e.g., without need to form a bridge structure in its entirety without the perforations and then form perforations in the bridge structure). For example, a first layer of material may be formed with perforations defined therein. A second layer of material may then be formed on the first layer of material, where the second layer of material has perforations defined therein that align with the perforations of the first layer of material as appropriate.

Note that one or more operations of FIG. 54 may be combined, omitted, and/or performed in a different order as desired. For example, the bridge structure, the legs, and/or the perforations in the bridge structure may be formed together and/or as separate processing steps.

FIGS. 55A through 55D illustrate cross-sectional side views associated with an example process for forming a bolometer in accordance with an embodiment. FIG. 56 illustrates a top-down view corresponding to the cross-sectional side view of FIG. 55D in accordance with an embodiment. Various features of FIGS. 55A through 55D may be implemented in the same or similar manner as corresponding features of FIGS. 36A-36N and/or other figures.

Figure 55A:
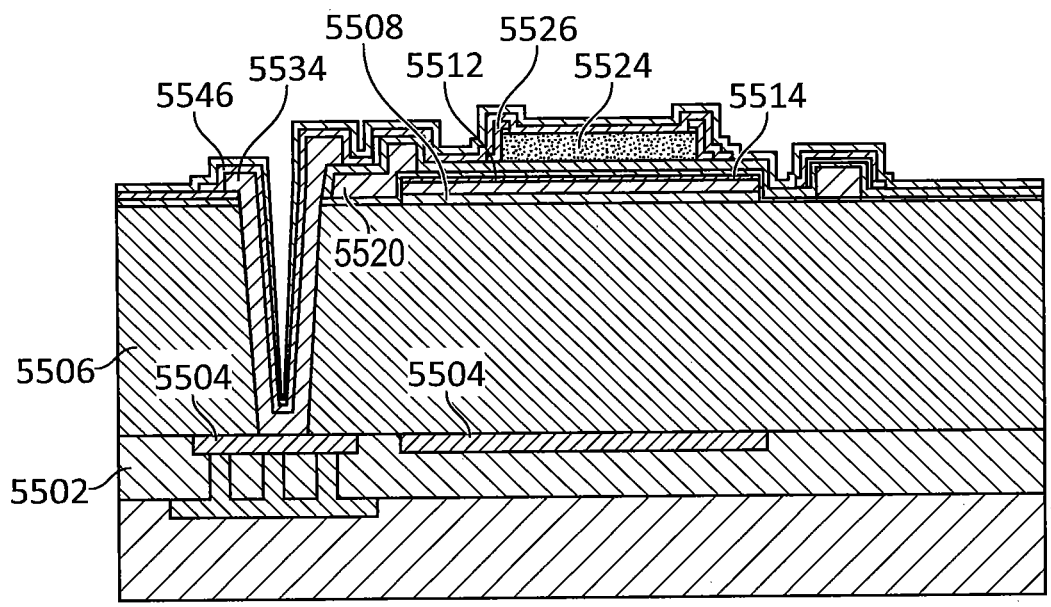
FIGS. 55A through 55D illustrate cross-sectional side views associated with an example process for forming a bolometer in accordance with an embodiment.
Figure 55B:
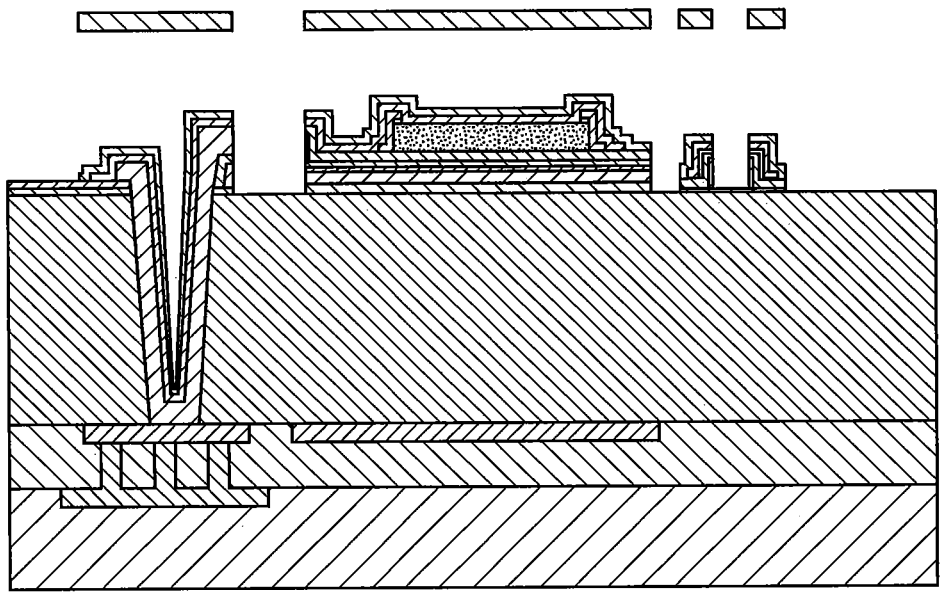
Figure 55C:
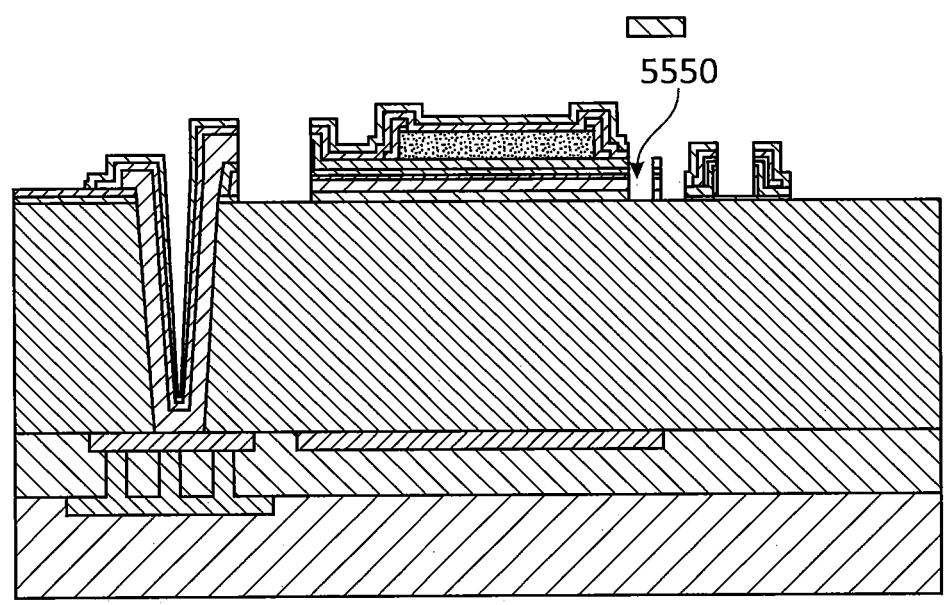
Figure 55D:
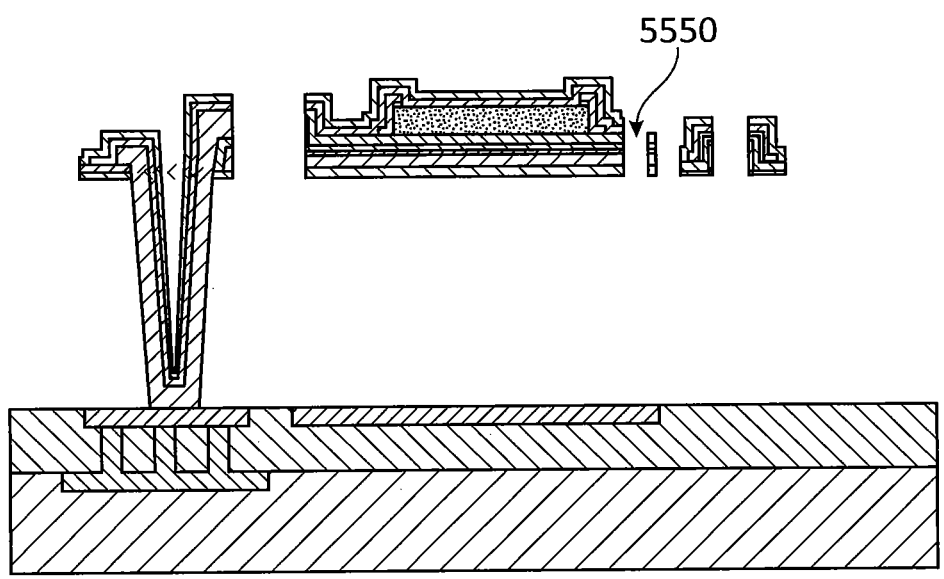
Figure 56:
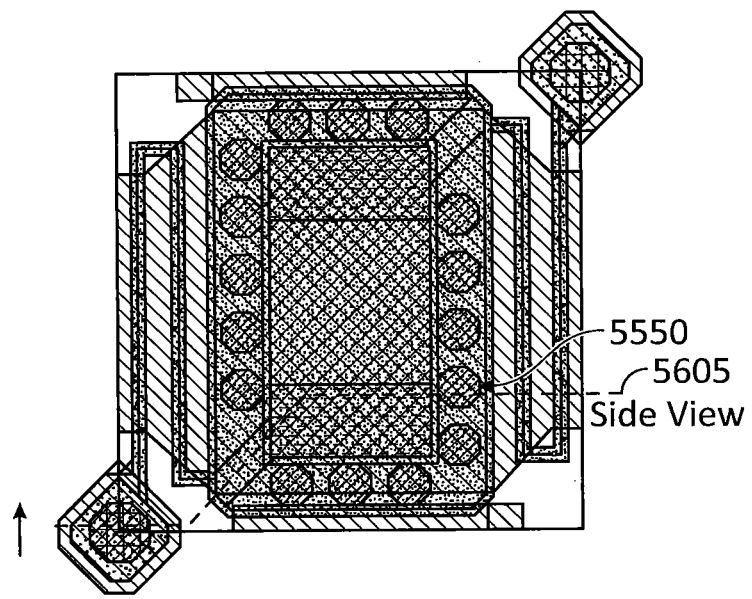
FIG. 56 illustrates a top-down view corresponding to the cross-sectional side view of FIG. 55D in accordance with an embodiment.

In FIG. 55A, the structure includes a substrate, an overglass layer 5602, pads 5604, a release layer 5506, a protection layer 5508, a metal layer 5512, a dielectric layer 5514 (e.g., $Si_3N_4/SiO_2$), a metal layer 5520, a resistive layer 5524 (e.g., VOx layer), a dielectric layer 5526, a contact metal layer 5534, and a leg metal layer 5546. The structure also includes other layers (e.g., dielectric layers) similar to those in FIGS. 36A-36N but not explicitly labeled in FIG. 55A. In FIG. 55B, patterning and etching operations are performed on the structure of FIG. 55A. In FIG. 55C, patterning and etching operations are performed on the structure of FIG. 55B to define perforations in a bolometer bridge (e.g., a non-sensing portion of the bolometer bridge). One example perforation 5550 is shown in FIGS. 55C, 55D, and 56. In FIG. 55D and 56, operations are performed on the structure of FIG. 55C. Such operations remove the release layer and form tails of dielectric layers. It is noted that perforations, including the perforation 5550, is shown as having an octogonal shape. More generally, perforations may be of other shapes, such as other polygonal shapes (e.g., rectangular shaped), circular shapes, and/or others. Each of FIGS. 55A-55D may be cross-sectional side views taken along a line 5605 shown in FIG. 56.

Thus, bolometers are provided in accordance with various embodiments. Using various embodiments, bolometers having various characteristics may be formed as appropriate dependent on application. Various example characteristics are provided as follows. Pixels (e.g., bolometers and associated legs) have appropriate material and structure to provide a flat bolometer (e.g., a flat bridge). A flatter bolometer is better able to avoid deflection (e.g., relative to an initial plane) due to material stresses, avoid stray light, and so forth. An example figure of merit for bolometers may be based on a noise equivalent temperature difference and a thermal time constant. In an aspect, the figure of merit is desired to be low. To achieve a low figure of merit, a thin bridge and a low thermal time constant is desired. In some cases, the figure of merit is proportional to the bridge's thermal mass and independent of a leg thermal conductance.

It is noted that the foregoing describes microbolometers with absorber layers. One or more absorber layers may be provided above a resistive layer, and/or one or more absorber layers may be provided below a resistive layer. An absorber layer may be in contact with a resistive layer, or one or more dielectric layers may intervene between the absorber layer and the resistive layer. In some cases, an enhancing layer may be in contact with an absorber layer. The enhancing layer and the absorber layer may provide enhanced infrared absorption for the microbolometers. By way of non-limiting examples, an enhancing layer may be formed from titanium, titanium oxide, a combination of Ti and TiOx, aluminum, titanium nitride, nickel, iron, zinc, platinum, tantalum, chrome, other transition metals, other metals, alloys of these metals, oxides of these materials, and/or a combination of these metals and their oxides. Examples of microbolometers with absorber layers and/or enhancing layers can be found in U.S. Pat. No. 9,945,729, which is incorporated herein by reference in its entirety.

It is noted that dimensional aspects provided above are examples and that other values for the dimensions can be utilized in accordance with one or more implementations. Furthermore, the dimensional aspects provided above are generally nominal values. As would be appreciated by a person skilled in the art, each dimensional aspect has a tolerance associated with the dimensional aspect. Similarly, aspects related to distances between features provided above are also examples and also have associated tolerances. It is also noted that although the foregoing describes forming of perforations using etching operations, other semiconductor processing techniques appropriate to remove material, such as drilling operations, laser operations, may be performed to form the perforations, as would be understood by one skilled in the art.

Where applicable, various embodiments of the invention may be implemented using hardware, software, or various combinations of hardware and software. Where applicable, various hardware components and/or software components set forth herein may be combined into composite components comprising software, hardware, and/or both without departing from the scope and functionality of the invention. Where applicable, various hardware components and/or software components set forth herein may be separated into subcomponents having software, hardware, and/or both without departing from the scope and functionality of the invention. Where applicable, it is contemplated that software components may be implemented as hardware components and vice-versa.

Software, in accordance with the invention, such as program code and/or data, may be stored on one or more computer readable mediums. It is also contemplated that software identified herein may be implemented using one or more general purpose or specific purpose computers and/or computer systems, networked and/or otherwise. Where applicable, ordering of various steps described herein may be changed, combined into composite steps, and/or separated into sub-steps to provide features described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An infrared imaging device comprising:
   a substrate comprising a plurality of contacts and a surface, wherein the surface defines a plane;
   a microbolometer array coupled to the substrate, wherein the microbolometer array comprises a plurality of microbolometers, and wherein each microbolometer comprises:
   a bridge; and
   a leg structure coupled to the bridge and to one of the plurality of contacts, wherein the leg structure comprises a cross-section having a first section, a second section substantially parallel to the first section, and a third section joining the first section and the second section.

2. The infrared imaging device of claim 1, wherein the third section is substantially perpendicular to the first and second sections, and wherein the leg structure extends between the bridge and the one of the plurality of contacts in a first direction substantially parallel to the plane.

3. The infrared imaging device of claim 1, wherein:
   the third section is at an angle relative to the first and second sections,
   the cross-section is an s-shaped cross-section or a z-shaped cross-section maintained along a first direction substantially parallel to the plane,
   the first section and the second section extend along the first direction and a second direction substantially parallel to the plane, and
   the third section joins the first section and the second section in a third direction that is substantially perpendicular to the plane.

4. The infrared imaging device of claim 1, wherein the leg structure comprises:
   a first segment associated with the first section and having a first dimension that extends in a first direction that is substantially parallel to the plane and a second dimension that extends in a second direction that is substantially perpendicular to the plane, wherein the first dimension is greater than the second dimension;
   a second segment associated with the second section; and
   a third segment associated with the third section and adjacent to the first segment and the second segment, the third segment having a third dimension that extends in the first direction and a fourth dimension that extends in the second direction, wherein the third dimension is less than the fourth dimension.

5. The infrared imaging device of claim 4, wherein:
   each of the first segment, the second segment, and the third segment comprises a respective portion of a first metal layer, a respective portion of a first layer, and a respective portion of a second layer,
   the first layer is formed on a first sidewall of the first metal layer and a first side of the first metal layer,
   the second layer is formed on a second sidewall of the first metal layer and a second side of the first metal layer,
   the first sidewall is opposite the second sidewall, and
   the first side is opposite the second side.

6. The infrared imaging device of claim 5, wherein the first sidewall is substantially perpendicular to the first side, and wherein the third segment has a fifth dimension that extends in the first direction and a sixth dimension that extends in the second direction, and wherein the fifth dimension is greater than the sixth dimension.

7. The infrared imaging device of claim 5, wherein a portion of the first layer and a portion of the second layer are separated by a gap, and wherein the portion of the first layer faces the portion of the second layer.

8. The infrared imaging device of claim 5, further comprising:
   a contact metal layer coupled to the substrate and the leg structure; and
   an overglass layer disposed on the substrate; and
   a pad disposed on the overglass layer and coupled to the one of the plurality of contacts, wherein the contact metal layer is in contact with the pad, wherein a portion of the first metal layer is disposed on the contact metal layer, and wherein a portion of the first layer is disposed on the portion of the first metal layer.

9. The infrared imaging device of claim 5, wherein the first layer is an oxide layer or a dielectric layer, and wherein the second layer is a semiconductor layer or a dielectric layer.

10. The infrared imaging device of claim 1, wherein the bridge comprises:
   a cap layer facing the substrate;
   a first metal layer disposed on the cap layer;
   a resistive layer;
   a first dielectric layer disposed between the first metal layer and the resistive layer;
   a second dielectric layer disposed on the resistive layer; and
   a third dielectric layer disposed on the second dielectric layer,
   wherein the leg structure is in contact with the third dielectric layer.

11. The infrared imaging device of claim 10, wherein the bridge further comprises:
   a second metal layer disposed on the third dielectric layer; and
   a fourth dielectric layer disposed on the second metal layer.

12. The infrared imaging device of claim 1, wherein the bridge comprises:
   a cap layer facing the substrate;
   a resistive layer;
   a first dielectric layer disposed between the cap layer and the resistive layer;
   a second dielectric layer disposed on the resistive layer;
   a third dielectric layer; and
   a metal layer disposed between the second dielectric layer and the third dielectric layer,
   wherein the leg structure is in contact with the third dielectric layer.

13. The infrared imaging device of claim 12, wherein the bridge further comprises a fourth dielectric layer disposed on the third dielectric layer, wherein the leg structure is in contact with the fourth dielectric layer, wherein the resistive layer is a vanadium oxide layer, and wherein the second dielectric layer is a silicon dioxide layer.

14. A method of forming an infrared imaging device, the method comprising:
   forming a bridge on a sacrificial layer;
   forming an opening in the sacrificial layer;
   disposing a contact metal layer on sidewalls of the opening;
   forming a leg structure that couples to the bridge and the contact metal layer, wherein the leg structure comprises a cross-section having a first section, a second section substantially parallel to the first section, and a third section joining the first section and the second section; and
   removing the sacrificial layer to suspend the bridge and the leg structure above a substrate of the infrared imaging device, wherein the contact metal layer is coupled to the substrate.

15. The method of claim 14, wherein the forming the leg structure comprises forming the leg structure such that the leg structure extends between the bridge and the contact metal layer in a first direction substantially parallel to a plane defined by a surface of the substrate;
   the cross-section is an s-shaped cross-section or a z-shaped cross-section,
   the forming the leg structure comprises forming the leg structure with the s-shaped cross-section or the z-shaped cross-section maintained as the leg structure extends along the first direction,
   the first section and the second section extend along the first direction and a second direction substantially parallel to the plane, and
   the third section joins the first section and the second section in a third direction that is substantially perpendicular to the plane.

16. The method of claim 14, wherein the leg structure comprises:
   a first segment associated with the first section and having a first dimension that extends in a first direction that is substantially parallel to a plane defined by a surface of the substrate and a second dimension that extends in a second direction that is substantially perpendicular to the plane, wherein the first dimension is greater than the second dimension;
   a second segment associated with the second section; and
   a third segment associated with the third section and adjacent to the first segment and the second segment, the third segment having a third dimension that extends in the first direction and a fourth dimension that extends in the second direction, wherein the third dimension is less than the fourth dimension.

17. The method of claim 16, wherein:
   each of the first segment, the second segment, and the third segment comprises a respective portion of a first metal layer, a respective portion of a first layer, and a respective portion of a second layer,
   the first layer is formed on a first sidewall of the first metal layer and a first side of the first metal layer,
   the second layer is formed on a second sidewall of the first metal layer and a second side of the first metal layer,
   the first sidewall is opposite the second sidewall, and
   the first side is opposite the second side.

18. The method of claim 17, wherein a portion of the first layer and a portion of the second layer are separated by a gap, and wherein the portion of the first layer faces the portion of the second layer.

19. The method of claim 18, wherein the third section is at an angle relative to the first and second sections, and wherein the forming the bridge comprises:
   disposing a metal layer on a cap layer;
   disposing a first set of dielectric layers on the metal layer;
   disposing a resistive layer on the first set of dielectric layers; and
   disposing a second set of dielectric layers on the resistive layer,
   wherein the leg structure is in contact with the second set of dielectric layers.

20. The method of claim 18, wherein the forming the opening exposes a pad disposed on an overglass layer of the infrared imaging device, wherein the overglass layer is disposed on the substrate, and wherein the third section is substantially perpendicular to the first and second sections.

* * * * *

UNITED STATES PATENT AND TRADEMARK OFFICE
CERTIFICATE OF CORRECTION

PATENT NO. : 11,955,504 B2
APPLICATION NO. : 17/471158
DATED : April 9, 2024
INVENTOR(S) : Eric A. Kurth et al.

It is certified that error appears in the above-identified patent and that said Letters Patent is hereby corrected as shown below:

In the Specification

Column 1, Line 31, change "patent application Ser. No." to --Patent Application No.--.

Column 1, Lines 34-35, change "patent application Ser. No." to --Patent Application No.--.

Column 11, Line 53, change "a width Win the" to --a width W in the--.

Column 19, Line 50, change "may forma" to --may form a--.

Signed and Sealed this
Eighteenth Day of June, 2024

Katherine Kelly Vidal
*Director of the United States Patent and Trademark Office*